(12) United States Patent
Nagata

(10) Patent No.: US 6,204,789 B1
(45) Date of Patent: Mar. 20, 2001

(54) VARIABLE RESISTOR CIRCUIT AND A DIGITAL-TO-ANALOG CONVERTER

(75) Inventor: Mitsuru Nagata, Naka-gun (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/656,434

(22) Filed: Sep. 6, 2000

(30) Foreign Application Priority Data

Sep. 6, 1999 (JP) .................................................. 11-251923

(51) Int. Cl.$^7$ ....................................................... H03M 1/66
(52) U.S. Cl. ............................ 341/144; 341/143; 338/334
(58) Field of Search .................................... 341/144, 143, 341/145, 154, 153, 139, 110, 113; 323/354; 338/334

(56) References Cited

U.S. PATENT DOCUMENTS 4,468,607 * 8/1984 Tanaka et al. ...................... 323/354
6,114,981 * 9/2000 Nagata ................................. 341/143

FOREIGN PATENT DOCUMENTS 8-125536  5/1996 (JP) .
200-004160  1/2000 (JP) .

* cited by examiner

*Primary Examiner*—Brian Young
*Assistant Examiner*—John Nguyen
(74) *Attorney, Agent, or Firm*—Oblon, Spivak, McClelland, Maier & Neustadt, P.C.

(57) ABSTRACT

A 1-bit D/A converter with a zero detect soft mute function is provided in such a manner that a counter is operated by detecting that a multibit digital signal is all zero for a constant period of time, and a feedback resistor of an op-amp in the analog low-pass filter is decreased stepwise based on a discrete value of the counter so as to be finally short-circuited so that a D/A convert output is fixed at a reference potential. The feedback resistor is composed of a plurality of resistors of first and second groups and first to third analog switches. A first digital control variable resistor is constituted by connecting the resistors of the first group in series and connecting a first analog switch selectively turned on/off in accordance with an output signal other than an LSB of the counter to respective nodes. A second digital control variable resistor is constituted by connecting the resistors of the second group in parallel and connecting a second analog switch controlled by the LSB of the counter to one side resistor in series. The first and second digital control variable resistors are connected in series, and a third analog switch is connected to both ends so as to constitute a feedback resistor.

25 Claims, 40 Drawing Sheets

| INPUT | | | | SELECT LINE(H) | ATT |
|---|---|---|---|---|---|
| A | B | C | D | | |
| 0 | 0 | 0 | 0 | — | 15/15 |
| 1 | 0 | 0 | 0 | S1 | 14/15 |
| 0 | 1 | 0 | 0 | S2 | 13/15 |
| 1 | 1 | 0 | 0 | S3 | 12/15 |
| 0 | 0 | 1 | 0 | S4 | 11/15 |
| 1 | 0 | 1 | 0 | S5 | 10/15 |
| 0 | 1 | 1 | 0 | S6 | 9/15 |
| 1 | 1 | 1 | 0 | S7 | 8/15 |
| 0 | 0 | 0 | 1 | S8 | 7/15 |
| 1 | 0 | 0 | 1 | S9 | 6/15 |
| 0 | 1 | 0 | 1 | S10 | 5/15 |
| 1 | 1 | 0 | 1 | S11 | 4/15 |
| 0 | 0 | 1 | 1 | S12 | 3/15 |
| 1 | 0 | 1 | 1 | S13 | 2/15 |
| 0 | 1 | 1 | 1 | S14 | 1/15 |
| 1 | 1 | 1 | 1 | S15 | 0/15 |

FIG. 16

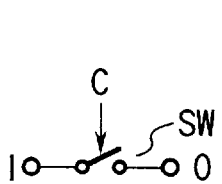
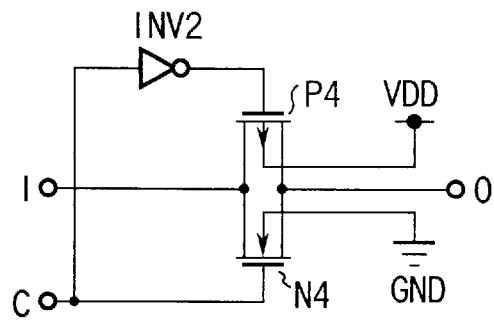
FIG. 23A          FIG. 23B
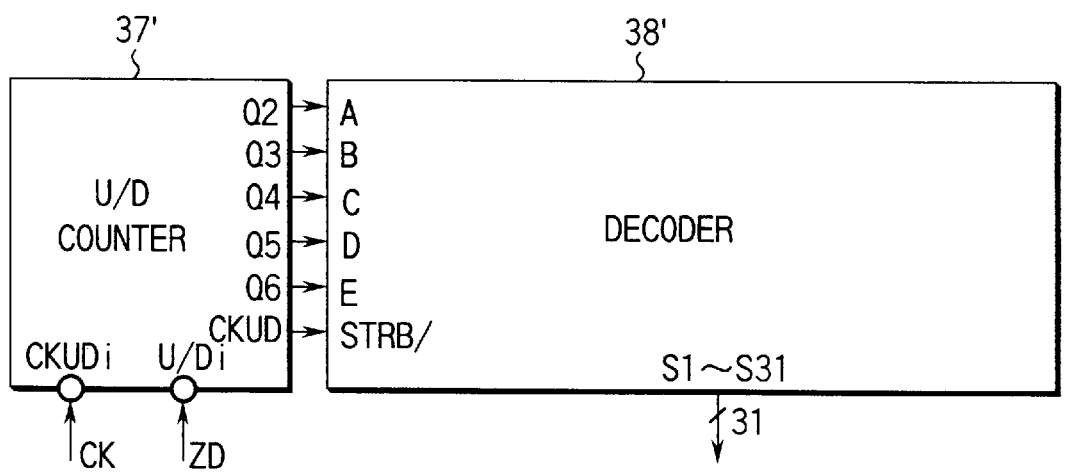
FIG. 24

| INPUT | | | | | SELECT LINE(H) | STATE |
|---|---|---|---|---|---|---|
| A | B | C | D | E | | |
| 0 | 0 | 0 | 0 | 0 | | MUTE OFF |
| 1 | 0 | 0 | 0 | 0 | S1 | |
| 0 | 1 | 0 | 0 | 0 | S2 | |
| 1 | 1 | 0 | 0 | 0 | S3 | |
| 0 | 0 | 1 | 0 | 0 | S4 | |
| 1 | 0 | 1 | 0 | 0 | S5 | |
| 0 | 1 | 1 | 0 | 0 | S6 | |
| 1 | 1 | 1 | 0 | 0 | S7 | |
| 0 | 0 | 0 | 1 | 0 | S8 | |
| 1 | 0 | 0 | 1 | 0 | S9 | |
| 0 | 1 | 0 | 1 | 0 | S10 | |
| 1 | 1 | 0 | 1 | 0 | S11 | |
| 0 | 0 | 1 | 1 | 0 | S12 | |
| 1 | 0 | 1 | 1 | 0 | S13 | |
| 0 | 1 | 1 | 1 | 0 | S14 | |
| 1 | 1 | 1 | 1 | 0 | S15 | |
| 0 | 0 | 0 | 0 | 1 | S16 | |
| 1 | 0 | 0 | 0 | 1 | S17 | |
| 0 | 1 | 0 | 0 | 1 | S18 | |
| 1 | 1 | 0 | 0 | 1 | S19 | |
| 0 | 0 | 1 | 0 | 1 | S20 | |
| 1 | 0 | 1 | 0 | 1 | S21 | |
| 0 | 1 | 1 | 0 | 1 | S22 | |
| 1 | 1 | 1 | 0 | 1 | S23 | |
| 0 | 0 | 0 | 1 | 1 | S24 | |
| 1 | 0 | 0 | 1 | 1 | S25 | |
| 0 | 1 | 0 | 1 | 1 | S26 | |
| 1 | 1 | 0 | 1 | 1 | S27 | |
| 0 | 0 | 1 | 1 | 1 | S28 | |
| 1 | 0 | 1 | 1 | 1 | S29 | |
| 0 | 1 | 1 | 1 | 1 | S30 | |
| 1 | 1 | 1 | 1 | 1 | S31 | MUTE ON |

FIG. 26

| INPUT | | | | | SELECT LINE (H) | SL | ATT |
|---|---|---|---|---|---|---|---|
| L | A | B | C | D | | | |
| 0 | 0 | 0 | 0 | 0 | — | L | 30/30 |
| 1 | 0 | 0 | 0 | 0 | | H | 29/30 |
| 0 | 1 | 0 | 0 | 0 | S1 | L | 28/30 |
| 1 | 1 | 0 | 0 | 0 | | H | 27/30 |
| 0 | 0 | 1 | 0 | 0 | S2 | L | 26/30 |
| 1 | 0 | 1 | 0 | 0 | | H | 25/30 |
| 0 | 1 | 1 | 0 | 0 | S3 | L | 24/30 |
| 1 | 1 | 1 | 0 | 0 | | H | 23/30 |
| 0 | 0 | 0 | 1 | 0 | S4 | L | 22/30 |
| 1 | 0 | 0 | 1 | 0 | | H | 21/30 |
| 0 | 1 | 0 | 1 | 0 | S5 | L | 20/30 |
| 1 | 1 | 0 | 1 | 0 | | H | 19/30 |
| 0 | 0 | 1 | 1 | 0 | S6 | L | 18/30 |
| 1 | 0 | 1 | 1 | 0 | | H | 17/30 |
| 0 | 1 | 1 | 1 | 0 | S7 | L | 16/30 |
| 1 | 1 | 1 | 1 | 0 | | H | 15/30 |
| 0 | 0 | 0 | 0 | 1 | S8 | L | 14/30 |
| 1 | 0 | 0 | 0 | 1 | | H | 13/30 |
| 0 | 1 | 0 | 0 | 1 | S9 | L | 12/30 |
| 1 | 1 | 0 | 0 | 1 | | H | 11/30 |
| 0 | 0 | 1 | 0 | 1 | S10 | L | 10/30 |
| 1 | 0 | 1 | 0 | 1 | | H | 9/30 |
| 0 | 1 | 1 | 0 | 1 | S11 | L | 8/30 |
| 1 | 1 | 1 | 0 | 1 | | H | 7/30 |
| 0 | 0 | 0 | 1 | 1 | S12 | L | 6/30 |
| 1 | 0 | 0 | 1 | 1 | | H | 5/30 |
| 0 | 1 | 0 | 1 | 1 | S13 | L | 4/30 |
| 1 | 1 | 0 | 1 | 1 | | H | 3/30 |
| 0 | 0 | 1 | 1 | 1 | S14 | L | 2/30 |
| 1 | 0 | 1 | 1 | 1 | | H | 1/30 |
| 0 | 1 | 1 | 1 | 1 | S15 | L | 0/30 |
| 1 | 1 | 1 | 1 | 1 | | H | 0/30 |

FIG. 32

| INPUT | | | | | | SELECT LINE (H) | SL1 | SL2 | SL3 | ATT |
|---|---|---|---|---|---|---|---|---|---|---|
| L1 | L2 | A | B | C | D | | | | | |
| 0 | 0 | 0 | 0 | 0 | 0 | — | L | L | L | 60/60 |
| 1 | 0 | 0 | 0 | 0 | 0 | | H | L | L | 59/60 |
| 0 | 1 | 0 | 0 | 0 | 0 | | L | H | L | 58/60 |
| 1 | 1 | 0 | 0 | 0 | 0 | | L | L | H | 57/60 |
| 0 | 0 | 1 | 0 | 0 | 0 | S1 | L | L | L | 56/60 |
| 1 | 0 | 1 | 0 | 0 | 0 | | H | L | L | 55/60 |
| 0 | 1 | 1 | 0 | 0 | 0 | | L | H | L | 54/60 |
| 1 | 1 | 1 | 0 | 0 | 0 | | L | L | H | 53/60 |
| 0 | 0 | 0 | 1 | 0 | 0 | S2 | L | L | L | 52/60 |
| 1 | 0 | 0 | 1 | 0 | 0 | | H | L | L | 51/60 |
| 0 | 1 | 0 | 1 | 0 | 0 | | L | H | L | 50/60 |
| 1 | 1 | 0 | 1 | 0 | 0 | | L | L | H | 49/60 |
| 0 | 0 | 1 | 1 | 0 | 0 | S3 | L | L | L | 48/60 |
| 1 | 0 | 1 | 1 | 0 | 0 | | H | L | L | 47/60 |
| 0 | 1 | 1 | 1 | 0 | 0 | | L | H | L | 46/60 |
| 1 | 1 | 1 | 1 | 0 | 0 | | L | L | H | 45/60 |
| 0 | 0 | 0 | 0 | 1 | 0 | S4 | L | L | L | 44/60 |
| 1 | 0 | 0 | 0 | 1 | 0 | | H | L | L | 43/60 |
| 0 | 1 | 0 | 0 | 1 | 0 | | L | H | L | 42/60 |
| 1 | 1 | 0 | 0 | 1 | 0 | | L | L | H | 41/60 |
| 0 | 0 | 1 | 0 | 1 | 0 | S5 | L | L | L | 40/60 |
| 1 | 0 | 1 | 0 | 1 | 0 | | H | L | L | 39/60 |
| 0 | 1 | 1 | 0 | 1 | 0 | | L | H | L | 38/60 |
| 1 | 1 | 1 | 0 | 1 | 0 | | L | L | H | 37/60 |
| 0 | 0 | 0 | 1 | 1 | 0 | S6 | L | L | L | 36/60 |
| 1 | 0 | 0 | 1 | 1 | 0 | | H | L | L | 35/60 |
| 0 | 1 | 0 | 1 | 1 | 0 | | L | H | L | 34/60 |
| 1 | 1 | 0 | 1 | 1 | 0 | | L | L | H | 33/60 |
| 0 | 0 | 1 | 1 | 1 | 0 | S7 | L | L | L | 32/60 |
| 1 | 0 | 1 | 1 | 1 | 0 | | H | L | L | 31/60 |
| 0 | 1 | 1 | 1 | 1 | 0 | | L | H | L | 30/60 |
| 1 | 1 | 1 | 1 | 1 | 0 | | L | L | H | 29/60 |
| 0 | 0 | 0 | 0 | 0 | 1 | S8 | L | L | L | 28/60 |
| 1 | 0 | 0 | 0 | 0 | 1 | | H | L | L | 27/60 |
| 0 | 1 | 0 | 0 | 0 | 1 | | L | H | L | 26/60 |
| 1 | 1 | 0 | 0 | 0 | 1 | | L | L | H | 25/60 |
| 0 | 0 | 1 | 0 | 0 | 1 | S9 | L | L | L | 24/60 |
| 1 | 0 | 1 | 0 | 0 | 1 | | H | L | L | 23/60 |
| 0 | 1 | 1 | 0 | 0 | 1 | | L | H | L | 22/60 |
| 1 | 1 | 1 | 0 | 0 | 1 | | L | L | H | 21/60 |
| 0 | 0 | 0 | 1 | 0 | 1 | S10 | L | L | L | 20/60 |
| 1 | 0 | 0 | 1 | 0 | 1 | | H | L | L | 19/60 |
| 0 | 1 | 0 | 1 | 0 | 1 | | L | H | L | 18/60 |
| 1 | 1 | 0 | 1 | 0 | 1 | | L | L | H | 17/60 |
| 0 | 0 | 1 | 1 | 0 | 1 | S11 | L | L | L | 16/60 |
| 1 | 0 | 1 | 1 | 0 | 1 | | H | L | L | 15/60 |
| 0 | 1 | 1 | 1 | 0 | 1 | | L | H | L | 14/60 |
| 1 | 1 | 1 | 1 | 0 | 1 | | L | L | H | 13/60 |
| 0 | 0 | 0 | 0 | 1 | 1 | S12 | L | L | L | 12/60 |
| 1 | 0 | 0 | 0 | 1 | 1 | | H | L | L | 11/60 |
| 0 | 1 | 0 | 0 | 1 | 1 | | L | H | L | 10/60 |
| 1 | 1 | 0 | 0 | 1 | 1 | | L | L | H | 9/60 |
| 0 | 0 | 1 | 0 | 1 | 1 | S13 | L | L | L | 8/60 |
| 1 | 0 | 1 | 0 | 1 | 1 | | H | L | L | 7/60 |
| 0 | 1 | 1 | 0 | 1 | 1 | | L | H | L | 6/60 |
| 1 | 1 | 1 | 0 | 1 | 1 | | L | L | H | 5/60 |
| 0 | 0 | 0 | 1 | 1 | 1 | S14 | L | L | L | 4/60 |
| 1 | 0 | 0 | 1 | 1 | 1 | | H | L | L | 3/60 |
| 0 | 1 | 0 | 1 | 1 | 1 | | L | H | L | 2/60 |
| 1 | 1 | 0 | 1 | 1 | 1 | | L | L | H | 1/60 |
| 0 | 0 | 1 | 1 | 1 | 1 | S15 | L | L | L | 0/60 |
| 1 | 0 | 1 | 1 | 1 | 1 | | H | L | L | |
| 0 | 1 | 1 | 1 | 1 | 1 | | L | H | L | |
| 1 | 1 | 1 | 1 | 1 | 1 | | L | L | H | |

FIG. 41

| INPUT | | | | | SELECT LINE (H) | SL | ATT |
|---|---|---|---|---|---|---|---|
| L | A | B | C | D | | | |
| 0 | 0 | 0 | 0 | 0 | S0 | L | 30/30 |
| 1 | 0 | 0 | 0 | 0 | | H | 29/30 |
| 0 | 1 | 0 | 0 | 0 | S1 | L | 28/30 |
| 1 | 1 | 0 | 0 | 0 | | H | 27/30 |
| 0 | 0 | 1 | 0 | 0 | S2 | L | 26/30 |
| 1 | 0 | 1 | 0 | 0 | | H | 25/30 |
| 0 | 1 | 1 | 0 | 0 | S3 | L | 24/30 |
| 1 | 1 | 1 | 0 | 0 | | H | 23/30 |
| 0 | 0 | 0 | 1 | 0 | S4 | L | 22/30 |
| 1 | 0 | 0 | 1 | 0 | | H | 21/30 |
| 0 | 1 | 0 | 1 | 0 | S5 | L | 20/30 |
| 1 | 1 | 0 | 1 | 0 | | H | 19/30 |
| 0 | 0 | 1 | 1 | 0 | S6 | L | 18/30 |
| 1 | 0 | 1 | 1 | 0 | | H | 17/30 |
| 0 | 1 | 1 | 1 | 0 | S7 | L | 16/30 |
| 1 | 1 | 1 | 1 | 0 | | H | 15/30 |
| 0 | 0 | 0 | 0 | 1 | S8 | L | 14/30 |
| 1 | 0 | 0 | 0 | 1 | | H | 13/30 |
| 0 | 1 | 0 | 0 | 1 | S9 | L | 12/30 |
| 1 | 1 | 0 | 0 | 1 | | H | 11/30 |
| 0 | 0 | 1 | 0 | 1 | S10 | L | 10/30 |
| 1 | 0 | 1 | 0 | 1 | | H | 9/30 |
| 0 | 1 | 1 | 0 | 1 | S11 | L | 8/30 |
| 1 | 1 | 1 | 0 | 1 | | H | 7/30 |
| 0 | 0 | 0 | 1 | 1 | S12 | L | 6/30 |
| 1 | 0 | 0 | 1 | 1 | | H | 5/30 |
| 0 | 1 | 0 | 1 | 1 | S13 | L | 4/30 |
| 1 | 1 | 0 | 1 | 1 | | H | 3/30 |
| 0 | 0 | 1 | 1 | 1 | S14 | L | 2/30 |
| 1 | 0 | 1 | 1 | 1 | | H | 1/30 |
| 0 | 1 | 1 | 1 | 1 | S15 | L | 0/30 |
| 1 | 1 | 1 | 1 | 1 | | H | 0/30 |

FIG. 47

VARIABLE RESISTOR CIRCUIT AND A DIGITAL-TO-ANALOG CONVERTER

CROSS-REFERENCE TO RELATED APPLICATIONS

This application is based upon and claims the benefit of priority from the prior Japanese Patent Application No. 11-251923, filed Sep. 6, 1999, the entire contents of which are incorporated herein by reference.

BACKGROUND OF THE INVENTION

The present invention relates to a variable resistor circuit and a digital-to-analog converter in which the variable resistor circuit is employed as a feedback resistor. More specifically, the present invention relates to a variable resistor circuit of digital control which is controlled by an output signal of a counter and a zero detect mute circuit of an output circuit section in a digital-to-analog converter in which a sigma-delta modulator is employed.

Conventionally, an output circuit section of a digital-to-analog converter (D/A converter) in which a sigma-delta modulator is employed is constituted, for example, as shown in FIG. 1. A multibit digital signal is inputted to a sigma-delta modulator 11. One bit output signal NRZ of this sigma-delta modulator 11 is supplied to one side input terminal of an AND gate 12 and is inverted so as to be supplied to one side input terminal of a NAND gate 13. A clock signal CK is supplied to the other input terminal of the AND gate 12, and the clock signal CK is supplied to the other input terminal of the NAND gate 13.

An output signal RZ of the AND gate 12 is supplied to one end of a resistor 15 via an inverter 14, and an output signal RZn of the NAND gate 13 is supplied to one end of a resistor 17 via an inverter 16. The other ends of the resistors 15, 17 are connected to one end of a resistor 18, and the other end of the resistor 18 is connected to one end of a resistor 19. A capacitor 20 is connected between the one end of the resistor 18 and ground point GND, and a capacitor 21 is connected between the other end of the resistor 18 and ground point GND. The other end of the resistor 19 is connected to the inverting input terminal (−) of an operational amplifier (op-amp) 22, and the non-inverting input terminal (+) of this op-amp 22 is connected to ground point GND.

A capacitor 23 and a resistor 24 are connected in parallel between the output terminal and the inverting input terminal (−) of the op-amp 22 so that an output signal PRZ is feedback to the inverting input terminal (−).

The 1-bit output signal NRZ outputted from the sigma-delta modulator 11 typically becomes that as shown in a timing chart of FIG. 2. The output signal RZ of the AND gate 12 is an AND (logical product) of the 1-bit output signal NRZ and the clock signal CK, and the output signal RZn of the NAND gate 13 is a NAND (NOT-AND) of the inverted signal of the 1-bit output signal NRZ and the clock signal CK. The output signal PRZ of the D/A converter has a waveform made by synthesizing the output signal RZ of the AND gate 12 and the output signal RZn of the NAND gate 13.

In the D/A converter, there are many cases in which a function (hereafter, zero detect mute function) is required in which it is detected that an input digital signal is zero data for a constant period of time and the output is fixed to a constant DC value (typically, mid electric potential). That is, generally, there are many cases in which a large scale of digital circuit exists on the same chip or the same board in a D/A converter, and a large amount of unnecessary radiation bursts in on the D/A converter from the digital circuit via space or a power supply line as a noise. In the sigma-delta modulator 11, even when the zero data are inputted, the 1-bit output signal does not become the DC value but becomes a waveform containing an extremely high frequency noise due to a requantization noise. Thus, even though nothing is essentially supposed to be outputted when an inputted digital signal is zero data, there are many cases in which an unpleasant sound is emitted and/or a poor value is outputted at measurement of a signal-to-noise ratio due to the noise.

In order to prevent this from occurring, when zero data continue for a constant period of time (typically, approximately 100 msec), a zero detect mute function in which said condition is detected and an analog signal of the D/A converter is fixed to a ground potential or reference potential is employed. Since the reference potential is typically decoupled by a capacitor with a large amount of capacitance, mixing of noise is small, thereby preventing an unpleasant sound from being emitted and/or a measured value of an S/N ratio from becoming poor by the mute function.

FIG. 3 shows a structural example of an output circuit section of a conventional D/A converter with the zero detect mute function described above. This output circuit section performs on/off control for an output signal MUTE of a zero detect circuit 26 by connecting an analog switch circuit 25 between the output terminal and the inverting input terminal (−) of the op-amp 22 in the circuit shown in FIG. 1 mentioned above. A multibit digital signal is inputted to the zero detect circuit 26, and in this zero detect circuit 26, it is decided whether or not the feedback resistor 24 of the op-amp 22 is short-circuited, in other words, mute on/off is decided.

In this type of circuit structure, when it is detected that zero data continues for a constant period of time as a multibit digital signal by means of the zero detect mute circuit 26, by turning the analog switch circuit 25 on, the feedback resistor (resistor 24) of the op-amp 22 is short-circuited, thereby preventing an unpleasant sound from being emitted and/or a measured value of an S/N ratio from becoming poor by noise.

However, in the circuit structure described above, there is a big problem in performing the on/off of the mute by the zero detection. That is, click sounds occur at the time of mute on/off. Although this click sound occurs since the DC values at the times of mute ON and mute OFF are different, the causes are various as described below.

First, there is a click sound due to a digital DC offset. Typically, in the D/A converter with the zero detect mute function, in order to prevent the problem that is peculiar to the sigma-delta modulator wherein a fixed pattern occurs at the time of inputting the zero data, thereby causing a unpleasant beat sound, there are many cases in which an adder 27 is provided in the input terminal of the sigma-delta modulator 11 as shown in FIG. 4 so that a digital DC offset as shown in FIG. 5 is added to the input signal of the sigma-delta modulator 11 in advance. With this, as a matter of course, an analog DC offset corresponding to the input digital DC offset is outputted, and thus the click sound occurs at the time of mute on/off.

Therefore, a method is adopted in which an adder 28 is provided between the other ends of the resistors 15, 17 and the one end of the resistor 18 so that an analog DC offset for canceling the digital DC offset is added. However, the DC offset cannot be cancelled completely under the influence of element accuracy or element unevenness or the like, whereby a little DC offset remains.

Second, there is a DC offset due to waveform blunting or element unevenness of the D/A converter (hereafter DAC), in other words, there is a DC error as a DAC.

Lastly, there is an equivalent input DC offset of the op-amp 22. As shown in FIG. 6, when the feedback resistor 24 is short-circuited by the analog switch circuit 25 so as to perform the mute, in the op-amp 22 having the equivalent input DC offset, that is, EOS, this EOS's DC displacement (2EOS at the time of mute off, EOS at the time of mute ON) occurs at the mute on/off so as to become a click sound.

Although the causes described above may be made reduced by a device in a circuit structure, an improvement in element accuracy, a restraint in element unevenness, or the like, they cannot be eliminated completely. That is, a little DC displacement inevitably occurs at the mute on/off, and a click sound occurs.

Therefore, in order to reduce the click sound as much as possible, a technique has been devised wherein the feedback resistor 24 itself is made a variable resistor as a substitute for the analog switch circuit 25 in the circuit shown in FIGS. 3 and 4 so as to make the click sound small by increasing or decreasing the amount of resistance step by step.

That is, when it is supposed that a potential difference of EM in the mute on/off occurs, if on/off is performed at one time by the analog switch circuit 25, a step-shaped waveform occurs as shown FIG. 7, emitting a ringing click sound. However, when the voltage is stepwise changed as shown in FIG. 8, the click sound small in the sense of hearing. In this case of FIG. 8, the voltage is made small by 15 steps. Further, when the number of steps are increased so as to smoothly change the voltage as shown in FIG. 9, the click sound can be made smaller as a matter of course.

FIG. 10 shows a structural example of the output circuit section of the DAC having the zero detect mute function to make the click sound small. The multibit digital signal is inputted to the sigma-delta modulator 11 and the zero detect circuit 26. A digital output of an m level outputted from the delta-sigma modulator 11 is supplied to a DAC 31 of an m level, and an analog output from this DAC 31 is supplied to the inverting input terminal (−) of the op-amp 22 via resistors 32, 18, 19. Here, the output level of the sigma-delta modulator 11 is generally a value of approximately m=2–15. The capacitor 20 is connected between the node of the resistors 32, 18 and ground point GND, and the capacitor 21 is connected between the node of the resistors 18, 19 and ground point GND.

A reference potential VREF is applied to the non-inverting input terminal (+) of the op-amp 22. This reference potential VREF is generated by resistors 33, 34 connected in series between power supply VDD and ground point GND and a capacitor 35 connected between the node of these resistors 33, 34 and ground point GND.

The capacitor 24 and a variable resistor circuit 36 are connected in parallel between the output terminal and the inverting input terminal (−) of the op-amp 22. The variable resistor circuit 36 acts as a feedback resistor of the op-amp 22, and its resistance changes stepwise 0 to $(2^n-1)$r.

The output signal of the zero detect circuit 26 is supplied to an n-bit up/down (U/D) counter 37. The n-bit discrete value outputted from the counter 37 is supplied to a decoder 38. This decoder 38 decodes the n-bit discrete value outputted from the counter 37 so as to generate a $(2^n-1)$ decode signal and supplies it to the variable resistor circuit 36 so as to control the resistance stepwise by 0 to $(2^n-1)$r.

FIG. 11 further concretely shows the circuit shown in FIG. 10 and is a circuit structural example of the case wherein m=2, n=4. In this circuit shown in FIG. 11, the multibit digital signal is inputted to the sigma-delta modulator 11 and the zero detect circuit 26. A 1-bit output signal NRZ of this sigma-delta modulator 11 is supplied to one side input terminal of the AND gate 12 and is inverted to be supplied to one side input terminal of the NAND gate 13. A clock signal CK1 is supplied to the other side input terminal of the AND gate 12, and the clock signal CK1 is supplied to the other side input terminal of the NAND gate 13.

The output signal RZ of the AND gate 12 is supplied to one end of the resistor 15 via the inverter 14, and the output signal RZn of the NAND gate 13 is supplied to one end of the resistor 17 via the inverter 16. The other ends of the resistors 15, 17 are connected to one end of the resistor 18, and the other end of the resistor 18 is connected to one end of the resistor 19. The capacitor 20 is connected between the one end of the resistor 18 and ground point GND, and the capacitor 21 is connected between the other end of the resistor 18 and ground point GND.

The other end of the resistor 19 is connected to the inverting input terminal (−) of the op-amp 22, and the reference potential VREF is applied to the non-inverting input terminal (+) of this op-amp 22. The reference potential VREF is generated by the resistors 33, 34 connected in series between the power supply VDD and ground point GND and the capacitor 35 connected between the node of these resistors 33, 34 and ground point GND.

The capacitor 23 and the variable resistor circuit 36 are connected in parallel between the output terminal and the inverting input terminal (−) of the op-amp 22 so that the output signal PRZ is feedback to the inverting input terminal (−). In the variable resistor circuit 36, the resistance changes stepwise 0 to 15r by r.

An output signal ZD of the zero detect circuit 26 is supplied to an input terminal U/Di of the 4-bit up/down (U/D) counter 37. A clock signal CK2 is supplied to a clock input terminal CK of the counter 37. Four-bit discrete values outputted from output terminals Q1 to Q4 of the counter 37 are supplied to the decoder 38. This decoder 38 decodes the 4-bit discrete values outputted from the output terminals Q1 to Q4 of the counter 37 so as to generate switch control signals S1 to S15 and supplies these to the variable resistor circuit 36 to control it so that the resistance changes stepwise 0 to 15r by r.

FIG. 12 shows a structural example of the zero detect circuit 26 in the circuit shown in FIG. 11. This zero detect circuit 26 is composed of an OR gate 40, a flip-flop 41, an N-bit counter 42, and a RS flip-flop 43.

The multibit digital signal is supplied to the OR gate 40, and the output of this OR gate 40 is supplied to a data input terminal D of the flip-flop 41. The clock signal CK2 is supplied to a clock input terminal CK of the flip-flop 41, and the output terminal Q is connected to the reset input terminal R of the n-bit counter 42 and the reset input terminal R of the RS flip-flop 43, respectively. The clock signal CK2 is supplied to the input terminal CK of the n-bit counter 41 so that counting operation is performed in response to this clock signal CK2. The most significant bit MSB of this counter 42 is connected to the set input terminal S of the RS flip-flop 43, and a signal ZD is outputted from the output terminal Q of this RS flip-flop 43.

In the zero detect circuit 26, the counting operation is started in the n-bit counter 42 when the multibit digital signal becomes zero data, and the RS flip-flop 43 is set when counting is proceeded to the most significant bit of the counter 42, that is, when zero data are inputted continuously for a predetermined period of time so that the detect signal ZD for zero data is outputted from the output terminal Q of the RS flip-flop 43.

FIG. 13 is a block diagram extracting and showing the 4-bit up/down counter 37 and the decoder 38 in the circuit shown in FIG. 11. The counter 37 is provided with a clock input terminal CKUDi, an input terminal U/Di to which the detect signal ZD for the zero data is supplied, and the output terminals Q1 to Q4.

The output signals Q1, Q2, Q3, Q4 of the 4-bit up/down counter 37 and a strobe signal STROBE are supplied to the decoder 38 which decodes these signals and outputs 15-bit switch control signals SI to S15 for stepwise controlling the resistance Rmt of the variable resistor circuit 36.

FIG. 14 is a circuit diagram showing a concrete structural example of the 4-bit up/down counter 37 shown in FIG. 13. This counter 37 is composed of flip-flops 44 to 51, inverters 52, 53, NAND gates 54, 55, a NOR gate 56, exclusive NOR gates 57 to 60, exclusive OR gates 61 to 63, and the like.

Clock input terminals CK of the flip-flops 44, 45 are connected to the input terminal CKUDi. The data input terminal D of the flip-flop 50 is connected to the input terminal U/Di. The data output terminal Q of the flip-flop 44, the data input terminal D of the flip-flop 45, and the clock input terminals CK of the flip-flops 46, 50, 51 are connected to a terminal CKUD, respectively. Here, a signal of the terminal CKUD is inverted and supplied to the clock input terminals CK of the flip-flops 50, 51. The signal of this terminal CKUD becomes a clock signal of the period of 4 times the clock signal supplied to the input terminal CKUDi.

The output terminal of the inverter 52 and the first input terminal of the NAND gate 55 are connected to the data input terminal D of the flip-flop 44. The data output terminal Q of the flip-flop 45 is connected to the input terminal of the inverter 52, and a signal HOLD is supplied thereto. The output terminal of the NAND gate 55 is connected to one side input terminals of the exclusive NOR gates 57 to 60, respectively, and a signal HOLD' is supplied thereto. The output terminals of the exclusive NOR gates 57 to 60 are connected to the data input terminals D of the flip-flops 46 to 49, respectively.

The output terminal Q of the flip-flop 46 is connected to the other side input terminal of the exclusive NOR gate 57, the output terminal Q1, the first input terminal of the NAND gate 54, the first input terminal of the NOR gate 56, and one side input terminal of the exclusive OR gate 61, respectively.

The output terminal Q of the flip-flop 47 is connected to the other side input terminal of the exclusive NOR gate 58, the output terminal Q2, the second input terminal of the NAND gate 54, the second input terminal of the NOR gate 56, and one side input terminal of the exclusive OR gate 62, respectively. The output terminal of the exclusive OR gate 61 is connected to the clock input terminal CK of the flip-flop 47 so as to provide a signal Q1' thereto.

The output terminal Q of the flip-flop 48 is connected to the other side input terminal of the exclusive NOR gate 59, the output terminal Q3, the third input terminal of the NAND gate 54, the third input terminal of the NOR gate 56, and one side input terminal of the exclusive OR gate 63, respectively. The output terminal of the exclusive OR gate 62 is connected to the clock input terminal CK of the flip-flop 48 so as to provide a signal Q2' thereto.

The output terminal Q of the flip-flop 49 is connected to the other side input terminal of the exclusive NOR gate 60, the output terminal Q4, the fourth input terminal of the NAND gate 54, and the fourth input terminal of the NOR gate 56, respectively. The output terminal of the exclusive OR gate 63 is connected to the clock input terminal CK of the flip-flop 49 so as to provide a signal Q3' thereto.

The data output terminal Q of the flip-flop 50 is connected to the data input terminal D of the flip-flop 51. The data output terminal Q of this flip-flop 51 is connected to the fifth input terminal of the NAND gate 54, the fifth input terminal of the NOR gate 56, and the other side input terminals of the exclusive OR gates 61, 62, 63, respectively, so as to provide a signal U/D thereto, respectively.

Further, the output terminal of the NAND gate 54 is connected to the second input terminal of the NAND gate 55 so as to provide a signal ALL1/ ("/" added after the numeral means a inverted signal, that is, a bar). The output terminal of the NOR gate 56 is connected to the input terminal of the inverter 53, and the output terminal of this inverter 53 is connected to the third input terminal of the NAND gate 55 so as to provide a signal ALL0 thereto.

Respective FIGS. 15A, 15B, and 15C show structural examples of the decoder 38 in the circuit shown in FIG. 13. FIG. 15A is a concrete circuit diagram, FIG. 15B is a symbol diagram of the shift register in FIG. 15A, and FIG. 15C is a circuit diagram showing a detailed structural example of a shift register shown in FIG. 15B.

The decoder 38 is composed of AND gates 71 to 78, inverters 79 to 86, NAND gates 87 to 101, and shift registers 102 to 116. The count output Q1 of the up/down counter 37 is supplied to the input terminal of the inverter 79 and is inverted so as to be supplied to one side input terminals of the AND gates 71, 73. The count output Q2 is supplied to the input terminal of the inverter 80 and is inverted so as to be supplied to the other side input terminal of the AND gate 71 and one side input terminal of the AND gate 72. The count output Q3 is supplied to the input terminal of the inverter 81 and is inverted so as to be supplied to one side input terminals of the AND gates 75, 77. Further, the count output Q4 is supplied to the input terminal of the inverter 82 and is inverted so as to be supplied to the other side input terminal of the AND gate 75 and one side input terminal of the AND gate 76.

The output signal of the inverter 79, after being inverted, is supplied to the other side input terminal of the AND gate 72 and, after being inverted, is supplied to one side input terminal of the AND gate 74. The output signal of the inverter 80, after being inverted, is supplied to the other side input terminal of the AND gate 73 and, after being inverted, is supplied to the other side input terminal of the AND gate 74. The output signal of the inverter 81, after being inverted, is supplied to the other side input terminal of the AND gate 76 and, after being inverted, is supplied to one side input terminal of the AND gate 78. The output signal of the inverter 82, after being inverted, is supplied to the other side input terminals of the AND gates 77, 78.

When the count outputs Q1, Q2, Q3, Q4 of the counter 37 are put as A, B, C, D, respectively, the logical output of the AND gate 71 becomes A/*B/, the logical output of the AND gate 72 becomes A*B/, the logical output of the AND gate 73 becomes A/*B, the logical output of the AND gate 74 becomes A*B, the logical output of the AND gate 75 becomes C/*D/, the logical output of the AND gate 76 becomes C*D/, the logical output of the AND gate 77 becomes C/*D, and the logical output of the AND gate 78 becomes C*D.

Here, "/" added after a symbol means a bar, and A/, B/, C/, and D/ mean the inverted signals of A, B, C, and D, respectively.

The output signal of the AND gate 71 is supplied to one side input terminals of the NAND gates 90, 94, 98, respectively, and the output signal of the AND gate 72 is supplied to one side input terminals of the NAND gates 87, 91, 95, 99, respectively. The output signal of the AND gate 73 is supplied to one side input terminals of the NAND gates 88, 92, 96, 100, respectively, and the output signal of the AND gate 74 is supplied to one side input terminals of the NAND gates 89, 93, 97, 101, respectively. The output signal of the AND gate 75 is supplied to the other side input terminals of the NAND gates 87 to 89. The output signal of the AND gate 76 is supplied to the other side input terminals of the NAND gates 90 to 93. The output signal of the AND gate 77 is supplied to the other side input terminals of the NAND gates 94 to 97. Further, the output signal of the AND gate 78 is supplied to the other side input terminals of the NAND gates 98 to 101. The output signals of the NAND gates 87 to 101, after being inverted, are supplied to the data input terminals of the shift registers 102 to 116, respectively.

The strobe signal STROBE is supplied to the clock input terminals CK of the respective shift registers 103, 105, 107, 109, 111, 113, 115 via the inverters 83 to 85, and the strobe signal STROBE is supplied to the clock input terminals CK of the respective shift registers 102, 104, 106, 108, 110, 112, 114, 116 via the inverters 83, 84, 86. The switch control signals S1 to S15 are outputted from the output terminals Q of the respective shift registers 102 to 116.

The shift registers 103 to 116 shown by a symbol diagram of FIG. 15B are constituted as shown in FIG. 15C, respectively. That is, each of the sift registers 103 to 116 is composed of clocked inverters 120, 121 controlled by a clock signal φ/ (a signal of an opposite phase to a clock signal φ), clocked inverters 122, 123 controlled by the clock signal φ, and inverters 124, 125. In the clocked inverter 120, the inverter 124, the clocked inverter 123, and the inverter 125, their output terminals and the input terminals are sequentially connected in cascade. The input terminal of the clocked inverter 122 is connected to the output terminal of the inverter 124, and the output terminal thereof is connected to the input terminal of this inverter 124. The input terminal of the clocked inverter 121 is connected to the output terminal of the inverter 125, and the output terminal thereof is connected to the input terminal of this inverter 125. The structure is constituted so that the inputted data are taken after the data are inverted in the inverter 126.

FIG. 16 is a truth table for explaining about operations of the decoder 38 shown in FIG. 11 and shows logical operations of the circuit shown in FIG. 15A all together. The switch control signals S1 to S15 selectively go to "H" level in accordance with combinations of the levels of the input signals A, B, C, D, and the variable resistor circuit 36 is controlled so that its resistance changes 15r to 0. For example, when the input signals A, B, C, D are all at "0" level, the resistance Rmt of the variable resistor circuit 36 becomes the maximum resistance 15r (attenuation level=15/15). When the input signal A is at "1" level and the input signals B, C, D are at "0" level, the switch control signal S1 goes to "H" level and attenuation level=14/15. As the following, similarly, attenuation level decreases for each 1/15 in accordance with the levels of the input signals, and when the input signals A, B, C, D all become "1" level, the switch control signal S15 becomes "H" level, and the resistance Rmt of the variable resistor circuit 36 becomes the minimum resistance 0 (attenuation level=0/15).

Respective FIGS. 17A, 17B, and 17C show a concrete structural example of the variable resistor circuit (feedback resistor) 36 in the circuit shown in FIG. 11. FIG. 17A is the entire circuit diagram, FIG. 17B is a symbol diagram of an analog switch circuit in the circuit shown in FIG. 17A, and FIG. 17C is a circuit diagram showing a detailed structural example of the analog switch circuit shown in FIG. 17B.

This variable resistor circuit 36 is composed of resistors R1 to R15 wherein each resistance is r and analog switch circuits SW1 to SW15. The resistors R1 to R15 are connected in series between the inverting input terminal (−) and the output terminal of the op-amp 22. The current paths of the analog switch circuits SW1 to SW15 are connected between the nodes of the resistors R1 to R15 and the inverting input terminal (−) of the op-amp 19, respectively. The switch control signals SI to S15 outputted from the decoder 38 are supplied to the analog switch circuits SW1 to SW15 so as to selectively perform on/off control. With this, the feedback resistor of the op-amp 22 changes stepwise 0 to 15r by resistance r, and the DC displacement by the mute on/off moves on smoothly as shown in FIG. 8 to reduce the click sound.

The respective analog switch circuits SW1 to SW15 shown in the symbol diagram of FIG. 17B are constituted of P channel MOS transistors P1, P2, P3, N channel MOS transistors N1, N2, and an inverter INV1, for example, as shown in FIG. 17C. The current paths of the MOS transistors P1 and N1 are connected in parallel, and the current paths of the MOS transistors P2 and N2 are connected in parallel. The current paths of the MOS transistors P1, N1 are connected between a terminal I and a terminal O of the analog switch circuit SW.

A terminal C of the analog switch circuit SW is connected to the input terminal of the inverter INV1, and the output terminal of this inverter INV1 is connected to the gates of the MOS transistors P1, P2. One end of the current paths of the MOS transistors N2, P2 is connected to the back gate of the MOS transistor P1, and the other end is connected to the terminal O. The current path of the MOS transistor P3 is connected between the back gate of the MOS transistor P1 and the power supply VDD, and the gate of this MOS transistor P3 is connected to the gates of the MOS transistors N1, N2 and the terminal C. The back gates of the MOS transistors N1, N2 are connected to ground point GND, and the back gates of the MOS transistors P2, P3 are connected to the power supply VDD.

The analog switch circuit shown in FIG. 17C has a characteristic that the on resistance is small.

Respective FIGS. 18 and 19 are timing charts for explaining the operations of the circuits shown in FIGS. 11 to 17C. Here, the operations of the zero detect mute circuit 26 and the 4-bit up/down counter 37 are mainly paid attention.

First, when the up/down counter 37 is in 0 state, the resistance Rmt of the variable resistor circuit 36 is 15r, being in normal state.

When the input to the DAC is zero data for a constant period of time, the output signal ZD of the zero detect circuit 26 goes to "H" level, that is, the input terminal U/Di of the up/down counter 37 becomes "H" level. When the input terminal U/Di becomes "H" level, this counter 37 starts the up-count operation so that the discrete value of the counter 37 increases as 1, 2, 3, . . . , in a count up condition. In accordance with this, the switch control signals S1, S2, S3, . . . of the decoder 38 sequentially go to "H" level, and the analog switch circuits SW1, SW2, SW3, . . . responding thereto are sequentially turned on so that the resistance Rmt of the variable resistor circuit 36 becomes smaller as 14r, 13r, 12r, . . . . Then, finally, the switch control signal S15 goes to "H" level, and the variable resistor circuit 36 goes to a short-circuited condition (the condition of the counter is 15) to be the mute ON.

Conversely, when the DAC input is not zero data any more, the signal ZD immediately goes to "L" level, that is, the input terminal U/Di of the up/down counter 37 becomes "L" level. When the input terminal U/Di becomes "L" level, the up/down counter 37 starts the down-count operation so that the discrete value of the counter 37 decreases as 14, 13, 12, . . . . In accordance with this, the switch control signals S14, S13, S12, . . . outputted from the decoder 38 sequentially go to "H" level, and the analog switch circuits SW14, SW13, SW12, responding thereto are sequentially turned on so that the resistance Rmt of the variable resistor circuit 36 becomes greater as r, 2r, 3r, . . . . Then, finally, the discrete value of the counter 37 becomes 0, and all analog switch circuits SW1 to SW15 become the oft state. Thus, the resistance Rmt of the variable resistor circuit 36 becomes 15r of the normal time so as to be the mute off.

As shown in a period T1 of FIG. 19, when the number of continuous zero data is small and the DAC input is not zero data any more before the discrete value of the counter 37 reaches 15, from that point, the down count operation is performed. Since the state becomes from a fade-out state to a fade-in state, it does not become the mute ON.

As shown in a period T2, after the period where the number of continuous zero data is small and the DAC input is not zero data any more before the discrete value of the counter 37 reaches 15 so that the down count operation is performed, when zero data are detected again, the state repeats from a fade-out state to a fade-in state, and to the fade-out state.

FIG. 20 is a circuit diagram showing a structural example of a mute circuit of the case in which a filter amplifier section of the DAC is a differential amplifier type. In this case, not only the feedback resistor but also the resistance between the non-inverting input terminal (+) and the reference potential (VREF) are needed t o b e changed.

In the circuit shown in FIG. 20, like reference numerals are attached to like structural sections that are similar to those in FIG. 10, and detailed explanation are omitted therefor. That is, the first analog output of an m level DAC 31' is supplied to the inverting input terminal (−) of the op-amp 22 via resistors 32-1, 18-1, 19-1, and the second analog output (the inverted one of the first analog output) is supplied to the non-inverting input terminal (+) of the op-amp 22 via resistors 32-2, 18-2, 19-2. One side electrode of the capacitor 20 is connected to the node between the resistors 32-1 and 18-1, and the other electrode is connected to the node between the resistors 32-2 and 18-2. One side electrode of the capacitor 21 is connected to the node between the resistors 18-1 and 19-1, and the other electrode is connected to the node between the resistors 18-2 and 19-2.

A variable resistor circuit 39 is provided at the non-inverting input terminal (+) of the op-amp 22, and the resistance Rmt is stepwise controlled by 0 to $(2^n-1)r$ for each resistance r by means of the output signal of the decoder 38.

FIG. 21 is a circuit diagram (m=2, n=4) showing a concrete example of the circuit shown in FIG. 20. The output signal RZ of the AND gate 12 is supplied to the input terminal of an inverter 14-1 as well as the input terminal of an inverter 14-2 via an inverter 10-1. The output signal RZn of the NAND gate 13 is supplied to the input terminal of an inverter 16-1 as well as the input terminal of an inverter 16-2 via an inverter 10-2. The output terminals of the inverters 14-1, 16-1, 14-2, 16-2 are connected to one ends of resistors 15-1, 17-1, 15-2, 17-2, respectively. The other ends of the resistors 15-1, 17-1 are connected with each other so as to be connected to one end of the resistor 18-1, and the other ends of the resistors 15-2, 17-2 are connected to each other so as to be connected to one end of the resistor 18-2.

In order to reduce the click sound as much as possible, it is necessary to further smoothen the waveform at the time of the mute on/off as being obvious from the comparison of FIG. 8 and FIG. 9.

Here, it will be considered to double the change step number of the feedback resistor (the variable resistor circuit 36 shown in FIG. 17A) of the op-amp 22 in the circuit shown in FIGS. 10 and 11.

FIG. 22 is a circuit diagram showing a structural example of a variable resistor circuit 36' in which the change step number is doubled. As shown in the drawing, needed are 31 resistors connected in series between terminals IN and OUT, one analog switch circuit connected between the terminals IN and OUT, and 30 analog switch circuits connected between the nodes of the respective resistors and the terminal OUT. That is, it is obvious that the circuit scale is doubled.

FIG. 23A is a symbol diagram of an analog switch circuit in the circuit shown in FIG. 22, and FIG. 23B is a circuit diagram showing the detailed structural example thereof. This analog switch circuit is composed of a P channel MOS transistor P4 and an N channel MOS transistor N4 whose current paths are connected in parallel between the terminal I and the terminal O, and an inverter INV2. The input terminal of the inverter INV2 is connected to the terminal C, and the output terminal thereof is connected to the gate of the MOS transistor P4. The back gate of this MOS transistor P4 is connected to the power supply VDD, and the back gate of the MOS transistor N4 is connected to ground point GND.

Even if this type of analog switch circuit with a relatively small number of elements is employed, when the change step number of the resistance is tried to be increased, a drastic increase in the circuit scale cannot be avoided.

Further, a decoder 38' supplying the switch control signals S1 to S31 to the analog switch circuits shown in FIGS. 22, 23A, and 23B becomes large scaled as shown in FIGS. 24, 25A, 25B, and 25C to be approximately doubled in the circuit scale.

FIG. 26 shows the relationship between input signals A, B, C, D, E and the switch choosing signals S1 to S31 in the decoder 38' shown in FIG. 25A and truth table of states of the mute circuit.

In FIGS. 25A, 25B, and 25C, although shift registers in the circuit shown in FIGS. 15A, 15B, and 15C are constituted with a latch circuit with a small number of elements, the circuit scale is drastically increased.

Albeit the circuit scale of the up/down counter 37' does not become so large, since the circuit scales of the feedback resistor 36' and the decoder 38' become doubled, the entire circuit scale becomes considerably large.

Moreover, when the step number is quadrupled, the circuit scales of the feedback resistor and the decoder are quadrupled, thereby increasing the load immensely. When a filter amplifier section of a DAC is a differential amplifier type, since it is necessary to constitute similarly not only the feedback resistor of the op-amp but also the resistor between the non-inverting input terminal and the reference potential, the circuit scale is further increased.

As described above, there is a problem in a conventional variable resistor circuit wherein an increase in the step number causes an increase in the circuit scale.

Further, in a D/A converter in which the variable resistor circuit is employed as a feedback resistor, there is a problem wherein when the step number of the feedback resistor is increased in order to reduce the click sound, the circuit scales of the feedback resistor and the decoder become immensely large, thereby engendering a cause bringing about a cost increase.

BRIEF SUMMARY OF THE INVENTION

Therefore, it is the first object of the present invention to provide a variable resistor circuit in which the step number can be increased while the increase in the circuit scale is restrained.

It is the second object of the present invention to provide a 1-bit D/A converter with a zero detect soft mute function wherein the step number through which the resistance of the feedback resistor is changed equivalently can be increased without causing increases in the circuit scales of the feedback resistor and the decoder.

Further, it is the third object of the present invention to provide a 1-bit D/A converter with a zero detect soft mute function of a low cost and a high-efficiency while restraining a drastic increase in the circuit scale.

The first object of the present invention is achieved by a variable resistor circuit of digital control comprising: a first digital control variable resistor in which a combined resistance changes stepwise, the first digital control variable resistor having i resistors (i is a positive integral number which is two or greater) connected in series and a group of first digital control switches each provided between one end of the obtained combined resistor and one end of one resistor, the group of first digital control switches being on/off controlled selectively in accordance with an output signal other than an output signal corresponding to an LSB of a counter; a second digital control variable resistor connected to the first digital control variable resistor in series, the second digital control variable resistor having two resistors connected in parallel and a second digital control switch connected to one side resistor in series, the second digital control switch being on/off controlled by the output signal corresponding to the LSB of the counter; and a third digital control switch provided between both ends of the first and second digital control variable resistors connected in series, the third digital control switch being ON controlled when the counter becomes a specific value so as to short-circuit both ends of the first and second digital control variable resistors.

Through the structure described above, the step number of the variable resistor circuit can be doubled by adding one resistor, the second digital control switch, and a terminal for controlling the second digital control switch. With this, the step number through which the resistance is changed equivalently can be increased while the increase in the circuit scale is restrained.

The second and third objects of the present invention are achieved by a 1-bit D/A converter with a zero detect soft mute function wherein a multibit digital signal is converted into a 1-bit signal, the 1-bit signal is analog outputted through an inverting amplifier type analog low-pass filter, a counter is operated by detecting that the multibit digital signal is all zero for a constant period of time, and a feedback resistor of the inverting amplifier in the analog low-pass filter is decreased stepwise based on a discrete value of the counter so as to be finally short-circuited so that a D/A convert output is fixed at a reference potential, the feedback resistor comprising: a first digital control variable resistor in which a combined resistance changes stepwise, the first digital control variable resistor having i resistors (i is a positive integral number which is two or greater) connected in series and a group of first digital control switches each provided between one end of the obtained combined resistor and one end of one resistor, the group of first digital control switches being on/off controlled selectively in accordance with an output signal other than an output signal corresponding to an LSB of the counter; a second digital control variable resistor connected to the first digital control variable resistor in series, the second digital control variable resistor having two resistors connected in parallel and a second digital control switch connected to one side resistor in series, the second digital control switch being on/off controlled by the output signal corresponding to the LSB of the counter; and a third digital control switch provided between both ends of the first and second digital control variable resistors connected in series, the third digital control switch being ON controlled when the counter becomes a specific value so as to short-circuit both ends of the first and second digital control variable resistors.

Through this structure, the step number through which the resistance of the feedback resistor is changed equivalently can be increased without causing an increase in the circuit scales of the feedback resistor and the decoder. With this, a 1-bit D/A converter with a soft mute function of a low cost and a high-efficiency with less click sound can be constituted. Specifically, in an IC circuit, two sides to the efficiency and cost become very advantageous.

Further, the first object of the present invention is achieved by a variable resistor circuit of digital control comprising: a first digital control variable resistor in which a combined resistance changes stepwise, the first digital control variable resistor having i resistors (i is a positive integral number which is two or greater) connected in series and a group of first digital control switches each provided between one end of the obtained combined resistor and one end of one resistor, the group of first digital control switches being on/off controlled selectively in accordance with output signals corresponding to bits of a counter, other than an LSB and a second LSB; a second digital control variable resistor connected to the first digital control variable resistor in series, the second digital control variable resistor having four resistors connected in parallel and a group of second digital control switches in which each switch is connected to three resistors among the four resistors in series, respectively, the group of second digital control switches being on/off controlled by the output signal corresponding to bits the LSB and the second LSB of the counter; and a third digital control switch provided between both ends of the first and second digital control variable resistors connected in series, the third digital control switch being ON controlled when the counter becomes a specific value so as to short-circuit both ends of the first and second digital control variable resistors.

Through this structure, the step number of the variable resistor circuit can be quadrupled by adding three resistors, the second digital control switch group of three switches, and a terminal for controlling the switches. With this, the step number through which the resistance is changed equivalently can be increased while an increase in the circuit scale is restrained.

Moreover, the second and third objects of the present invention are achieved by a 1-bit D/A converter with a zero detect soft mute function wherein a multibit digital signal is converted into a 1-bit signal, the 1-bit signal is analog outputted through an inverting amplifier type analog low-pass filter, a counter is operated by detecting that the multibit digital signal is all zero for a constant period of time, and a feedback resistor of the inverting amplifier in the analog low-pass filter is decreased stepwise based on a discrete value of the counter so as to be finally short-circuited so that a D/A convert output is fixed at a reference potential, the feedback resistor comprising: a first digital control variable resistor in which a combined resistance changes stepwise, the first digital control variable resistor having i resistors (i is a positive integral number which is two or greater) connected in series and a group of first digital control switches each provided between one end of the obtained combined resistor and one end of one resistor, the group of first digital control switches being on/off controlled selectively in accordance with output signals corresponding to bits of the counter, other than an LSB and a second LSB; a second digital control variable resistor connected to the first digital control variable resistor in series, the second digital control variable resistor having four resistors connected in parallel and a group of second digital control switches in which each switch is connected to three resistors among the four resistors in series, respectively, the group of second digital control switches being on/off controlled by the output signal corresponding to bits the LSB and the second LSB of the counter; and a third digital control switch provided between both ends of the first and second digital control variable resistors connected in series, the third digital control switch being ON controlled when the counter becomes a specific value so as to short-circuit both ends of the first and second digital control variable resistors.

Through this structure, the step number through which the resistance of the feedback resistor is changed equivalently can be quadrupled without causing an increase in the circuit scale of the feedback resistor and the decoder. Specifically, in an IC circuit, two sides to the efficiency and cost become very advantageous.

The first object of the present invention is achieved by a variable resistor circuit of digital control comprising: a first digital control variable resistor in which a combined resistance changes stepwise, the first digital control variable resistor having i resistors (i is a positive integral number which is two or greater) connected in series and a group of first digital control switches each provided between one end of the obtained combined resistor and one end of one resistor, the group of first digital control switches being on/off controlled selectively in accordance with output signals of an upper bit side of a counter; a second digital control variable resistor connected to the first digital control variable resistor in series, the second digital control variable resistor having p resistors (p is a positive integral number which is two or greater) connected in parallel and a group of second digital control switches connected to (p–1) resistors among the p resistors in series, respectively, the group of second digital control switches being on/off controlled by output signals of a lower bit side of the counter; and a third digital control switch provided between both ends of the first and second digital control variable resistors connected in series, the third digital control switch being ON controlled when the counter becomes a specific value so as to short-circuit both ends of the first and second digital control variable resistors.

Through this structure, the step number of the variable resistor circuit can be made p times by adding (p–1) resistors, (p–1) second digital control switch group, and the terminals for controlling the second digital control switch group. With this, the step number through which the resistance is changed equivalently can be increased while restraining an increase in the circuit scale.

The second and third objects of the present invention are achieved by a 1-bit D/A converter with a zero detect soft mute function wherein a multibit digital signal is converted into a 1-bit signal, the 1-bit signal is analog outputted through an inverting amplifier type analog low-pass filter, a counter is operated by detecting that the multibit digital signal is all zero for a constant period of time, and a feedback resistor of the inverting amplifier in the analog low-pass filter is decreased stepwise based on a discrete value of the counter so as to be finally short-circuited so that a D/A convert output is fixed at a reference potential, the feedback resistor comprising: a first digital control variable resistor in which a combined resistance changes stepwise, the first digital control variable resistor having i resistors (i is a positive integral number which is two or greater) connected in series and a group of first digital control switches each provided between one end of the obtained combined resistor and one end of one resistor, the group of first digital control switches being on/off controlled selectively in accordance with output signals of an upper bit side of the counter; a second digital control variable resistor connected to the first digital control variable resistor in series, the second digital control variable resistor having p resistors (p is a positive integral number which is two or greater) connected in parallel and a group of second digital control switches connected to (p–1) resistors among the p resistors in series, respectively, the group of second digital control switches being on/off controlled by output signals of a lower bit side of the counter; and a third digital control switch provided between both ends of the first and second digital control variable resistors connected in series, the third digital control switch being ON controlled when the counter becomes a specific value so as to short-circuit both ends of the first and second digital control variable resistors.

Through this structure, the step number through which the resistance of the feedback resistor is changed equivalently can be increased p times without causing an increase in the circuit scale of the feedback resistor and the decoder. With this, a 1-bit D/A converter with a soft mute function of a low cost and a high-efficiency with less click sound can be constituted. Specifically, in an IC circuit, two sides to the efficiency and cost become very advantageous.

Furthermore, the second and third objects of the present invention is achieved by a 1-bit D/A converter with a zero detect soft mute function comprising: a sigma-delta modulator to which a multibit digital signal is inputted and which converts the multibit digital signal into an m level signal and outputs the m level signal; an m level DAC to which the m level signal outputted from the sigma-delta modulator is inputted, an analog low-pass filter to which an analog output outputted from the m level DAC is inputted so as to output an analog signal, the analog low-pass filter having an inverting amplifier; a zero detect circuit detecting that the multibit digital signal is all zero for a constant period of time; an n-bit up/down counter starting an up-count operation when it is detected that the multibit digital signal is all zero for a constant period of time by the zero detect circuit and starting a down-count operation at the time of non-detecting;

a decoder to which an n-bit discrete value outputted from the up/down counter is inputted and which decodes the n-bit discrete value so as to generate a substantially $2^{n-1}$ decode signal; and a feedback resistor being controlled by the substantially $2^{n-1}$ decode signal outputted from the decoder so that its resistance is decreased stepwise to be short-circuited finally, the feedback resistor comprising: a first digital control variable resistor in which a combined resistance changes stepwise, the first digital control variable resistor having i resistors (i is a positive integral number which is two or greater) connected in series and a group of first digital control switches each provided between one end of the obtained combined resistor and one end of one resistor, the group of first digital control switches being on/off controlled selectively in accordance with output signals of an upper bit side of a counter; a second digital control variable resistor connected to the first digital control variable resistor in series, the second digital control variable resistor having p resistors (p is a positive integral number which is two or greater) connected in parallel and a group of second digital control switches connected to (p−1) resistors among the p resistors in series, respectively, the group of second digital control switches being on/off controlled by output signals of a lower bit side of the counter; and a third digital control switch provided between both ends of the first and second digital control variable resistors connected in series, the third digital control switch being ON controlled when the counter becomes a specific value so as to short-circuit both ends of the first and second digital control variable resistors.

Through this structure, the step number through which the resistance of the feedback resistor is changed equivalently can be increased p times without causing an increase in the circuit scales of the feedback resistor and the decoder. With this, a 1-bit D/A converter with a soft mute function of a low cost and a high-efficiency with a less click sound can be constituted. Specifically, in an IC circuit, two sides to the efficiency and cost become very advantageous.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 16 is a truth table for explaining about the operations of the decoder shown in FIG. 11;

FIG. 23A is for explaining about a structural example of an analog switch circuit in the circuit shown in FIG. 22 and is a symbol diagram of the switch circuit;

FIG. 23B is for explaining about a structural example of the analog switch circuit in the circuit shown in FIG. 22 and is a circuit diagram showing a detailed structural example;

FIG. 24 is a block diagram of the decoder supplying switch control signals to the analog switch circuits shown in FIGS. 22, 23A, and 23B and an up/down counter;

FIG. 26 is a truth table for explaining about operations of the decoder shown in FIG. 25A;

FIG. 32 is a truth table for explaining about operations of the decoder shown in FIG. 31;

FIG. 41 is a truth table for explaining about operations of the decoder shown in FIG. 40;

FIG. 47 is a truth table for explaining about operations of the decoder shown in FIG. 46;

DETAILED DESCRIPTION OF THE INVENTION

[First Embodiment]

Figure 27:
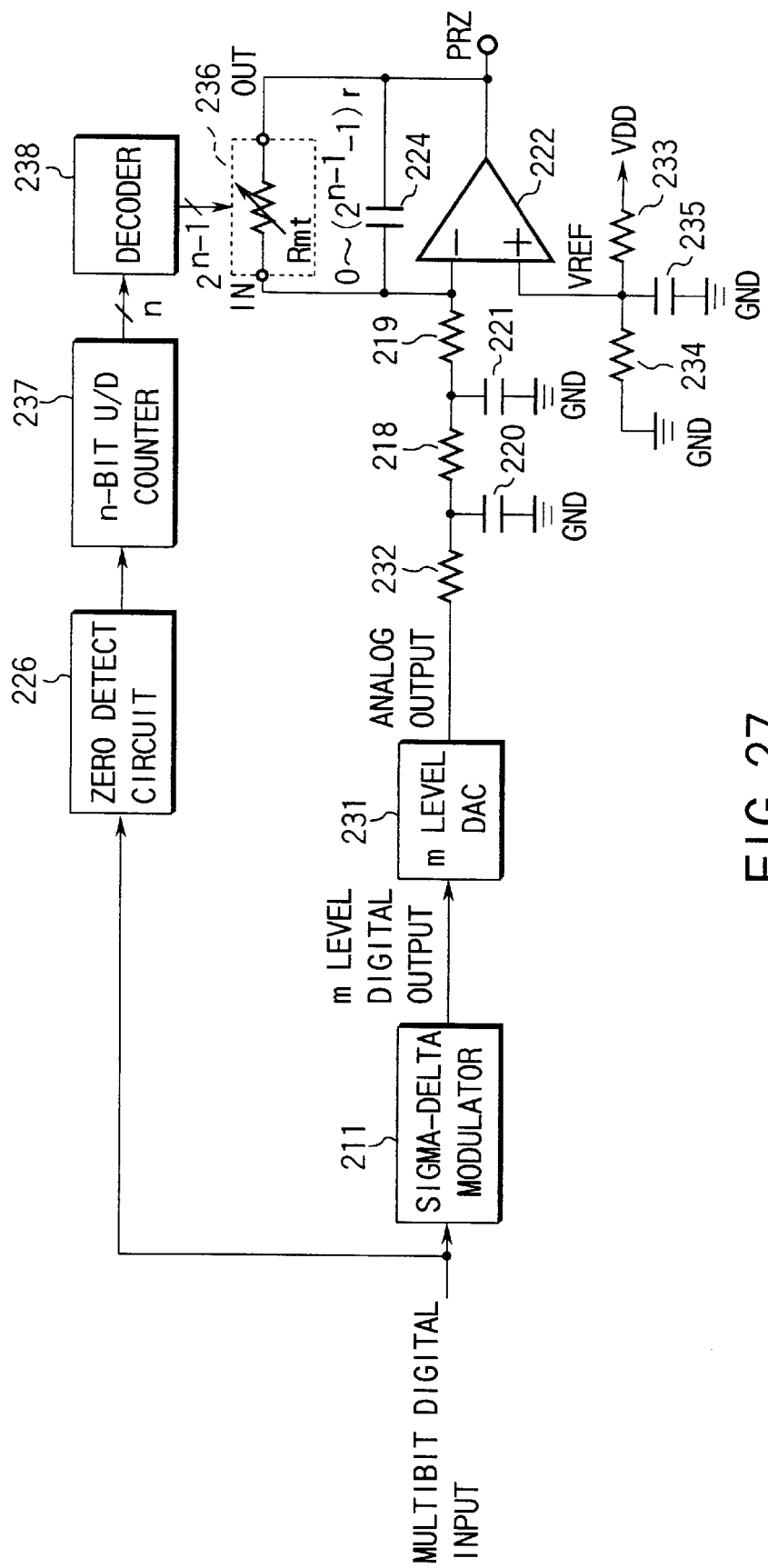
FIG. 27 is for explaining about a variable resistor circuit and a D/A converter according to the first embodiment of the present invention and is a circuit diagram showing a structural example of an output circuit section of a DAC with a zero detect mute function by which a click sound can be reduced.

FIG. 27 is for explaining about a variable resistor circuit and a D/A converter according to the first embodiment of the present invention and shows a structural example of an output circuit section of a DAC with a zero detect mute function wherein a click sound can be reduced. A multibit digital signal is inputted to a sigma-delta modulator 211 and a zero detect circuit 226. M level digital output outputted from the sigma-delta modulator 211 is supplied to an m level DAC 231, and the analog signal from this DAC 231 is supplied to the inverting input terminal (−) of an op-amp 222 via resistors 232, 218, 219. Here, the output level of the sigma-delta modulator 211 corresponds to a value of approximately m=2 to 15 generally.

A capacitor 220 is connected between the node of the resistors 232, 218 and ground point GND, and a capacitor 221 is connected between the node of the resistors 218, 219 and ground point GND.

A reference potential VREF is applied to the non-inverting input terminal (+) of the op-amp 222. This reference potential VREF is produced by resistors 233, 234 connected in series between power supply VDD and ground point GND and a capacitor 235 connected between the node of these resistors 233, 234 and ground point GND.

A capacitor 224 and a variable resistor circuit 236 are connected in parallel between the output terminal and the inverting input terminal (−) of the op-amp 222. The variable resistor circuit 236 acts as a feedback resistor of the op-amp 222, and its resistance changes stepwise in the range of 0 to $(2^{n-1}-1)r$.

The output signal of the zero detect circuit 226 is supplied to an n-bit up/down (U/D) counter 237. The n-bit discrete value outputted from this counter 237 is supplied to a decoder 238. This decoder 238 decodes the n-bit discrete value outputted from the counter 237 so as to generate a $2^{n-1}$ decode signal and supplies this to the variable resistor circuit 236 so as to control its resistance stepwise by 0 to $(2^{n-1}-1)r$.

Figures 28, 29:
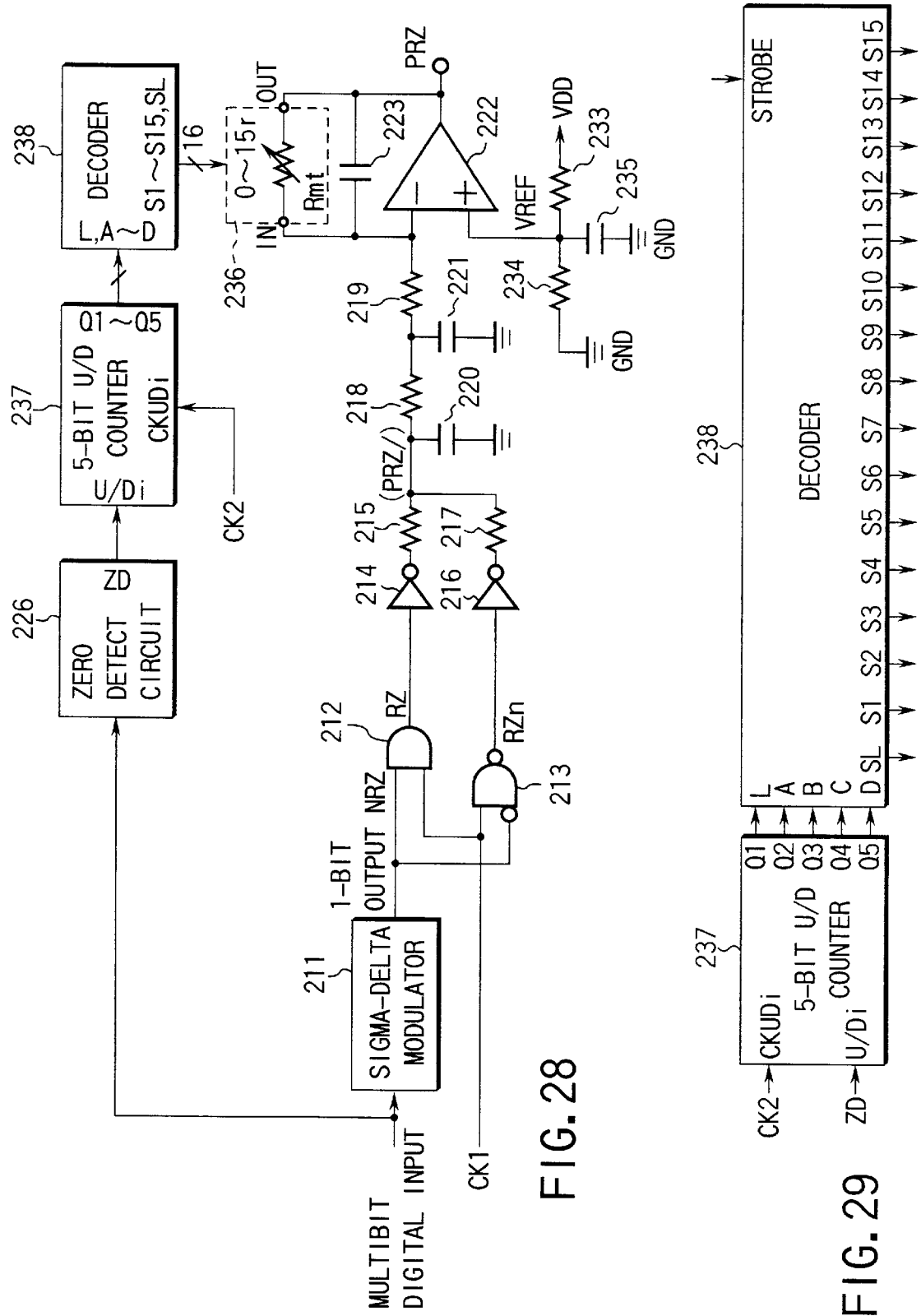
FIG. 28 is a circuit diagram showing a concrete structural example of the circuit shown in FIG. 27.
FIG. 29 is a block diagram extracting and showing the counter and the decoder in the circuit shown in FIG. 28.

FIG. 28 shows the circuit shown in FIG. 27 more concretely and is a structural example of the case of m=2, n=5. In the circuit shown in FIG. 28, the multibit digital signal is inputted to the sigma-delta modulator 211 and the zero detect circuit 226. The 1-bit output signal NRZ of this sigma-delta modulator 211 is supplied to one side input terminal of an AND gate 212 and, after being inverted, is supplied to one side input terminal of a NAND gate 213. A clock signal CK1 is supplied to the other input terminal of the AND gate 212, and the clock signal CK1 is supplied to the other input terminal of the NAND gate 213.

An output signal RZ of the AND gate 212 is supplied to one end of a resistor 215 via an inverter 214, and an output signal RZn of the NAND gate 213 is supplied to one end of a resistor 217 via an inverter 216. The other ends of the resistors 215, 217 are connected to one end of a resistor 218, and the other end of this resistor 218 is connected to one end of a resistor 219. A capacitor 220 is connected between the one end of the resistor 218 and ground point GND, and a capacitor 221 is connected between the other end of the resistor 218 and ground point GND.

The other end of the resistor 219 is connected to the inverting input terminal (−) of the op-amp 222, and the reference potential VREF is applied to the non-inverting input terminal (+) of this op-amp 222. The reference potential VREF is generated by the resistors 233, 234 connected in series between the power supply VDD and ground point GND and the capacitor 235 connected between the node of the resistors 233, 234 and ground point GND.

The capacitor 223 and the variable resistor circuit 236 are connected in parallel between the output terminal and the inverting input terminal (−) of the op-amp 222 so that the output signal PRZ is feedback to the inverting input terminal (−). In the variable resistor circuit 236, the resistance Rmt changes stepwise in the range of 0 to 15r by r/2.

An output signal ZD of the zero detect circuit 226 is supplied to an input terminal U/Di of the 5-bit up/down (U/D) counter 237. A clock signal CK2 is supplied to a clock input terminal CKUDi of this counter 237. Five-bit discrete values outputted from output terminals Q1 to Q5 of this counter 237 are supplied to the decoder 238. This decoder 238 decodes the 5-bit discrete values outputted from the output terminals Q1 to Q5 of the counter 237 so as to generate switch control signals S1 to S15, SL, and supplies these to the variable resistor circuit 236 to control it stepwise so that its resistance Rmt changes 0 to 15r by r/2.

FIG. 29 is a block diagram extracting and showing the counter 237 and the decoder 238 in the circuit shown in FIG. 28. The counter 237 is provided with a clock input terminal CKUDi to which the clock signal CK2 is inputted, a terminal U/Di to which the detect signal ZD of the zero detect circuit 22 is inputted, and the output terminals Q1 to Q5.

The output signals Q1, Q2, Q3, Q4, Q5 of the 5-bit up/down counter 237 and a strobe signal STROBE are supplied to the decoder 238, and the decoder 238 outputs switch control signals S1 to S15, SL for stepwise controlling the resistance Rmt of the variable resistor circuit 236.

Figure 30:
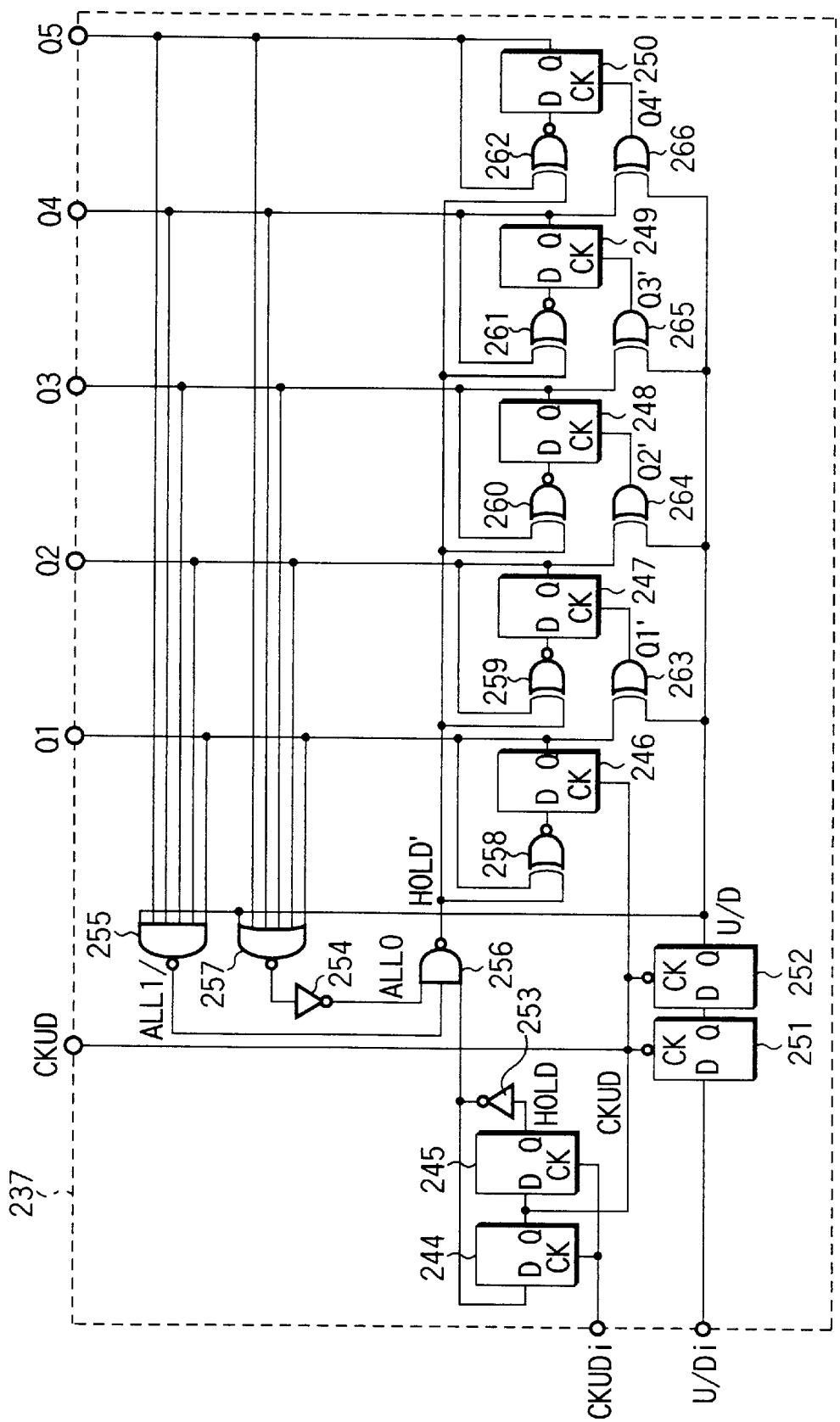
FIG. 30 is a circuit diagram showing the concrete structural example of a 5-bit up/down counter shown in FIG. 29.

FIG. 30 is a circuit diagram showing a concrete structural example of the 5-bit U/D counter 237 shown in FIG. 29. This counter 237 is composed of flip-flops 244 to 252, inverters 253, 254, NAND gates 255, 256, a NOR gate 257, exclusive NOR gates 258 to 262, exclusive OR gates 263 to 266, and the like.

Clock input terminals CK of the flop-flops 244, 245 are connected to the input terminal CKUDi. The data input terminal D of the flip-flop 251 is connected to the input terminal U/Di. The data output terminal Q of the flip-flop 244, the data input terminal D of the flip-flop 245, and the clock input terminals CK of the flip-flops 246, 251, 252 are connected to a terminal CKUD, respectively. Here, a signal of the terminal CKUD is inverted and supplied to the clock input terminals CK of the flip-flops 251, 252. The signal of this terminal CKUD is a clock signal of the period of 4 times the clock signal supplied to the input terminal CKUDi.

The output terminal of the inverter 253 and the first input terminal of the NAND gate 256 are connected to the data input terminal D of the flip-flop 244. The data output terminal Q of the flip-flop 245 is connected to the input terminal of the inverter 253, and a signal HOLD is supplied thereto.

The output terminal of the NAND gate 256 is connected to one side input terminals of the exclusive NOR gates 258 to 262, respectively, and a signal HOLD' is supplied thereto. The output terminals of the exclusive NOR gates 258 to 262 are connected to the data input terminals D of the flip-flops 246 to 250, respectively.

The output terminal Q of the flip-flop 246 is connected to the other side input terminal of the exclusive NOR gate 258, the output terminal Q1, the first input terminal of the NAND gate 255, the first input terminal of the NOR gate 257, and one side input terminal of the exclusive OR gate 263, respectively.

The output terminal Q of the flip-flop 247 is connected to the other side input terminal of the exclusive NOR gate 259, the output terminal Q2, the second input terminal of the NAND gate 255, the second input terminal of the NOR gate 257, and one side input terminal of the exclusive OR gate 264, respectively. The output terminal of the exclusive OR gate 263 is connected to the clock input terminal CK of this flip-flop 247 so as to provide a signal Q1' thereto.

The output terminal Q of the flip-flop 248 is connected to the other side input terminal of the exclusive NOR gate 260, the output terminal Q3, the third input terminal of the NAND gate 255, the third input terminal of the NOR gate 257, and one side input terminal of the exclusive OR gate 265, respectively. The output terminal of the exclusive OR gate 264 is connected to the clock input terminal CK of this flip-flop 248 so as to provide a signal Q2' thereto.

The output terminal Q of the flip-flop 249 is connected to the other side input terminal of the exclusive NOR gate 261, the output terminal Q4, the fourth input terminal of the NAND gate 255, the fourth input terminal of the NOR gate 257, and one side input terminal of the exclusive OR gate 266, respectively. The output terminal of the exclusive OR gate 265 is connected to the clock input terminal CK of this flip-flop 249 so as to provide a signal Q3' thereto.

Further, the output terminal Q of the flip-flop 250 is connected to the other side input terminal of the exclusive NOR gate 262, the output terminal Q5, the fifth input terminal of the NAND gate 255, and the fifth input terminal of the NOR gate 257, respectively. The output terminal of the exclusive OR gate 266 is connected to the clock input terminal CK of this flip-flop 250 so as to provide a signal Q4' thereto.

The data output terminal Q of the flip-flop 251 is connected to the data input terminal D of the flip-flop 252. The data output terminal Q of this flip-flop 252 is connected to the sixth input terminal of the NAND gate 255, the sixth input terminal of the NOR gate 257, and the other side input terminals of the exclusive OR gates 263 to 266, respectively, so as to provide a signal U/D thereto, respectively.

Further, the output terminal of the NAND gate 255 is connected to the second input terminal of the NAND gate 256 so as to provide a signal ALL1/. The output terminal of the NOR gate 257 is connected to the input terminal of the inverter 254, and the output terminal of this inverter 254 is connected to the third input terminal of the NAND gate 256 so as to provide a signal ALL0 thereto.

Figure 1:
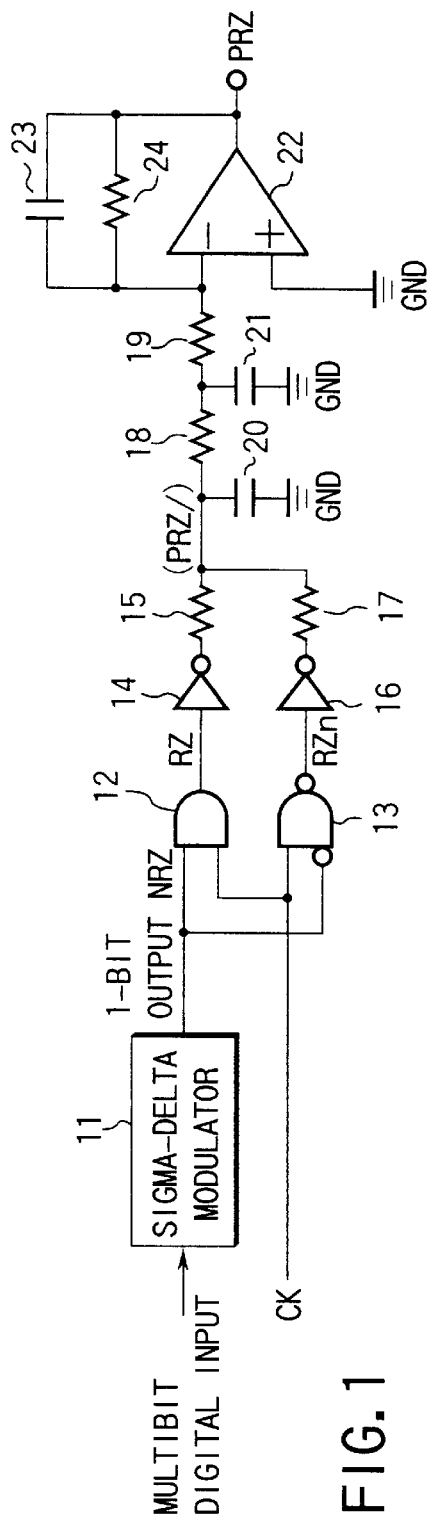
FIG. 1 is a circuit diagram showing a structural example of an output circuit section in a conventional D/A converter in which a sigma-delta modulator is employed.
Figure 2:
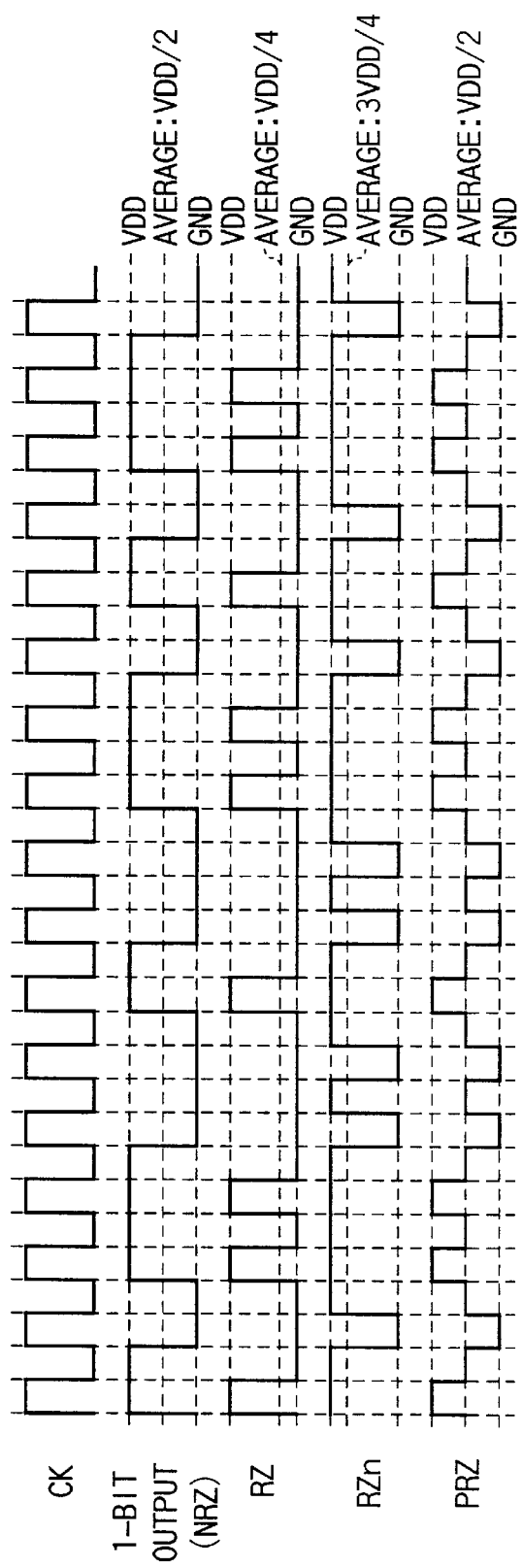
FIG. 2 is a timing chart for explaining about the operations of the circuit shown in FIG. 1.
Figure 3:
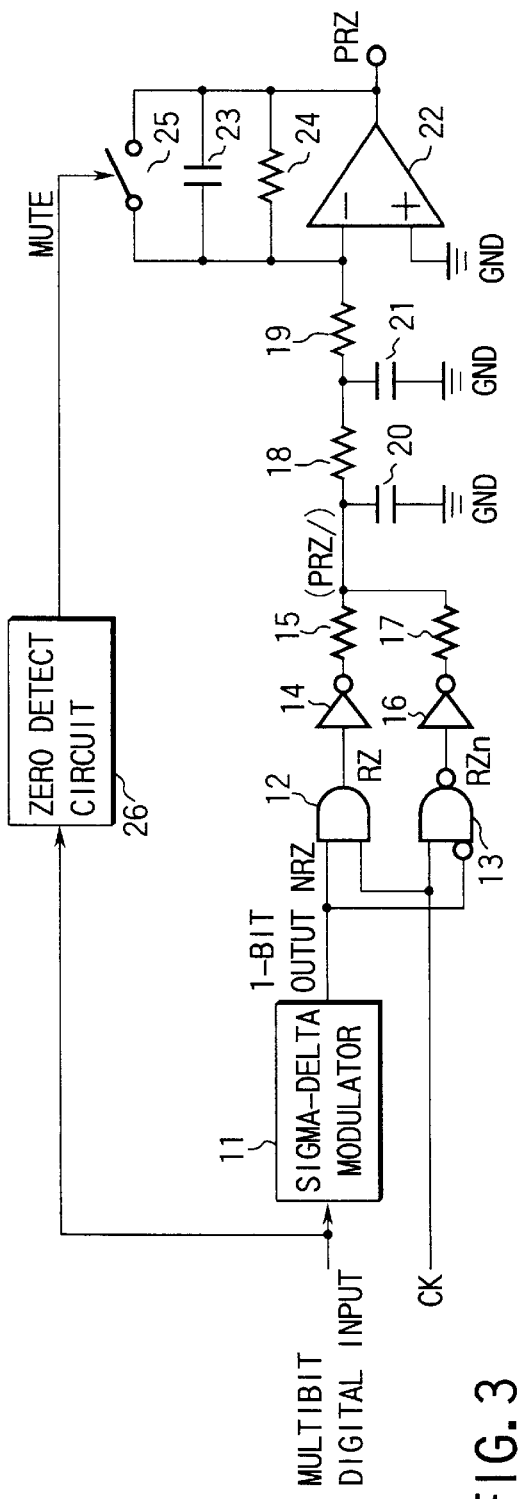
FIG. 3 is a circuit diagram showing a structural example of an output circuit section of a conventional D/A converter with a zero detect mute function.
Figure 4:
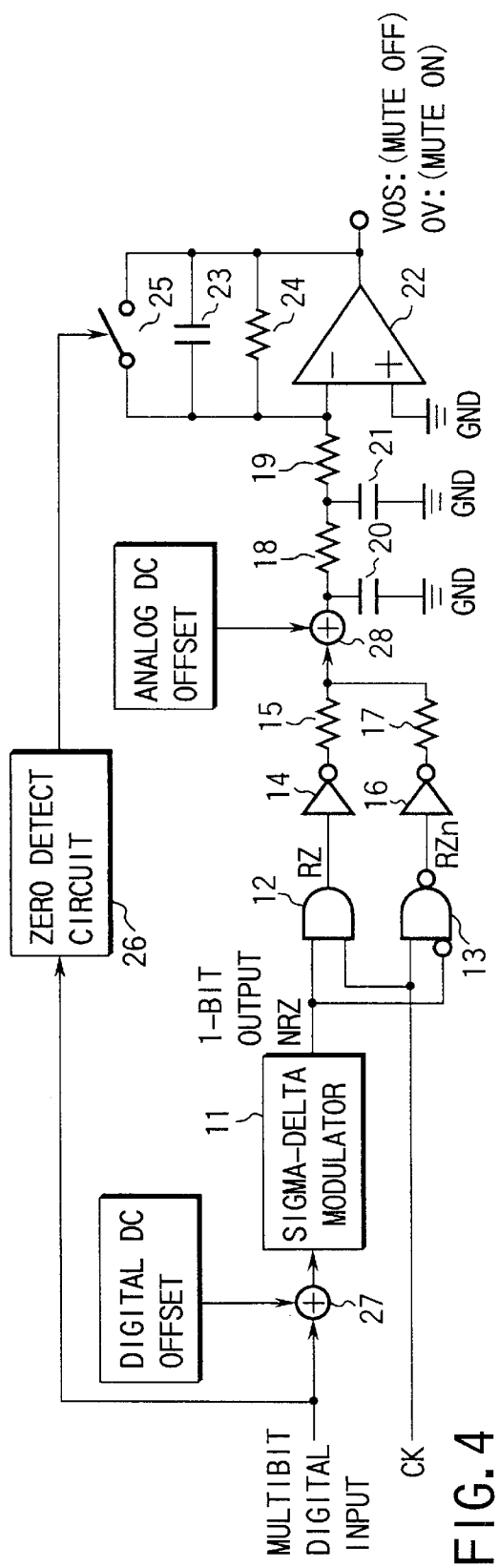
FIG. 4 is a circuit diagram showing another structural example of the output circuit section of a conventional D/A converter with the zero detect mute function.
Figure 5:
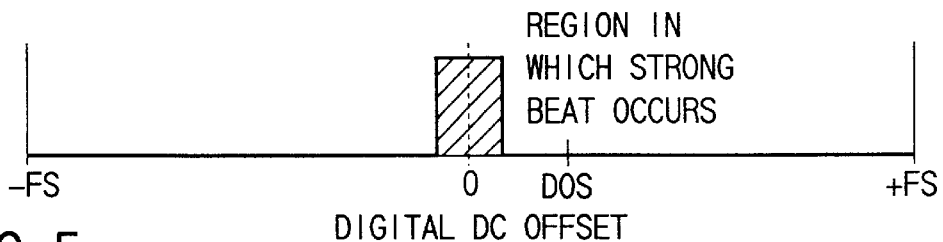
FIG. 5 is a drawing for explaining about a digital DC offset in the circuit shown in FIG. 4.
Figure 6:
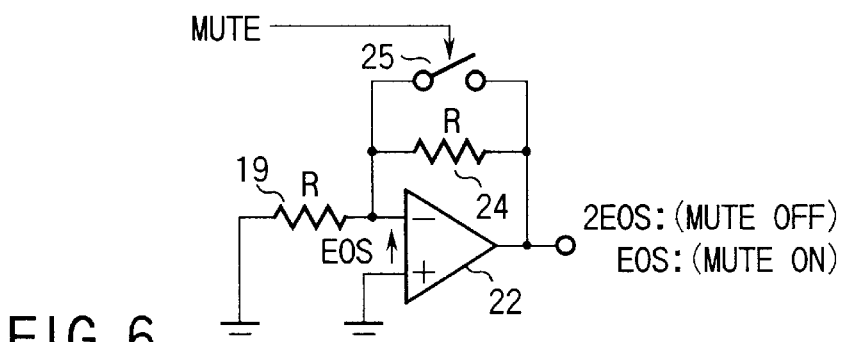
FIG. 6 is a circuit diagram for explaining about a DC displacement of an equivalent input DC offset by the mute on/off when a feedback resistor is short-circuited by an analog switch circuit so as to perform mute.
Figure 7:
FIG. 7 is a waveform showing a potential difference when mute off/on is performed at one time by the analog switch circuit.
Figure 8:
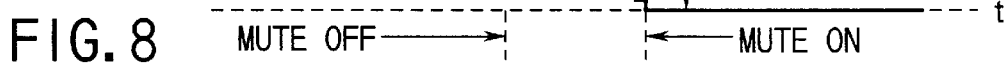
FIG. 8 is a waveform of the time when the mute on/off is performed by changing the voltage stepwise by means of analog switch circuits and is a view showing the case in which the voltage is decreased by 15 steps.
Figure 9:
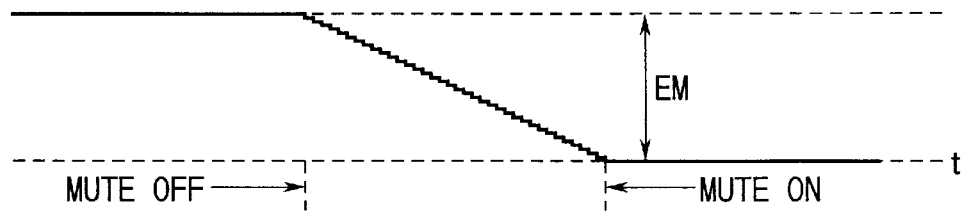
FIG. 9 is a waveform of the time when the mute on/off is performed by changing the voltage stepwise by means of the analog switch circuits and is a view showing the case in which the voltage is decreased by 30 steps.
Figure 10:
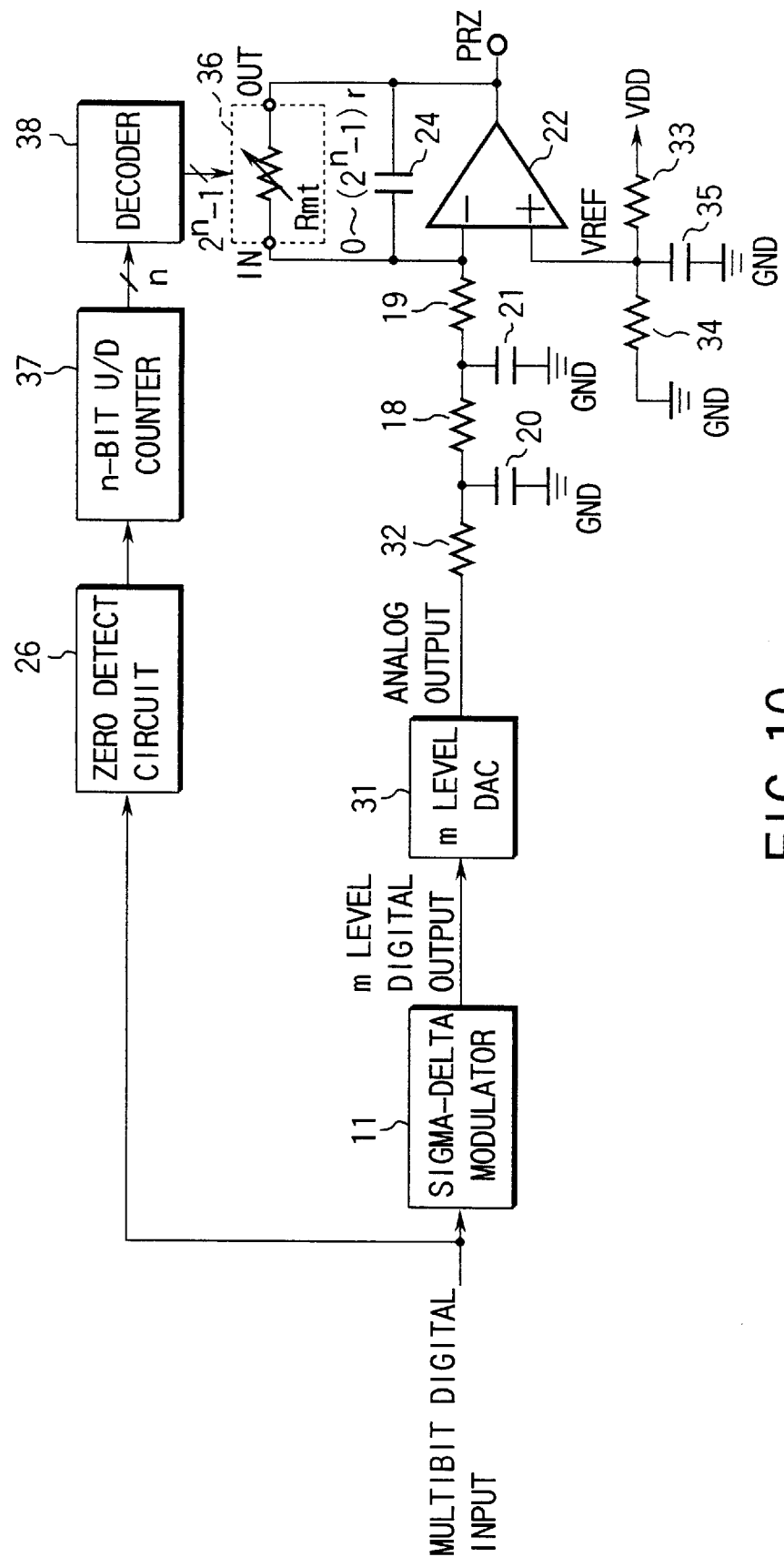
FIG. 10 is a circuit diagram showing a structural example of an output circuit section of a conventional DAC having the zero detect mute function so as to reduce a click sound.
Figure 11:
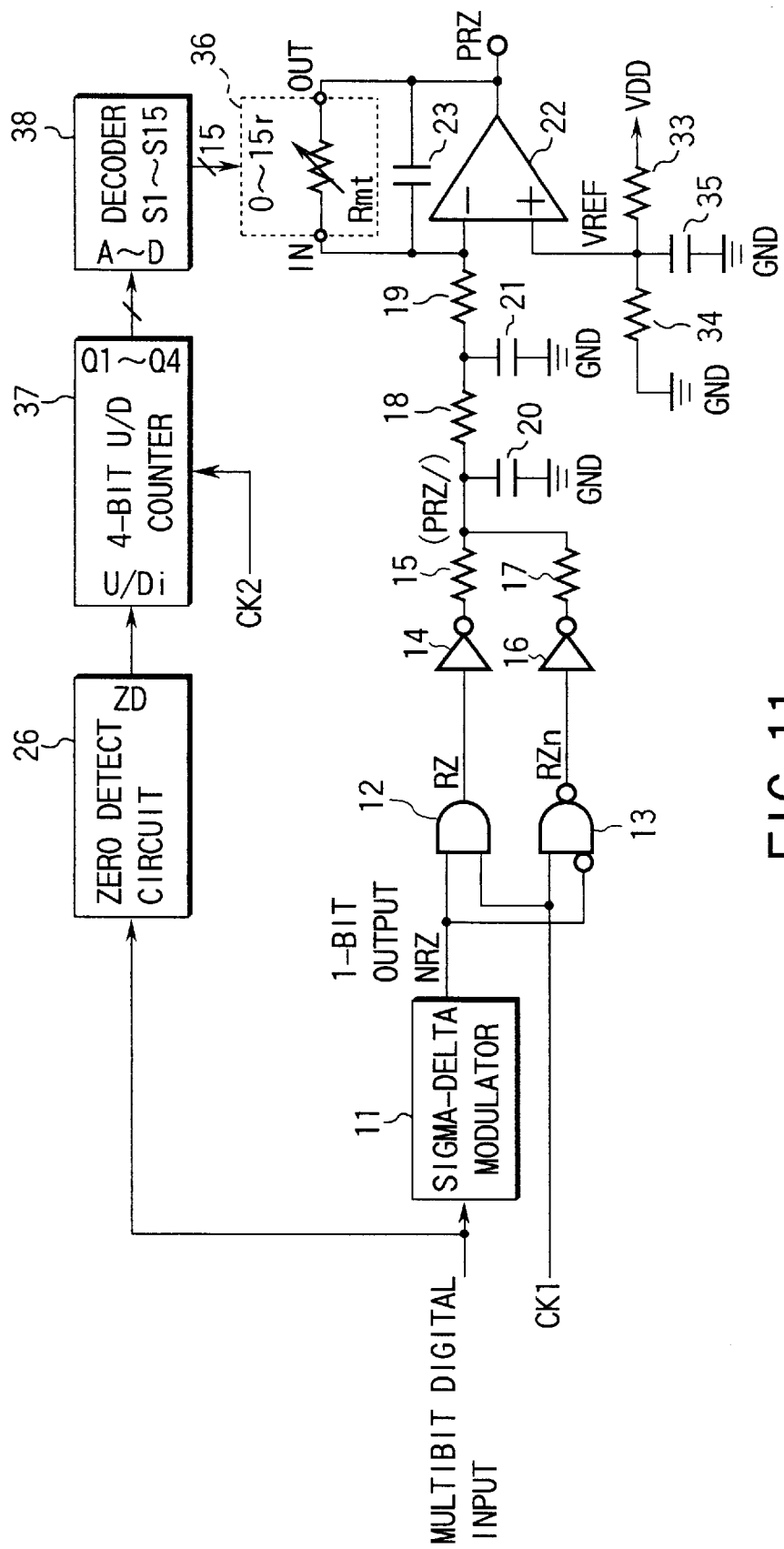
FIG. 11 is a view showing a circuit structural example in which the circuit shown in FIG. 10 is made further concrete.
Figure 12:
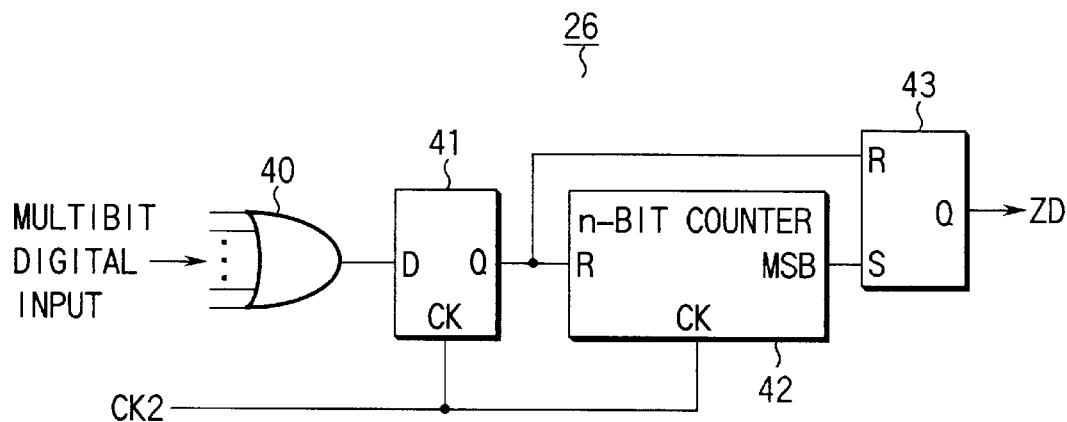
FIG. 12 is a view showing a structural example of a zero detect circuit in the circuit shown in FIG. 11.
Figure 13:
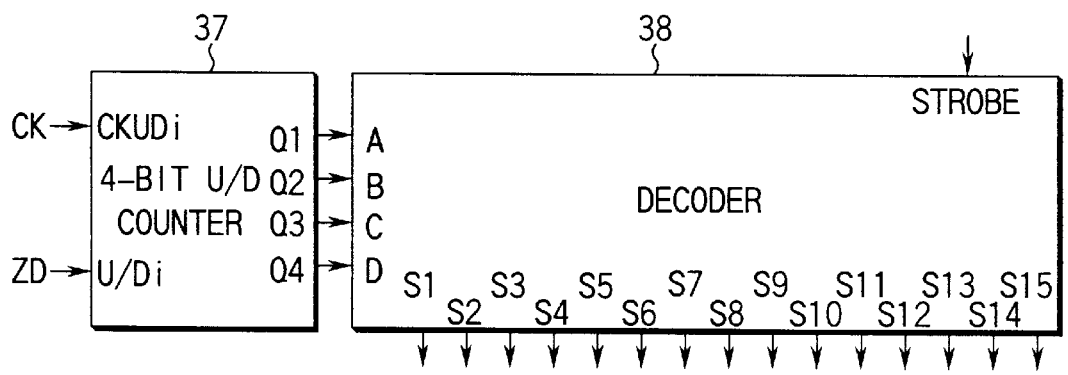
FIG. 13 is a block diagram extracting and showing the 4-bit up/down counter and the decoder in the circuit shown in FIG. 11.
Figure 14:
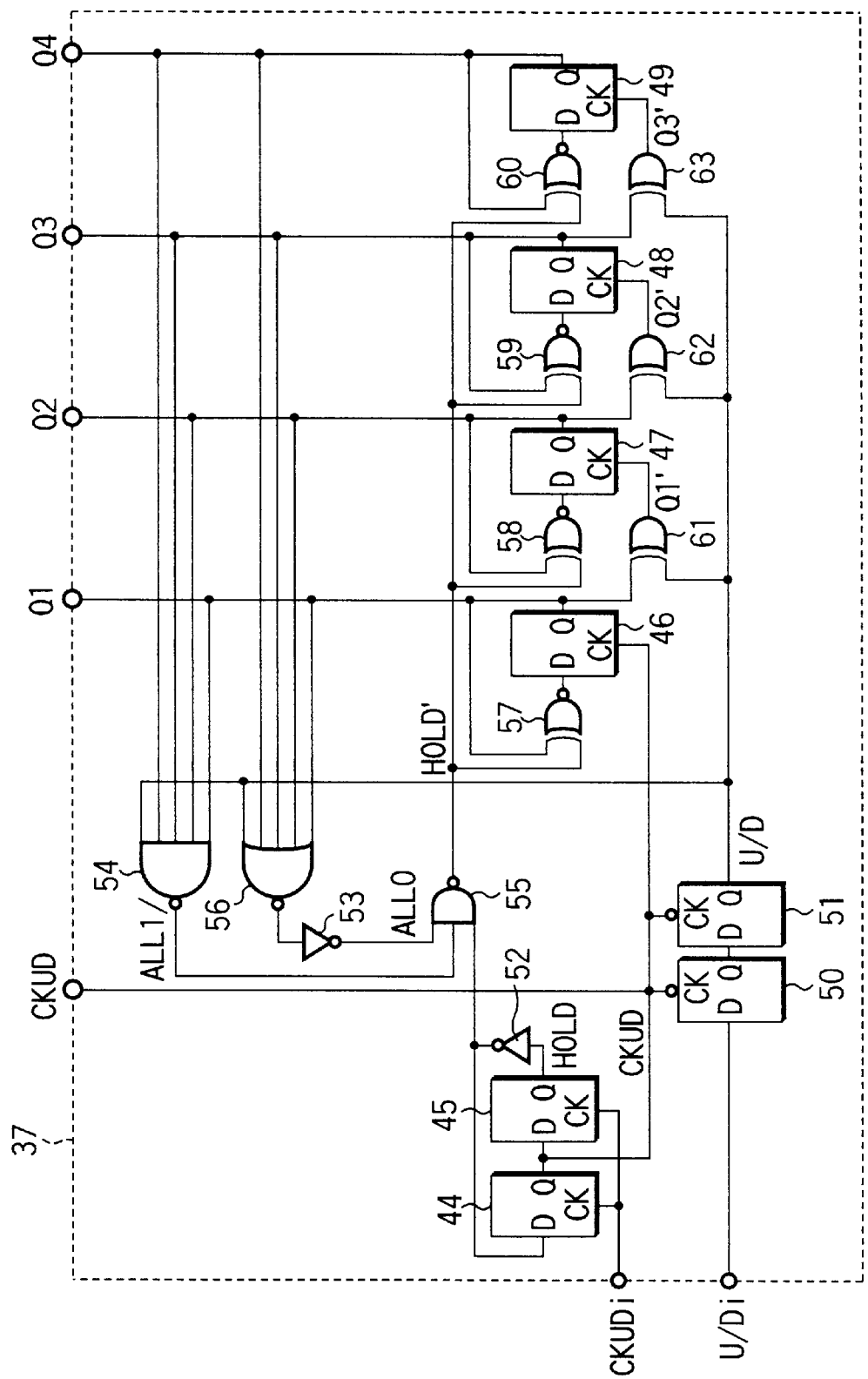
FIG. 14 is a circuit diagram showing a concrete structural example of the 4-bit up/down counter shown in FIG. 13.

The counter 237 is the one in which the counter 37 shown in FIG. 14 is 1-bit extended and each one of exclusive OR gate, exclusive NOR gate, and flip-flop is increased while six-input NAND gate 255 and NOR gate 257 are provided instead of the five-input NAND gate 54 and NOR gate 56.

Figure 31:
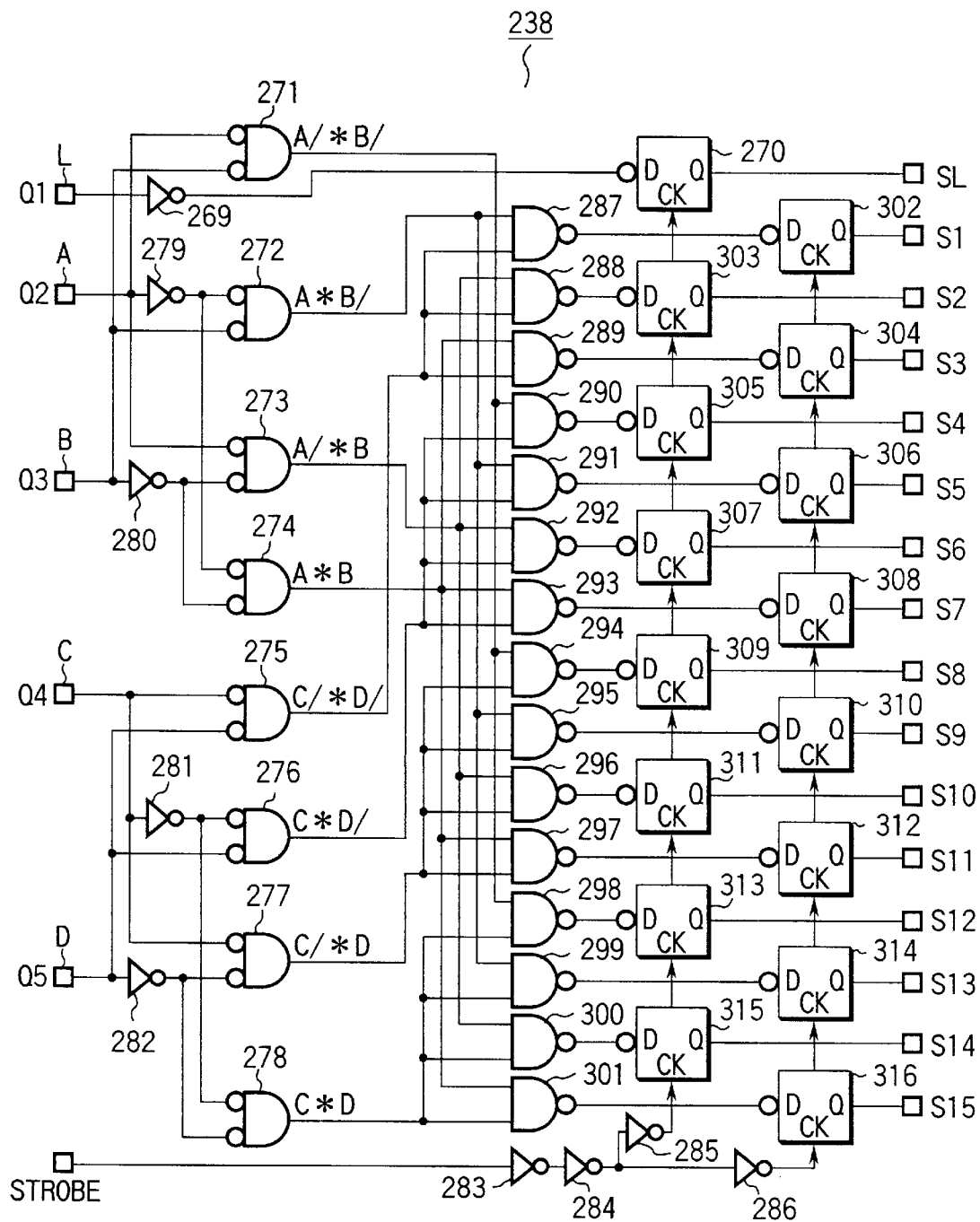
FIG. 31 is a circuit diagram showing a circuit structural example of the decoder shown in FIG. 29.

FIG. 31 shows a circuit structural example of the decoder 238 shown in FIG. 29. This decoder 238 is composed of AND gates 271 to 278, inverters 269, 279 to 286, NAND gates 287 to 301, and shift registers 270, 302 to 316.

The count output Q1 of the U/D counter 237 is supplied to the input terminal of the inverter 269. The count output Q2 is supplied to the input terminal of the inverter 279 and is inverted so as to be supplied to one side input terminal of the AND gates 271, 273. The count output Q3 is supplied to the input terminal of the inverter 280 and is inverted so as to be supplied to the other side input terminal of the AND gates 271 as well as one side input terminal of the AND gate 272. The count output Q4 is supplied to the input terminal of the inverter 281 and is inverted so as to be supplied to one side input terminals of the AND gates 275, 277. Further, the count output Q5 is supplied to the input terminal of the inverter 282 and is inverted so as to be supplied to the other side input terminal of the AND gate 275 as well as one side input terminal of the AND gate 276.

The output of the inverter 269, after being inverted, is supplied to the data input terminal D of the shift register 270. The output signal of the inverter 279, after being inverted, is supplied to the other side input terminal of the AND gate 272 and, after being inverted, is supplied to one side input terminal of the AND gate 274. The output signal of the inverter 280, after being inverted, is supplied to the other side input terminal of the AND gate 273 and, after being inverted, is supplied to the other side input terminal of the AND gate 274. The output signal of the inverter 281, after being inverted, is supplied to the other side input terminal of the AND gate 276, and, after being inverted, is supplied to one side input terminal of the AND gate 278. The output signal of the inverter 282, after being inverted, is supplied to the other side input terminals of the AND gates 277, 278.

When the count outputs Q1, Q2, Q3, Q4, Q5 are put as L, A, B, C, D, respectively, the logical output of the AND gate 271 becomes A/*B/, the logical output of the AND gate 272 becomes A*B/, the logical output of the AND gate 273 becomes A/*B, the logical output of the AND gate 274 becomes A*B, the logical output of the AND gate 275 becomes C/*D/, the logical output of the AND gate 276 becomes C*D/, the logical output of the AND gate 277 becomes C/*D, and the logical output of the AND gate 278 becomes C*D.

The output signal of the AND gate 271 is supplied to one side input terminals of the NAND gates 290, 294, 298, respectively, and the output signal of the AND gate 272 is supplied to one side input terminals of the NAND gates 287, 291, 295, 299, respectively. The output signal of the AND gate 273 is supplied to one side input terminals of the NAND gates 288, 292, 296, 300, and the output signal of the AND gate 274 is supplied to one side input terminals of the NAND gates 289, 293, 297, 301, while the output signal of the AND gate 275 is supplied to the other side input terminals of the NAND gates 287 to 289. The output signal of the AND gate 276 is supplied to the other side input terminals of the NAND gates 290 to 293, and the output signal of the AND gate 277 is connected to the other side input terminals of the NAND gates 294 to 297. Further, the output signal of the AND gate 278 is supplied to the other side input terminals of the NAND gates 298 to 301. The output signals of the NAND gates 287 to 301, after being inverted, are supplied to the data input terminals D of the shift registers 302 to 316, respectively.

The strobe signal STROBE is supplied to the clock input terminals CK of the respective shift registers 270, 303, 305, 307, 309, 311, 313, 315 via the inverters 283 to 285, and the strobe signal STROBE is supplied to the clock input terminals CK of the respective shift registers 302, 304, 306, 308, 310, 312, 314, 316 via the inverters 283, 284, 286. The switch control signals SL, S1 to S15 are outputted from the output terminals Q of the respective shift registers 270, 302 to 316.

Figure 15A:
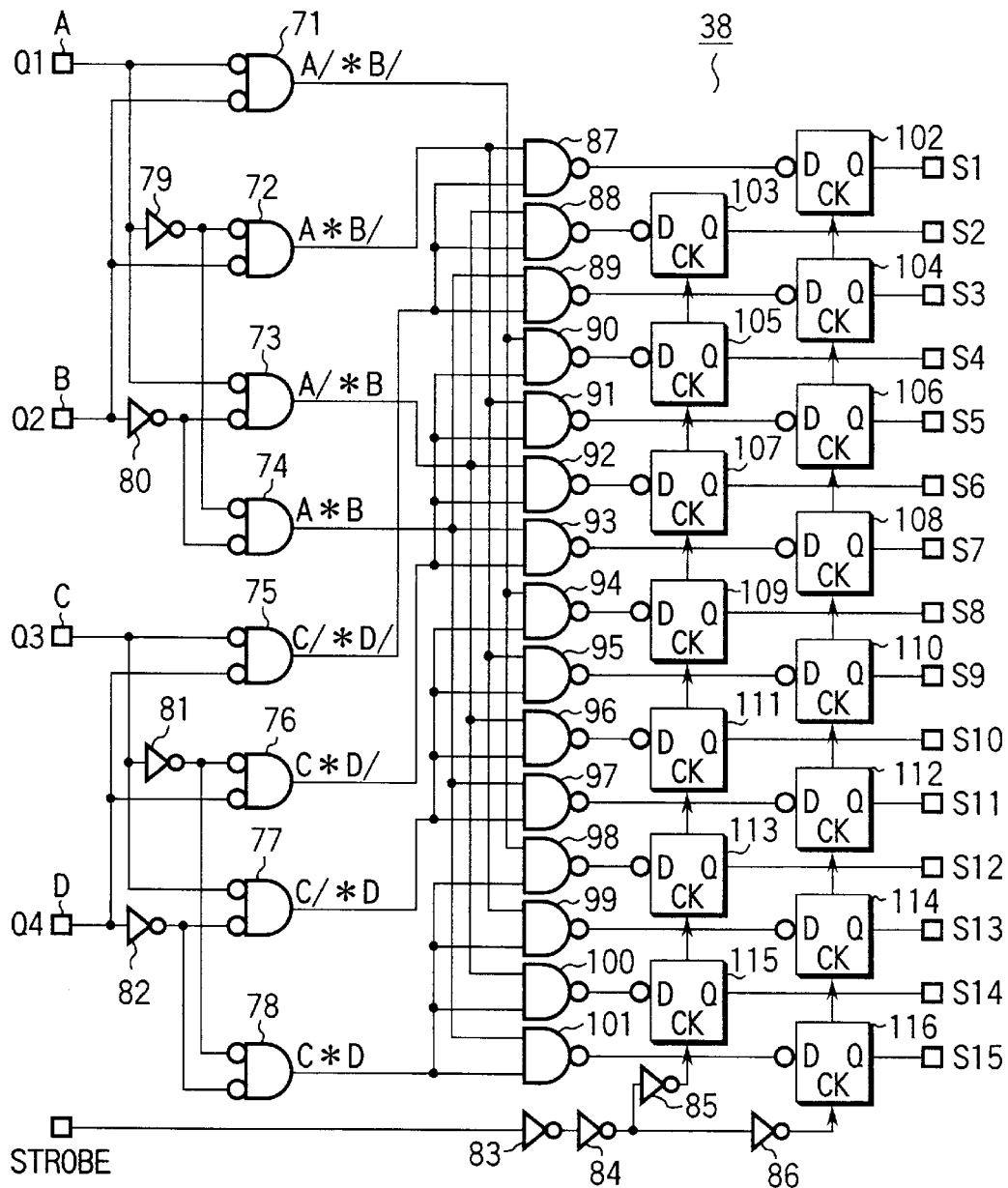
FIG. 15A shows a structural example of the decoder in the circuit shown in FIG. 13 and is a concrete circuit diagram.
Figure 15B:
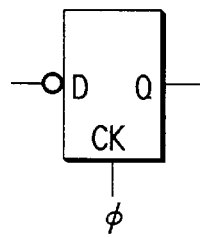
FIG. 15B is a symbol diagram of the shift register in FIG. 15A.
Figure 15C:
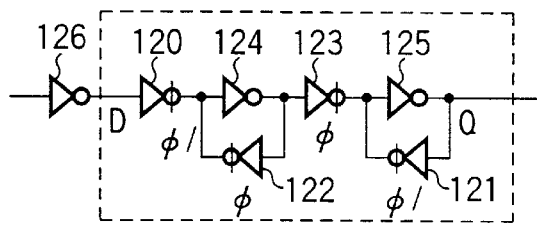
FIG. 15C is a circuit diagram showing a detailed structural example of the shift register shown in FIG. 15B.

The decoder 238 is the one in which each one of inverter 269 and shift register 270 is added to the decoder 38 shown in FIG. 15A so that one input terminal and one output terminal are increased.

FIG. 32 is a view showing truth table for explaining about operations of the decoder 238 shown in FIG. 31 and shows logical operations of the circuit shown in FIG. 31 all together. The switch control signals S1 to S15 selectively go to "H" level in accordance with combinations of the levels of the input signals L, A, B, C, D. Here, the switch control signal SL alternately repeats BILK level and "H" level during the period where the respective switch control signals S1 to S15 are at "H" level. With this, the resistance Rmt of the variable resistor circuit 236 changes stepwise in the range of 0 to 15r by r/2.

Figure 33:
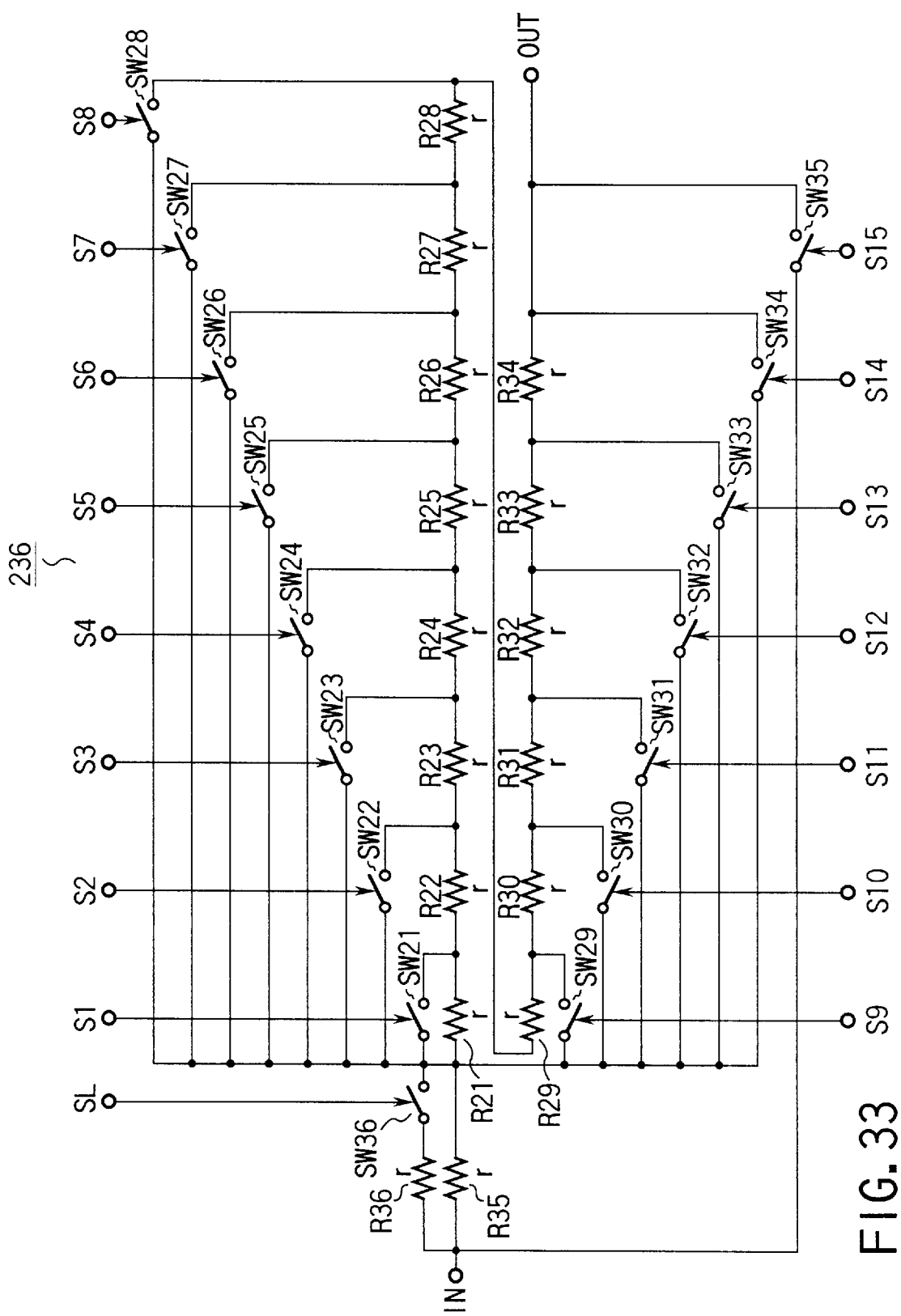
FIG. 33 is a circuit diagram showing a structural example of the variable resistor circuit in the circuit shown in FIG. 28.

FIG. 33 shows a structural example of the variable resistor circuit 236 (feedback resistor) in the circuit shown in FIG. 28. This variable resistor circuit 236 is composed of resistors R21 to R36 wherein each resistance is r and analog switch circuits SW21 to SW36 (SW21 to SW34: first digital control switch group, SW36: second digital control switch, SW35: third digital control switch). The resistors R35, R21 to R34 are connected in series between the inverting input terminal (−) and the output terminal of the op-amp 222. The current path of the analog switch circuit SW21 is connected to the node of the resistors R35 and R21 and the node of the resistors R21 and R22. The current path of the analog switch circuit SW22 is connected to the node of the resistors R35 and R21 and the node of the resistors R22 and R23. As the following, similarly, the current paths of the analog switch circuits SW23 to SW33 are connected to the node of the resistors R35 and R21 and the nodes of the resistors R23 to R34. The current path of the analog switch circuit SW34 is connected between the node of the resistors R35 and R21 and terminal OUT. Further, the current path of the analog switch circuit SW35 is connected between terminal IN and the terminal OUT.

The switch control signals S1 to S15 outputted from the decoder 238 are supplied to the analog switch circuits SW21 to SW35, respectively, so as to selectively perform on/off control. The feedback resistor of the op-amp 222 changes stepwise 0 to 15r by resistance r.

Further, the resistor R36 and the analog switch circuit SW36 are connected in series between the nodes the terminal IN and the resistors R35 and R21. The switch control signal SL outputted from the decoder 238 is supplied to the analog switch circuit SW36 so that the circuit SW36 is on/off controlled.

This switch control signal SL is a signal corresponding to LSB (least significant bit) of the counter 237, and when the discrete value of the counter is an even number, the analog switch circuit SW36 becomes OFF state so that the resistor R36 is cut off. On the other hand, when the value is an odd number, the analog switch circuit SW36 becomes ON state so that the resistor R36 is connected to the resistor R35 in parallel. Accordingly, the state is equivalent to that wherein the resistor whose resistance is r/2 is connected between the terminal IN and the common node of the analog switch circuits SW21 to SW34.

With this, when the discrete value of the counter 37 changes as 0, 1, 2, . . . , 28, 29, 30, 31, the resistance of the feedback resistor changes as 15r, 14.5r, 14r, . . . , 0.5r, 0.0. Although as the circuit scale of the feedback resistor, only one resistor, one analog switch circuit, and one terminal are added, it is clear that the step number is approximately doubled compared with the circuit shown in FIG. 17A.

Figure 34:
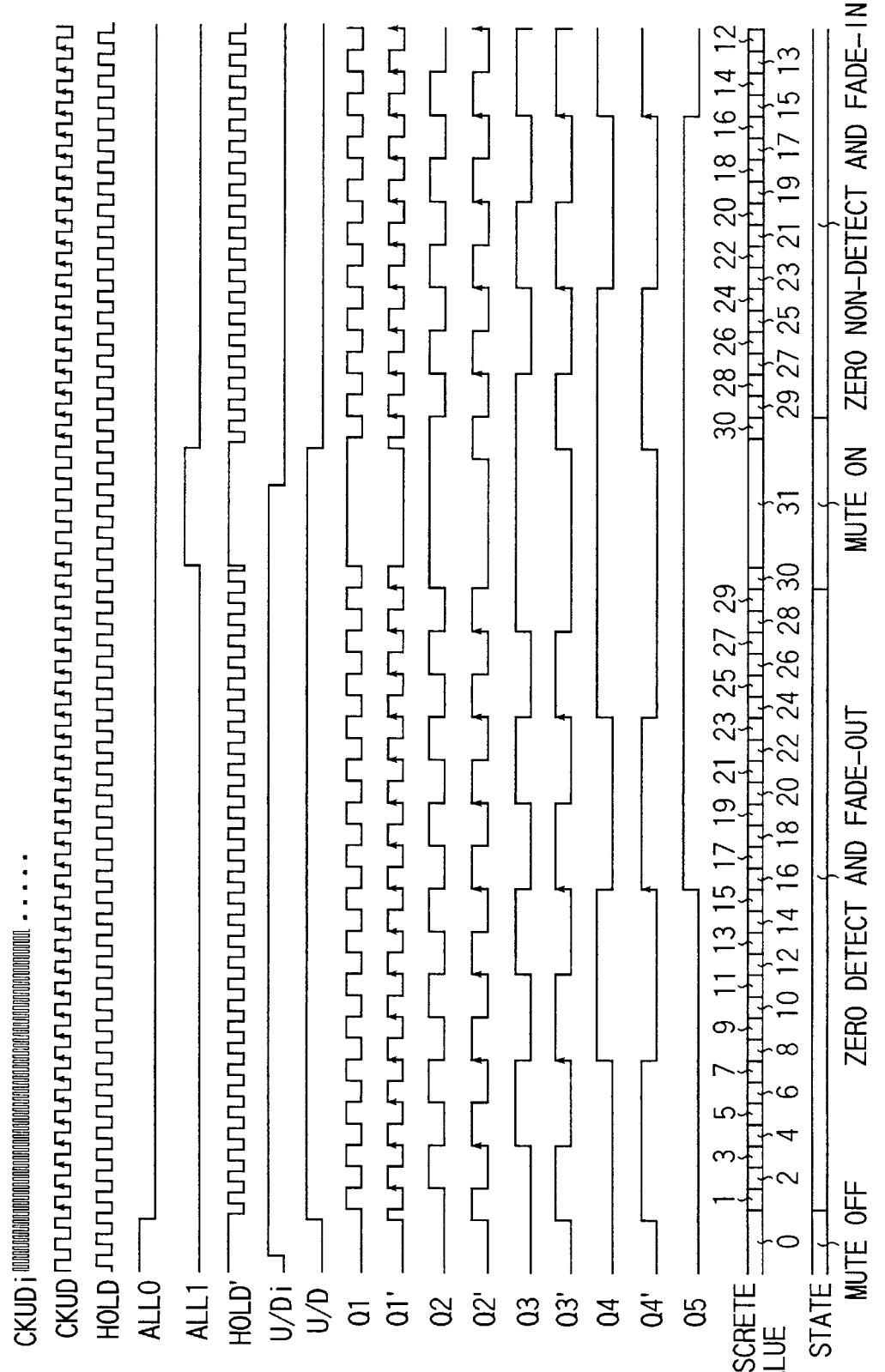
FIG. 34 is a timing chart for explaining about operations of the circuit shown in FIG. 28.
Figure 35:
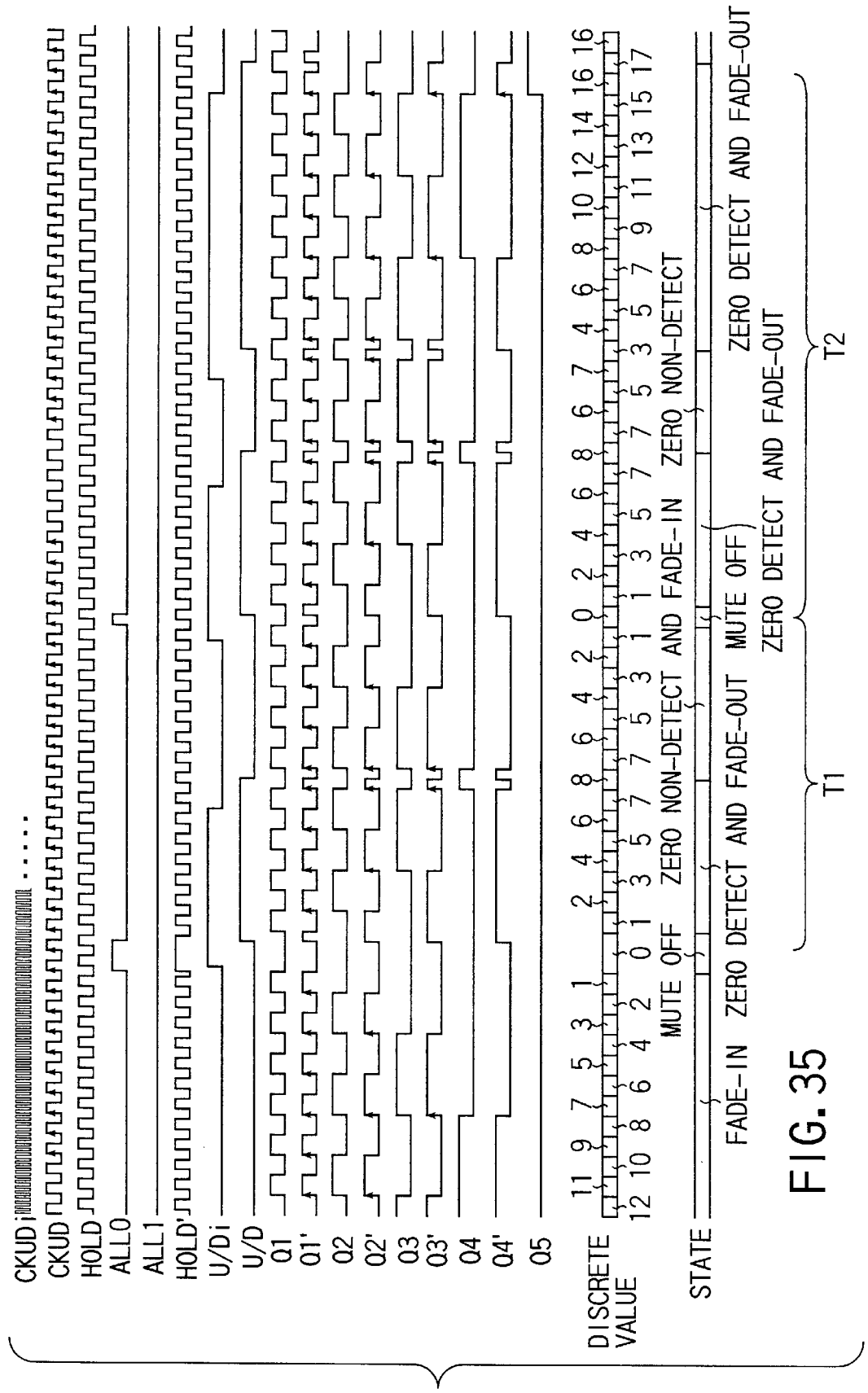
FIG. 35 is a timing chart for explaining about operations of the circuit shown in FIG. 28.

Respective FIGS. 34 and 35 are timing charts for explaining about the operations of the circuit shown in FIG. 28. Here, the operations of the zero detect mute circuit 226 and the 5-bit U/D counter 237 are mainly paid attention.

When the discrete value of the up/down counter 237 is in 0 state, the resistance Rmt of the variable resistor circuit 236 is 15r, being in normal state.

When the input to the DAC is zero data for a constant period of time, the output signal ZD of the zero detect circuit 226 goes to "H" level, that is, the input terminal U/Di of the up/down counter 237 becomes "H" level. When the input terminal U/Di becomes "H" level, this counter 237 starts the up-count operation so that the discrete value of the counter 237 increases as 1, 2, 3, . . . , in a count up condition. In accordance with this, the switch control signals S1, S2, S3, . . . of the decoder 238 sequentially go to "H" level, and the analog switch circuits SW21, SW22, SW23, . . . responding thereto are sequentially turned on.

At this time, the analog switch circuit SW36 is repeating on/off according as the discrete value of the counter 237 is an even number or an odd number. Therefore, during the period in which the respective analog switch circuit SW21, SW22, SW23, . . . are in ON state, the combined resistance by the resistors R35, R36 connected in parallel repeats r and r/2 alternately.

Thus, the resistance Rmt of the variable resistor circuit 236 decreases as 15r, 14.5r, 14r, 13.5r, 13r, . . . . Then, finally, the switch control signal S15 goes to "H" level, and the variable resistor circuit 236 goes to a short-circuited condition (the condition of the counter is 30, 31) to be mute ON.

When the DAC input is not zero data any more, the signal ZD immediately goes to "L" level, that is, the input terminal U/Di of the up/down counter 237 becomes "L" level. When the input terminal U/Di becomes "L" level, the up/down counter 237 starts the down-count operation so that the discrete value of the counter decreases as 30, 29, 28, . . . . In accordance with this, the switch control signals S14, S13, S12, outputted from the decoder 238 sequentially go to "H" level, and the analog switch circuits SW34, SW33, SW32, . . . responding thereto become turned on. At this time also, since the analog switch circuit SW36 repeats on/off according as the discrete value of the counter 237 is an even number or an odd number, during the period in which the respective analog switch circuit SW21, SW22, SW23, . . . are in ON state, the combined resistance by the resistors R35, R36 connected in parallel repeats r and r/2 alternately.

With this, the resistance Rmt of the variable resistor circuit 236 increases as 0.5r, 1.0r, 1.5r, 2.0r, 2.5r, . . . . Then, finally, the discrete value of the counter 237 becomes 0, and all analog switch circuits SW21 to SW36 become the OFF state. Thus, the resistance Rmt of the variable resistor circuit 236 becomes 15.0r of the normal time so as to be mute OFF.

As shown in a period T1 of FIG. 35, when the number of continuous zero data is small and the DAC input is not zero data any more before the discrete value of the counter 237 reaches 31, from that point, the down count operation is performed. Thus, since the state becomes from a fade-out state to a fade-in state, it does not become mute ON.

As shown in a period T2, after the period where the number of continuous zero data is small and the DAC input is not zero data any more before the discrete value of the counter 37 reaches 31 so that the down count operation is performed, when zero data are detected again, the state repeats from a fade-out state to a fade-in state, and to the fade-out state.

By the structure as described above, the step number through which the resistance of the feedback resistor is changed by equivalently can be increased while restraining increases in the circuit scales of the variable resistor circuit (feedback resistor) 236, the counter 237, and the decoder 238 to the minimum. With this, an efficient mute circuit with a less click sound can be constituted at a low cost.

Figure 36:
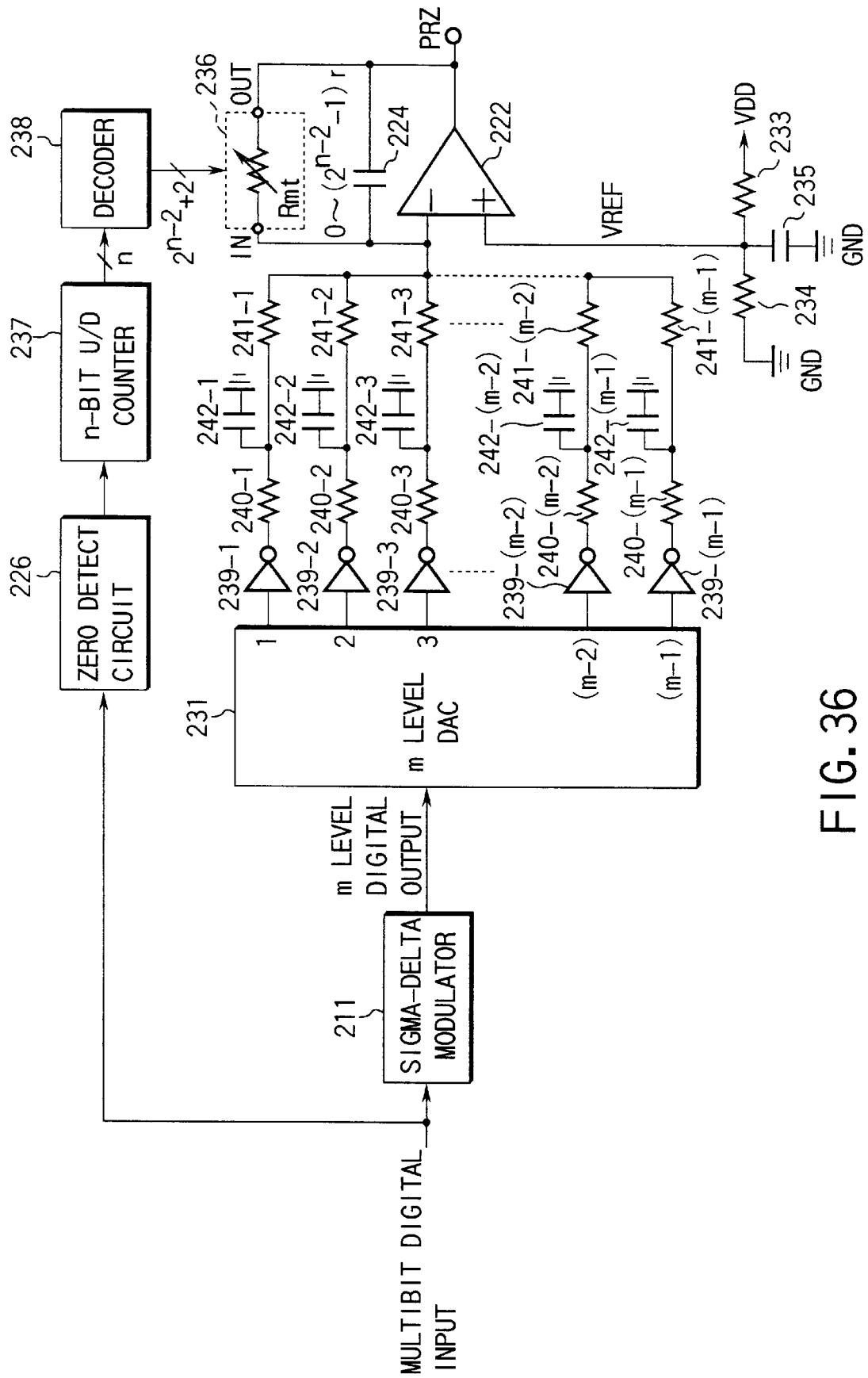
FIG. 36 is a circuit diagram showing another structural example of the output circuit section in the DAC shown in FIG. 27.

FIG. 36 is a circuit diagram showing another structural example of the output circuit section in the DAC shown in FIG. 27. Although the m level DAC 231 outputs an m level DC value in the circuit shown in FIG. 27, the m level DC value is outputted from the output terminal of the op-amp 222 in the circuit shown in FIG. 36 since the output level of the same number of inverters as that of the digital inputs become "L" level ("H" level depending on the situation).

In FIG. 36, like reference numerals are attached to like structural sections that are similar to those in FIG. 27, and detailed explanation are omitted therefor. First to (m−1)th output terminals of the m level DAC 231 are connected to the input terminals of inverters 239-1 to 239-(m−1), respectively. The output terminals of these inverters 239-1 to 239-(m−1) are connected to one ends of resisters 240-1 to 240-(m−1), respectively. The other ends of the resistors 240-1 to 240-(m−1) are connected to one ends of resistors 241-1 to 241-(m−1). The other ends of these resistors 241-1 to 241-(m−1) are commonly connected to the inverting input terminal (−) of the op-amp 222. Capacitors 242-1 to 242-(m−1) are connected between the respective nodes of the resistors 240-1 to 240-(m−1) and the resistors 241-1 to 241-(m−1) and ground point GND.

Figures 37, 38:
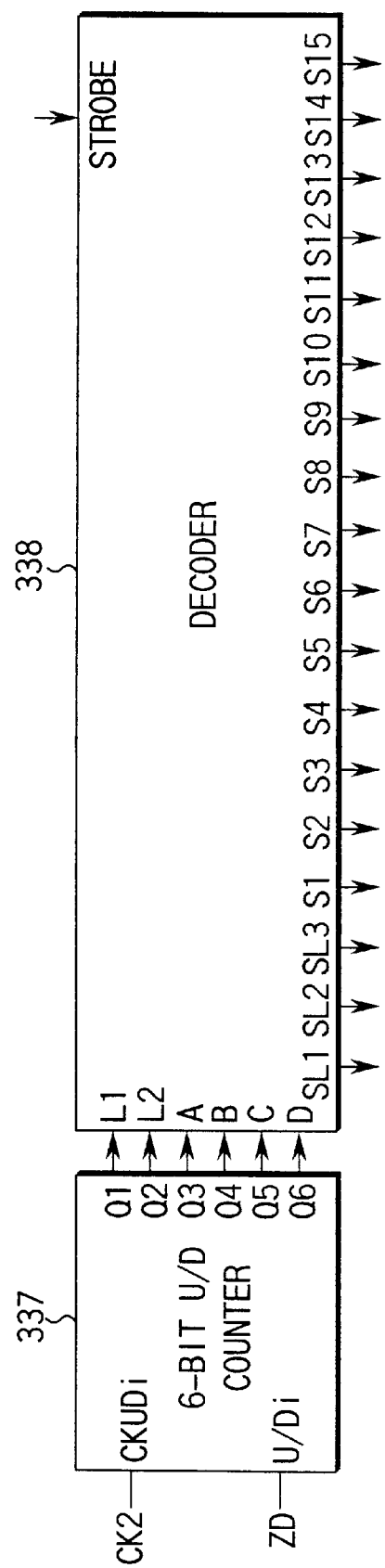
FIG. 37 is a truth table for explaining about operations of the circuit shown in FIG. 36.
FIG. 38 is for explaining about a D/A converter according to the second embodiment of the present invention and is a circuit diagram extracting and showing the counter and the decoder.

In the structure described above, the output levels of the respective inverters 239-1 to 239-(m−1) ("H" level/"L" level) are decided responding to the digital inputs as shown in FIG. 37.

Even this structure basically performs similar operations to those of the circuit shown in FIG. 27. While increases of the circuit scales of the variable resistor circuit (feedback resistor) 236, the counter 237, and the decoder 238 are restrained to a minimum, the step number through which the resistance of the feedback resistor is changed equivalently can be increased, whereby an efficient mute circuit with a less click sound can be constituted at a low cost.

In the circuit shown in FIG. 36, the case is exemplified and is explained for the sake of simplification of the explanation wherein the inverters which become "L" level responding to the respective digital inputs have already been decided. However, the example should not be limited to this, and there is no problem in randomly choosing the inverters if the number of inverters which become "L" level corresponding to the respective digital inputs match.

[Second Embodiment]

In the first embodiment described above, the case is explained wherein the resistance of the feedback resistor (variable resistor circuit) is changed 0 to 15r by r/2 so as to perform mute on/off. On the other hand, in this second embodiment, the resistance is changed by r/4.

The entire circuit of a DAC in this second embodiment is similar to that of FIG. 28.

FIG. 38 is for explaining about a D/A converter according to the second embodiment of the present invention and extracts and shows a counter and a decoder. The counter 337 is 6-bit structured and is provided with a clock input terminal CKUDi, an input terminal U/Di to which the detect signal ZD for zero data is supplied, and output terminals Q1 to Q6.

The output signals Q1, Q2, Q3, Q4, Q5, Q6 of the 6-bit up/down counter 337 and a strobe signal STROBE are supplied to a decoder 338, and the decoder 338 outputs switch control signals S1 to S15, SL, SL2, SL3 for stepwise controlling the resistance Rmt of a variable resistor circuit 336.

Figure 39:
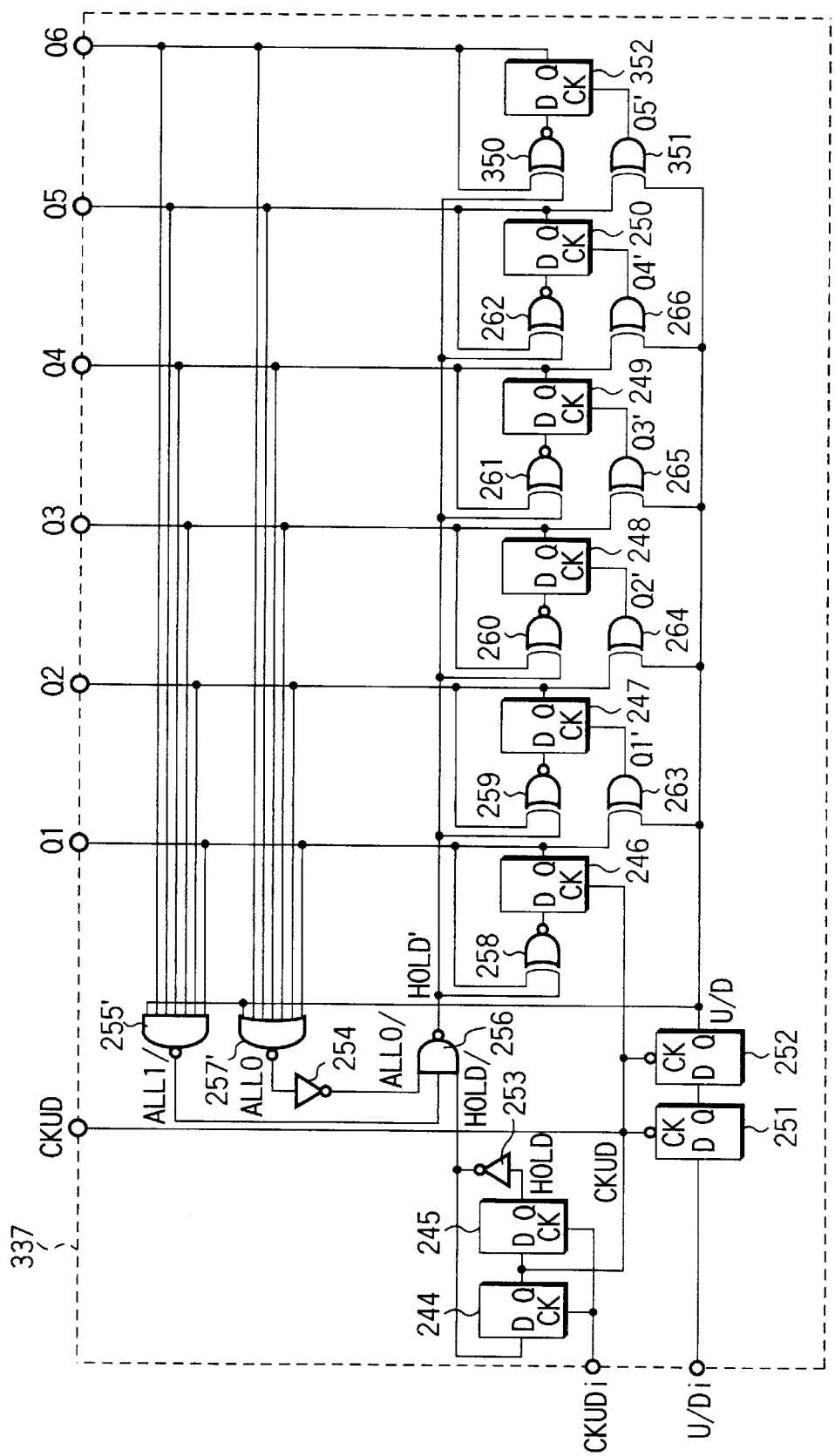
FIG. 39 is a circuit diagram showing a structural example of the counter shown in FIG. 38.

FIG. 39 is a circuit diagram showing a concrete structural example of the counter 337 shown in FIG. 38. The circuit shown in FIG. 39 is the one in which the circuit shown in FIG. 30 is extended from 5-bit to 6-bit, and like reference numerals are attached to like structural sections to omit the detailed explanation thereof since basically similar operations are performed in the similar circuit structure.

That is, the counter 337 is the one in which an exclusive OR gate 350, an exclusive NOR gate 351, a flip-flop 352 are added to the counter 237 shown in FIG. 30, and a NAND gate 255' and a NOR gate 257' are made 7 inputs.

One side input terminal of the exclusive NOR gate 350 is connected to the output terminal of the NAND gate 256 so that a signal HOLD' is supplied thereto, and the output terminal is connected to the data input terminal D of the flip-flop 352. The output terminal Q of this flip-flop 352 is connected to the other side input terminal of the exclusive NOR gate 350, the output terminal Q6, the seventh input terminal of the NAND gate 255', and the seventh input terminal of the NOR gate 257', respectively. One side input terminal of the exclusive OR gate 351 is connected to the output terminal Q of the flip-flop 250, and the other side input terminal is connected to the output terminal Q of the flip-flop 252 so that a signal U/D is supplied thereto. The output terminal of this exclusive OR gate 351 is connected to the clock input terminal CK of the flip-flop 352 so that a signal Q5' is supplied.

Figure 40:
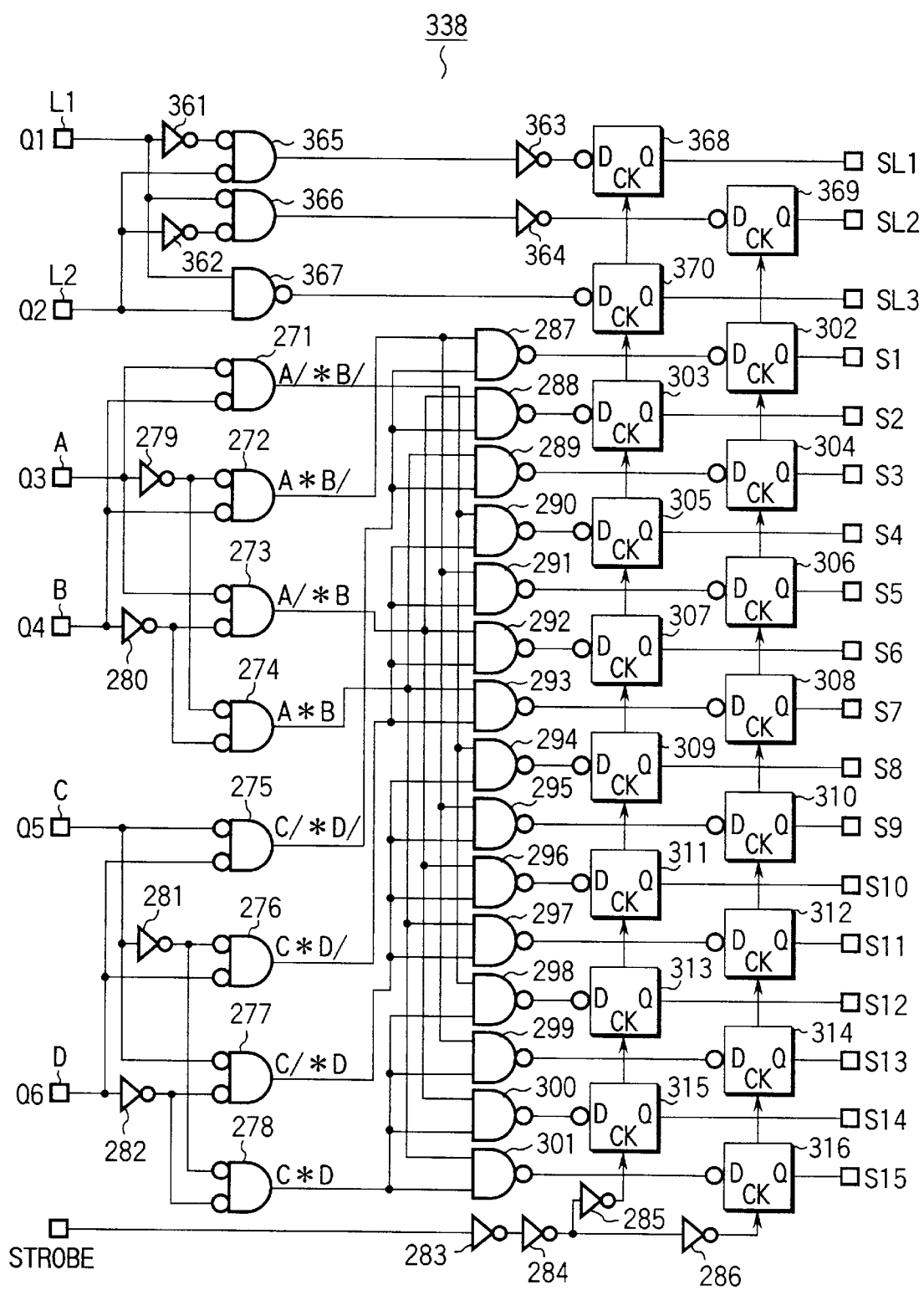
FIG. 40 is a circuit diagram showing a concrete structural example of the decoder shown in FIG. 38.

FIG. 40 is circuit diagram showing a concrete structural example of the decoder 338 shown in FIG. 38. This decoder 338 is the one in which inverters 361 to 364, AND gates 365, 366, a NAND gate 367, and flip-flops 368, 369, 370 are provided instead of the inverter 269 and the flip-flop 270 in the decoder 238 shown in FIG. 31. Since other circuit sections have substantially similar circuit structure, like reference numerals are attached to like sections to omit the detailed explanation thereof.

The output terminal Q1 of the counter 337 is connected to the input terminal of the inverter 361, one side input terminal of the AND gate 366, and one side input terminal of the NAND gate 367, respectively, so that a signal L1 is supplied. Here, the signal L1 is inverted and is supplied to the AND gate 366. The output terminal Q2 of the counter 337 is connected to one side input terminal of the AND gate 365, the input terminal of the inverter 362, and the other side input terminal of the NAND gate 367, respectively, so that a signal L2 is supplied. Here, the signal L2 is inverted and is supplied to the AND gate 365.

The output terminal of the inverter 361 is connected to the other side input terminal of the AND gate 365, and the output terminal of the inverter 362 is connected to the other side input terminal of the AND gate 366. The output signals of the respective inverters 361, 362 are inverted and are supplied to the AND gates 365, 366. The output terminal of the AND gate 365 is connected to the input terminal of the inverter 363, and the output terminal of the AND gate 366 is connected to the input terminal of the inverter 364. The output terminals of these inverters 363, 364 are connected to the data input terminals D of the flip-flops 368, 369, respectively, and the output signals of the respective inverters 363, 364 are inverted and are inputted. The output terminal of the NAND gate 367 is connected to the data input terminal D of the flip-flop 370, and the output signal of this NAND gate 367 is inverted and is inputted.

The output signal of the inverter 285 is supplied to the clock input terminals CK of the respective flip-flops 368, 370, and the output signal of the inverter 286 is supplied to the clock input terminal CK of the flip-flop 369. Signals SL1, SL2, SL3 are outputted from the data output terminals Q of the respective flip-flops 368, 369, 370.

FIG. 41 is a view showing truth table for explaining about operations of the decoder 338 shown in FIG. 40. The switch control signals S1 to S15 selectively go to "H" level in accordance with combinations of the levels of the input signals A, B, C, D. Here, the switch control signal SL1, SL2, SL3 take four states wherein all are at "L" level, or any one is at "H" level one after another during the period where the respective switch control signals S1 to S15 are at "H" level. With this, the resistance Rmt of the variable resistor circuit 236 changes stepwise in the range of 0 to 15r by r/4.

Figures 42A, 42B:
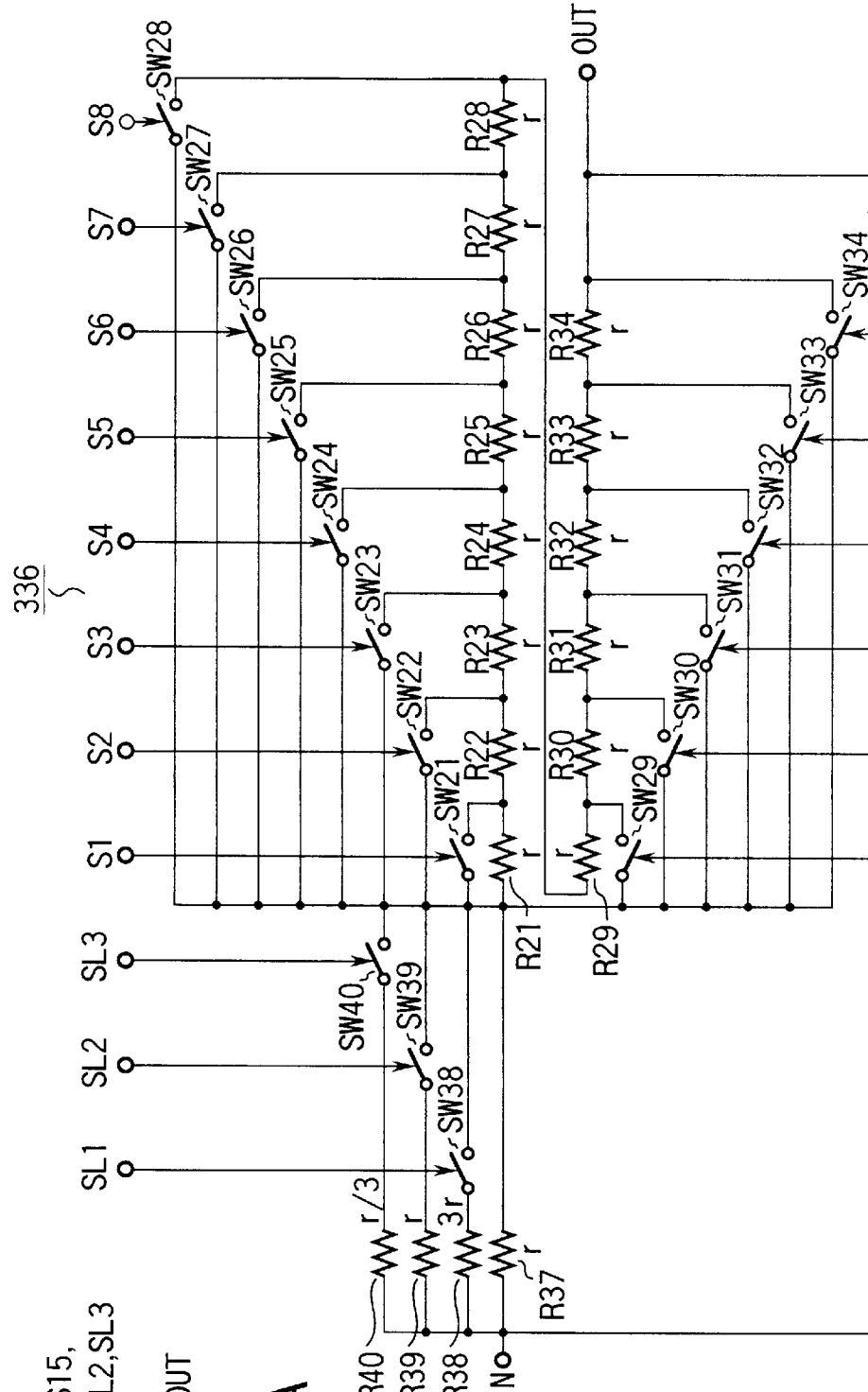
FIG. 42A is for explaining about another structural example of a variable resistor circuit and is the symbol diagram thereof.
FIG. 42B is a circuit diagram showing a concrete circuit structure of the variable resistor circuit shown in FIG. 42A.

Respective FIG. 42A and 42B show another structural example of the feedback resistor (the variable resistor circuit). FIG. 42A is a symbol diagram, and FIG. 42B is a circuit diagram showing a concrete circuit structure. As shown in FIG. 42B, a circuit section composed of resistors R21 to R34 and analog switch circuits SW21 to SW35 (SW21 to SW34: first digital control switch group, SW35: third digital control switch) has the same structure as the circuit shown in FIG. 33. In this variable resistor circuit 336, resistors R37 to R40 whose respective resistances are r, 3r, r, r/3 are connected in parallel between the terminal IN and a common node of the analog switch circuits SW21 to SW34, and the respective analog switches SW38 to SW40 (second digital control switch group) lie between the resistors R37 to R39 and the common node of the analog switch circuits SW21 to SW34. These analog switch circuits SW38 to SW40 are selectively on/off controlled by the switch control signals SL1, SL2, SL3, respectively.

The switch control signals SL1, SL2, SL3 are generated based on the LSB of the counter 337 and a bit signal of one upper thereof. The resistance between the terminal IN and the common node of the analog switch circuits SW21 to SW34 controlled by the switch control signals S1 to S14 becomes r since the analog switch circuits SW38 to SW40 are all in OFF state when the LSB of the counter 337 and one upper bit thereof are "00." The resistance becomes 3r/4 at the time of "10" since the analog switch circuit SW38 becomes ON state and the analog switch circuit SW39, SW40 become OFF state. The resistance becomes r/2 at the time of "01" since the analog switch circuit SW39 becomes ON state and the analog switch circuits SW38, SW40 become OFF state. Further, the resistance becomes r/4 at the time of "11" since the analog switch circuit SW40 becomes ON state and the analog switch circuits SW38, SW39 become OFF state.

Figure 17:
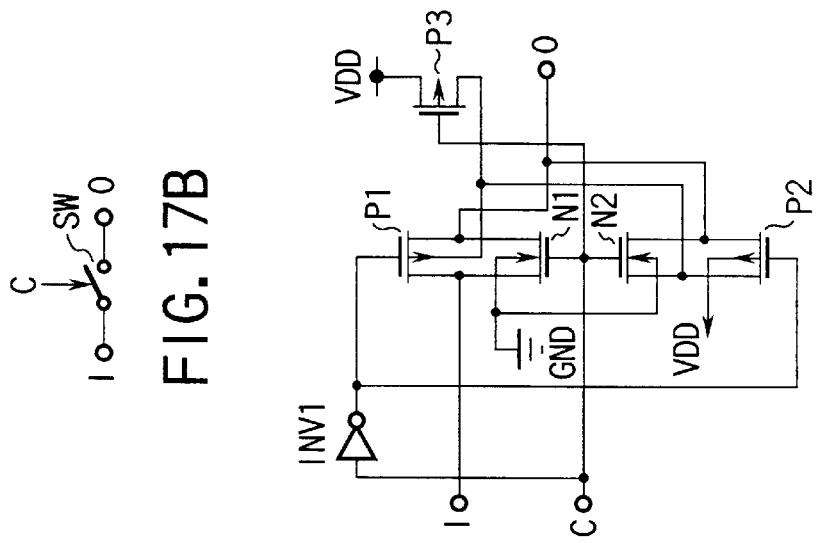
FIG. 17A is a circuit diagram showing a concrete structural example of the variable resistor circuit (feedback resistor) in the circuit shown in FIG. 11.
FIG. 17B is a symbol diagram of the analog switch circuit in the circuit shown in FIG. 17A.
FIG. 17C is a circuit diagram showing a detailed structural example of the analog switch circuit shown in FIG. 17B.
Figure 18:
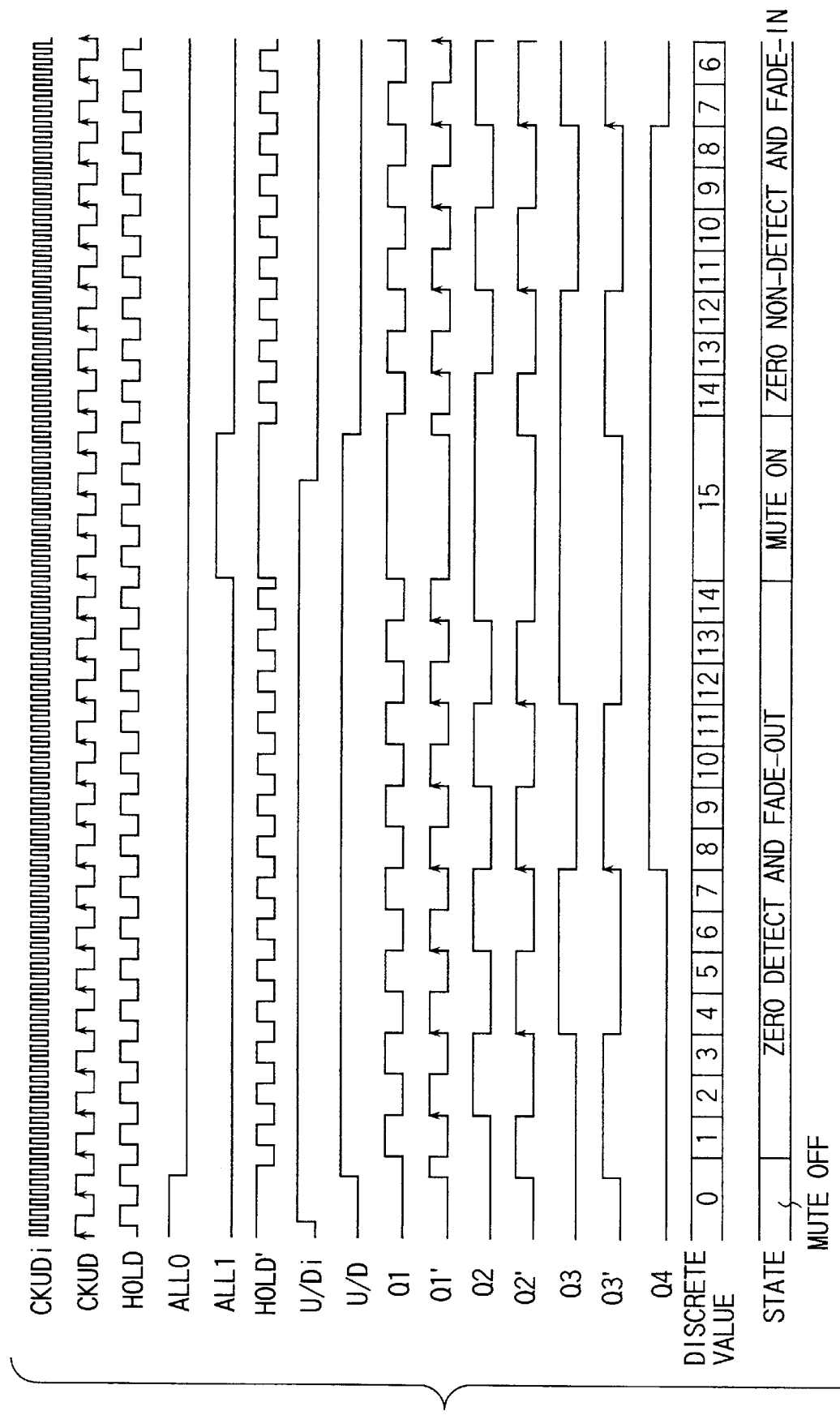
FIG. 18 is a timing chart for explaining operations of the circuit shown in FIGS. 11 to 17.
Figure 19:
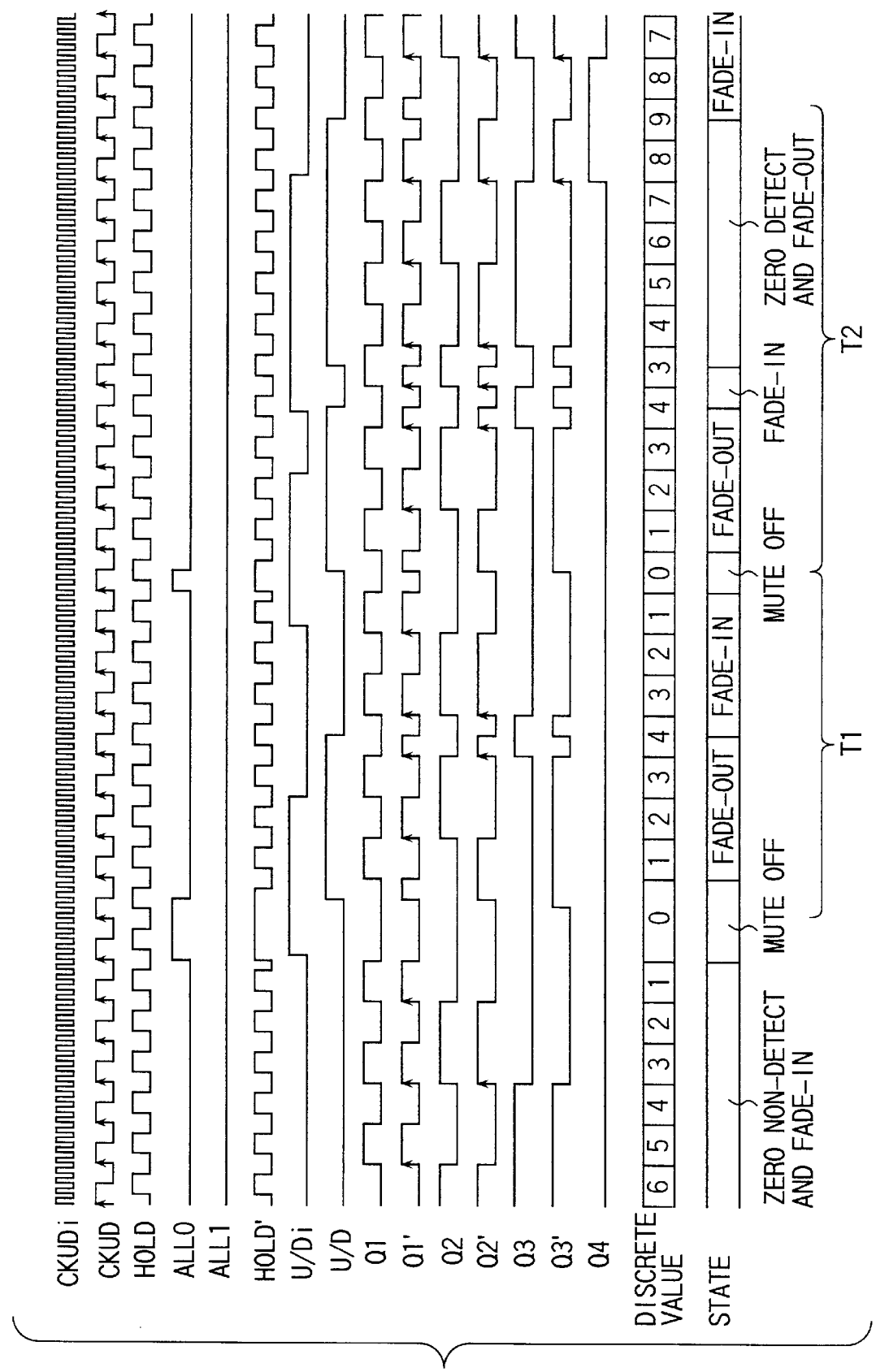
FIG. 19 is a timing chart for explaining operations of the circuit shown in FIGS. 11 to 17.

With this, when the discrete value of the counter 337 changes as 0, 1, 2, . . . , 58, 59, 60, 61, 62, 63, the feedback resistance changes as 15r, 14.75r, 14.5r, . . . , 0.5r, 0.25r, 0 while showing that the step number is approximately quadrupled compared with the circuit shown in FIG. 17A. Here, as the circuit scale of the variable resistor circuit (feedback resistor) 336, the numbers of resistors and analog switch circuits are increased only by three, respectively, and the number of terminals is increased only by three.

[Third Embodiment]

Figure 43A:
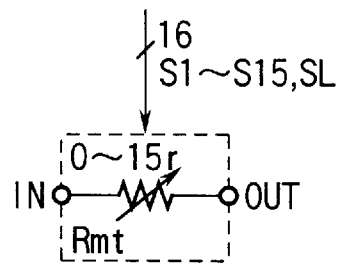
FIG. 43A is for explaining about a variable resistor circuit and a D/A converter according to the third embodiment of the present invention and is a symbol diagram of the variable resistor circuit.
Figure 43B:
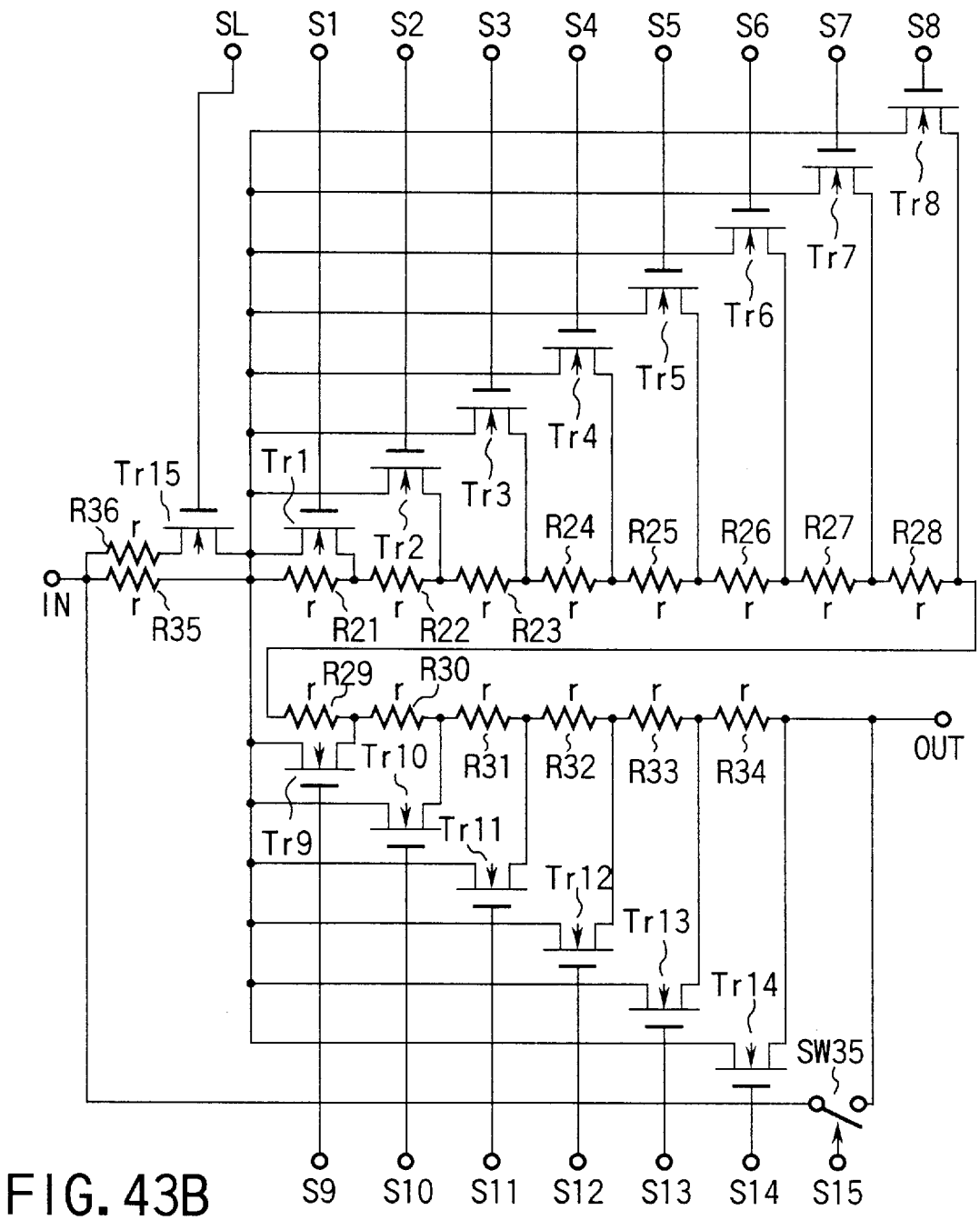
FIG. 43B is a circuit diagram showing a concrete circuit structure of the variable resistor circuit shown in FIG. 43A.

Respective FIGS. 43A and 43B are for explaining about a variable resistor circuit and a D/A converter according to the third embodiment of the present invention and show further another structural example of a feedback resistor (variable resistor circuit). FIG. 43A is a symbol diagram, and FIG. 43B is a circuit diagram showing a concrete circuit structure. The entire circuit of the DAC is similar to that of FIG. 28. This circuit is provided with respective N channel MOS transistors Tr1 to Tr15 (Tr1 to Tr14: first digital control switch group, Tr15: second digital control switch) instead of the analog switch circuits SW21 to SW34, SW36 in the circuit shown in FIG. 33 so as to supply switch control signals S1 to S14, SL to the gates to perform on/off control. For the analog switch circuit SW35 (third digital control switch) for making the feedback resistor zero, a circuit in which P channel MOS transistors and N channel MOS transistors are combined as shown in FIG. 17C or FIG. 23B is employed.

As well known, the ON resistance of a MOS transistor is nonlinear, and thus deformation normally occurs in the output signal when this type of usage is employed. However, in the present circuit, taking into account the fact that the switch is turned on only when the input of the DAC is zero data and the ON time is very short and transitional, such simplified switch is employed. With this, the circuit scale of the variable resistor circuit can be miniaturized.

Since the analog switch circuit SW35 is not turned on transitionally but becomes ON state continuously during mute, the circuit in which P channel MOS transistors and N channel MOS transistors are combined is employed in order to prevent a DC potential from being generated by the nonlinearity, for example, in a case in which noise occurs.

Needless to say, P channel MOS transistors may be provided instead of the N channel MOS transistors Tr1 to Tr15. In this case, the respective switch control signals S1 to S14, SL may be inverted and supplied to the gates.

[Fourth Embodiment]

Figures 44A, 44B:
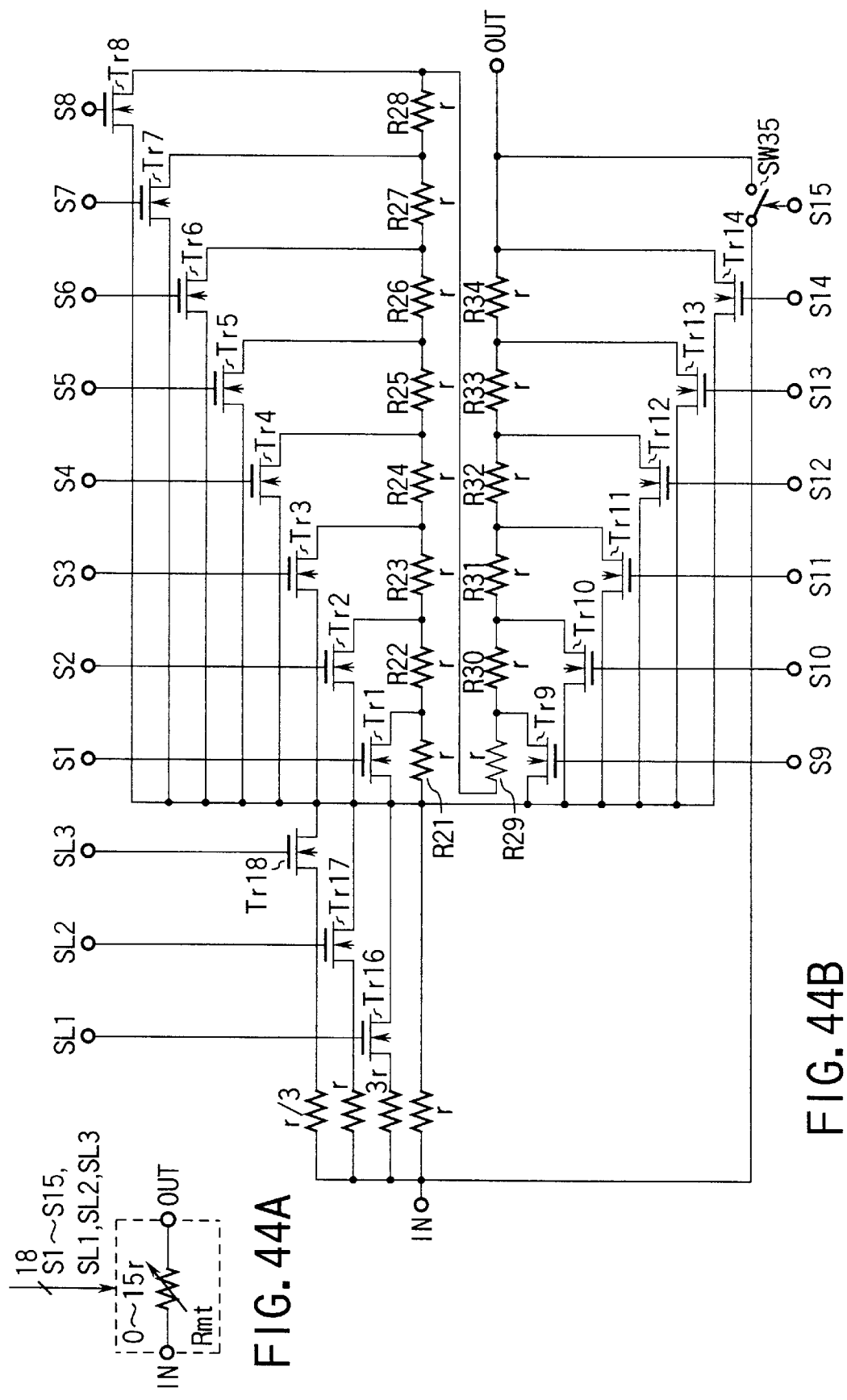
FIG. 44A is for explaining about a variable resistor circuit and a D/A converter according to the fourth embodiment of the present invention and is a symbol diagram of the variable resistor circuit.
FIG. 44B is a circuit diagram showing a concrete circuit structure of the variable resistor circuit shown in FIG. 44A.

Respective FIGS. 44A and 44B are for explaining about a variable resistor circuit and a D/A converter according to the fourth embodiment of the present invention and show another structural example of the feedback resistor (variable resistor circuit). FIG. 44A is a symbol diagram, and FIG. 44B is a circuit diagram showing a concrete circuit structure. The entire circuit of a DAC is similar to that of FIG. 28. This circuit is provided with respective N channel MOS transistors Tr1 to Tr14, Tr16, Tr17, Tr18 (Tr1 to Tr14: first digital control switch group, Tr16, Tr17, Tr18: second digital control switch group) instead of the analog switch circuits SW21 to SW34, SW38, SW39, SW40 in the circuit shown in FIG. 42B, so as to perform on/off control by supplying the switch control signals S1 to S14, SL1, SL2, SL3 to the gates. As the analog switch circuit SW35 (third digital control switch) for making the feedback resistor zero, a circuit in which P channel MOS transistors and N channel MOS transistors are combined as shown in FIG. 17C or FIG. 23B is employed.

As described above, the ON resistance of a MOS transistor is nonlinear, and thus deformation normally occurs in the output signal when this type of usage is employed. However, in the present circuit, taking into account the fact that the switch is turned on only when the input of the DAC is zero data and the ON time is very short and transitional, such simplified switch is employed. With this, the circuit scale of the variable resistor circuit can be miniaturized.

Since the analog switch circuit SW35 is not turned on transitionally but becomes ON state continuously during mute similar to the circuit shown in FIG. 43B, the circuit in which P channel MOS transistors and N channel MOS transistors are combined is employed in order to prevent a DC potential from being generated by the nonlinearity, for example, in a case in which noise occurs.

Also, in the circuit shown in FIG. 44B, needless to say, P channel MOS transistors may be provided instead of the N channel MOS transistors Tr1 to Tr14, Tr16, Tr17, Tr18. In this case, the respective switch control signals S1 to S14, SL1, SL2, SL3 may be inverted and supplied to the gates.

[Fifth Embodiment]

In the variable resistor circuits and the D/A converters in the first to fourth embodiments described above, since parasitic capacitances exist between the gates and the sources or the drains of the MOS transistors constituting the analog switch circuit, there is a possibility that when the switch control signal is inputted to the gate, noise at the time of change of the switch control signal may be injected to the inverting input terminal (−) of the op-amp through this parasitic capacitance so as to generate a click noise.

Therefore, in the D/A converter according to this fifth embodiment of the present invention, the noise of the time of change of the switch control signal is offset by providing an analog switch circuit of a dummy so as to perform on/off control, thereby restraining the click noise.

Figure 45:
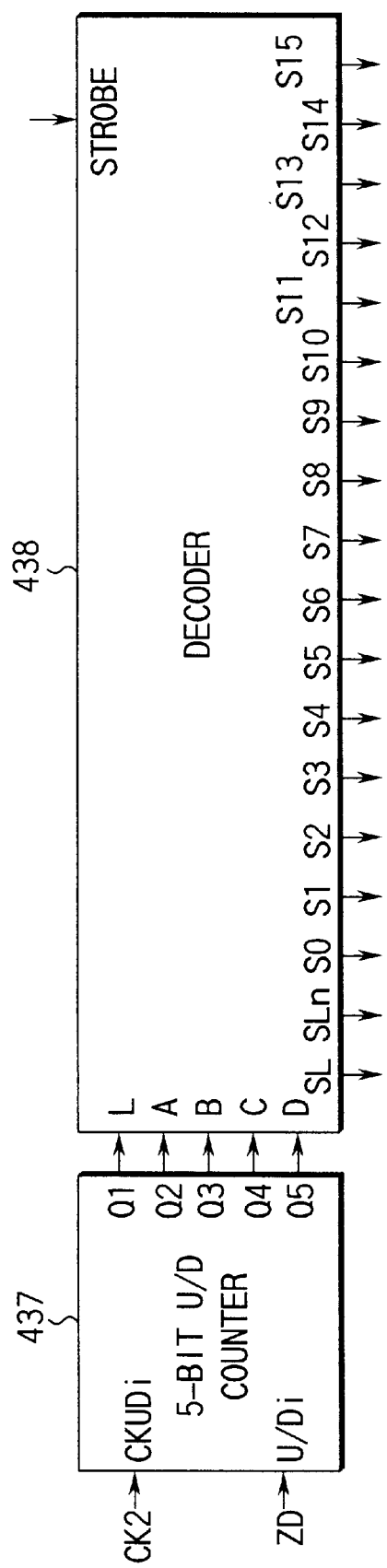
FIG. 45 is for explaining about a D/A converter according to the fifth embodiment of the present invention and is a block diagram extracting and showing the counter and the decoder.

FIG. 45 is for explaining about the D/A converter according to the fifth embodiment of the present invention and is a block diagram extracting and showing a counter and a decoder. The counter 437 is provided with a clock input terminal CKUDi, an input terminal U/Di to which the detect signal ZD of zero data is supplied, and the output terminals Q1 to Q5. This counter 437 has a substantially similar structure to the 5-bit U/D counter 237 shown in FIG. 30.

The output signals Q1, Q2, Q3, Q4, Q5 of the 5-bit up/down counter 437 and the strobe signal STROBE are supplied to the decoder 438. This decoder 438 outputs switch control signals S0 to S15, SL, SLn (SLn is the inverted signals of the SL) for stepwise controlling the resistance Rmt of the variable resistor circuit 436 while restraining the occurrence of the click noise.

Figure 46:
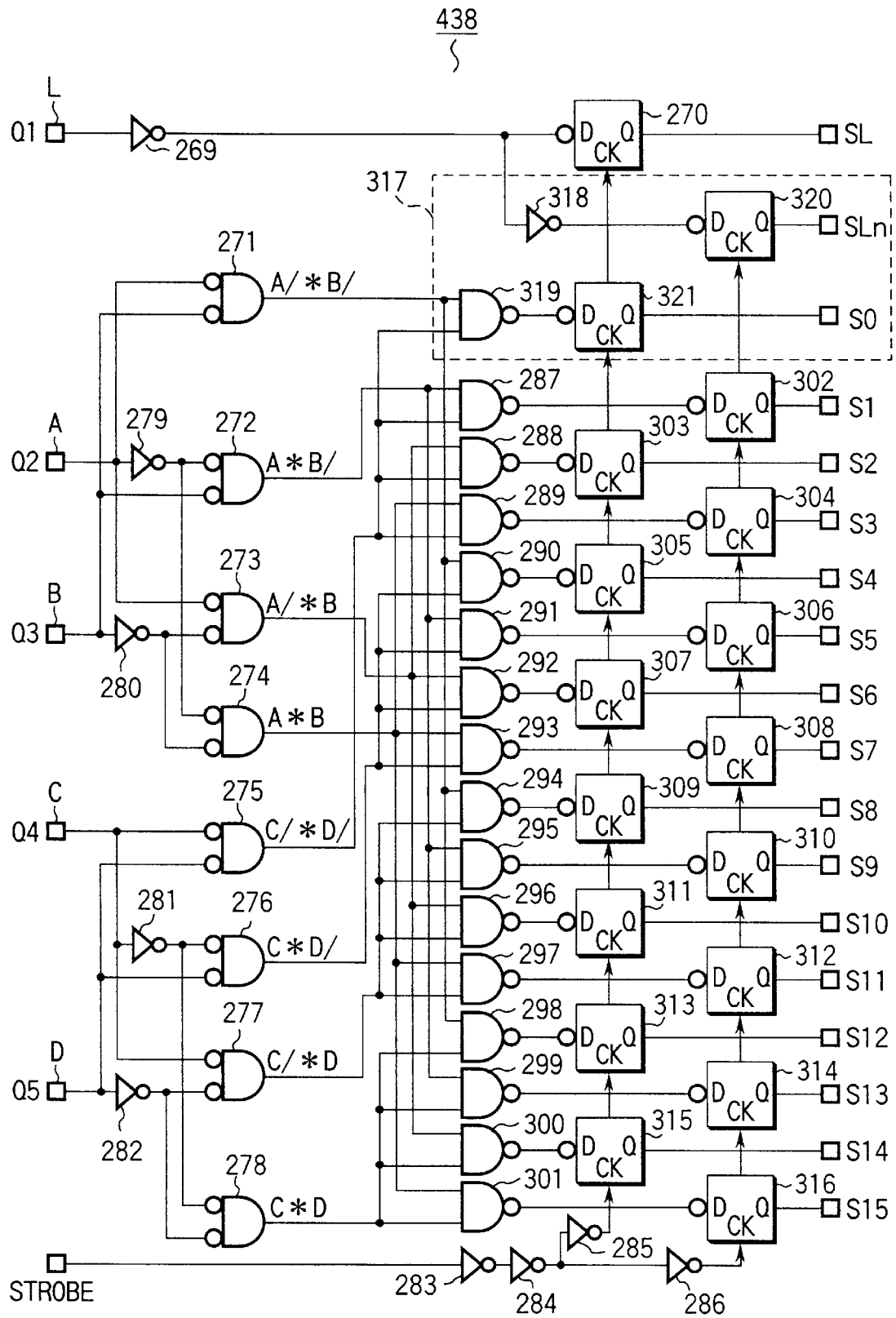
FIG. 46 is a circuit diagram showing a concrete structural example of the decoder in the circuit shown in FIG. 45.

FIG. 46 is a circuit diagram showing a concrete structural example of the decoder 438 in the circuit shown in FIG. 45. This decoder 438 is provided with an inverter 318, a NAND gate 319, flip-flops 320, 321 as shown by enclosing broken lines 317 in addition to the circuit shown in FIG. 31. Since other circuit sections have substantially similar circuit structure, like reference numerals are attached to like sections, and detailed explanation are omitted therefor.

That is, the input terminal of the inverter 318 is connected to the output terminal of the inverter 269, and the output terminal is connected to the data input terminal D of the flip-flop 320. Here, the output signal of the inverter 318 is inverted and is supplied to the flip-flop 320. One side input terminal of the NAND gate 319 is connected to the output terminal of the AND gate 271, other side input terminal is connected to the output terminal of the AND gate 275, and the output terminal is connected to the data input terminal D of the flip-flop 321. Here, the output signal of the NAND gate 319 is inverted and is supplied to the flip-flop 321. The output signal of the inverter 285 is supplied to the clock input terminal CK of the flip-flop 321, and the output signal of the inverter 286 is supplied to the clock input terminal CK of the flip-flop 320. The switch control signals SLn, S0 are outputted from the data output terminals Q of the flip-flops 320, 321, respectively.

FIG. 47 is for explaining about operations of the decoder 438 shown in FIG. 46 and is a view showing truth table. The switch control signals S0 to S15 selectively go to "H" level in accordance with combinations of the levels of the input signals L, A, B, C, D. Here, the switch control signal SL alternately repeats "L" level and "H" level states during the period where the respective switch control signals S0 to S15 are at "H" level. With this, the resistance Rmt of the variable resistor circuit 236 changes stepwise in the range of 0 to 15r by r/2.

Figures 48A, 48B:
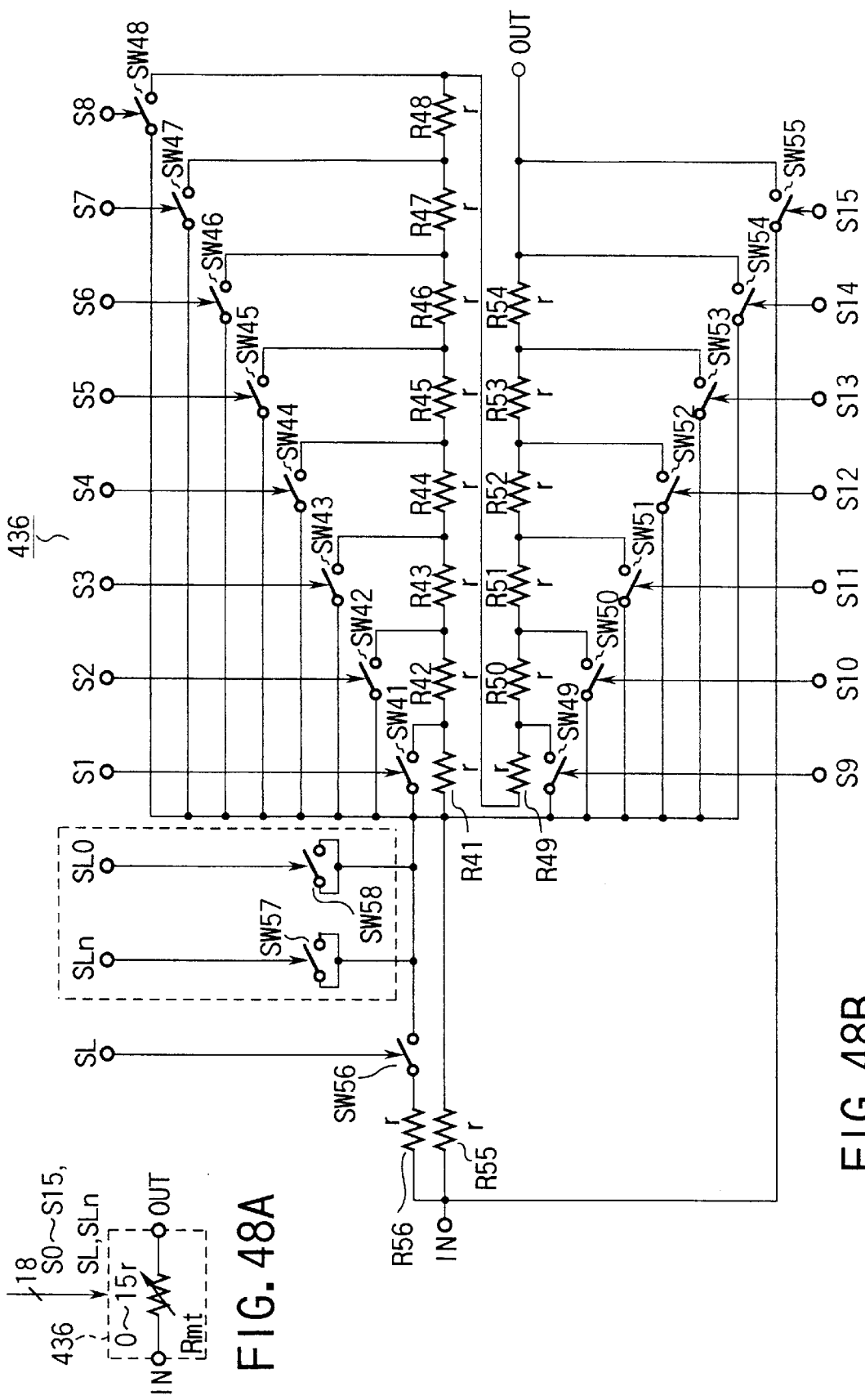
FIG. 48A shows another structural example of the variable resistor circuit and is the symbol diagram thereof.
FIG. 48B is a circuit diagram showing a concrete circuit structure of the variable resistor circuit shown in FIG. 48A.

Respective FIGS. 48A and 48B show a structural example of the feedback resistor (the variable resistor circuit) 436. FIG. 48A is a symbol diagram, and FIG. 48B is a circuit diagram showing a concrete circuit structure. The entire circuit of the DAC is similar to that of FIG. 28. This variable resistor circuit 436 is composed of resistors R41 to R56 each of whose resistance is r and analog switch circuits SW41 to SW58.

The resistors R55, R41 to R54 are connected in series between the inverting input terminal (−) and the output terminal of the op-amp 222. The current path of the analog switch circuit SW41 is connected between the node of the resistors R55 and R41 and the node of the resistors R41 and R42. The current path of the analog switch circuit SW42 is connected between the node of the resistors R55 and R41 and the node of the resistors R42 and R43. As the following, similarly, the current paths of the analog switch circuits SW43 to SW53 are connected between the node of the resistors R55 and R41 and the nodes of the resistors R43 to R54. The current path of the analog switch circuit SW54 is connected between the node of the resistors R55 and R41 and the terminal OUT. Further, the current path of the analog switch circuit SW55 is connected between the terminal IN and the terminal OUT. The switch control signals S1 to S15 outputted from the decoder 438 are supplied to the analog switch circuits SW41 to SW55, respectively, so as to selectively perform on/off control.

The resistor R56 and the analog switch circuit SW56 are connected in series between the terminal IN and the node of the resistors R55 and R41. The switch control signal SL outputted from the decoder 438 is supplied to the analog switch circuit SW56 so as to selectively perform on/off control. This switch control signal SL is a signal corresponding to the LSB of the counter 437, and when the discrete value of the counter is an even number, the analog switch circuit SW56 becomes OFF state so that the resistor R56 is cut off. On the other hand, when the value is an odd number, the analog switch circuit SW56 becomes ON state so that the resistor R56 is connected to the resistor R55 in parallel. Accordingly, the state is equivalent to that wherein the resistor whose resistance is r/2 is connected between the terminal IN and the common node of the analog switch circuits SW41 to SW54. With this, the feedback resistor of the op-amp 222 changes stepwise 0 to 15r by the resistance r/2.

Further, analog switch circuits SW57, SW58 are connected at the node of the resistors R55 and R41. These analog switch circuits SW57, SW58 are dummies for offsetting the changes of levels of the switch control signals mutually and for restraining the click noise. The analog switch circuit SW57 is on/off controlled by the switch control signal SLn, and the analog switch circuit SW58 is on/off controlled by the switch control signal S0.

The analog switch circuit SW57 is inverted from ON state to OFF state when the analog switch circuit SW56 is inverted from OFF state to ON state, and is inverted from OFF state to ON state when the circuit SW56 is inverted from ON state to OFF state. The analog switch circuit SW58 is inverted from OFF state to ON state when the analog switch circuit SW41 is inverted from ON state to OFF state, and is inverted from ON state to OFF state when the circuit SW41 is inverted from OFF state to ON state.

Figure 49:
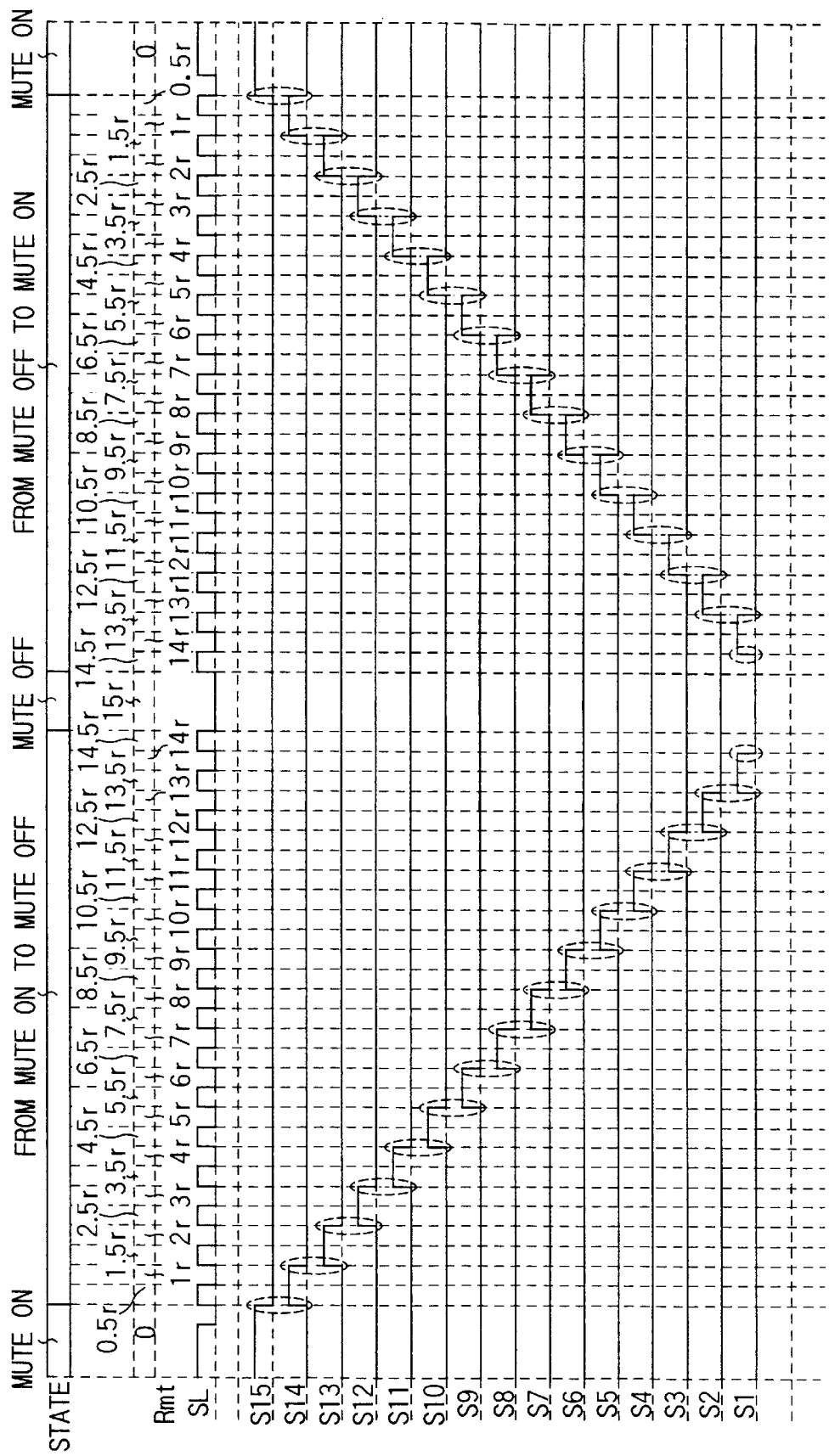
FIG. 49 is a timing chart for explaining about the occurrence of a click noise by operations of a variable resistor circuit.
Figure 50:
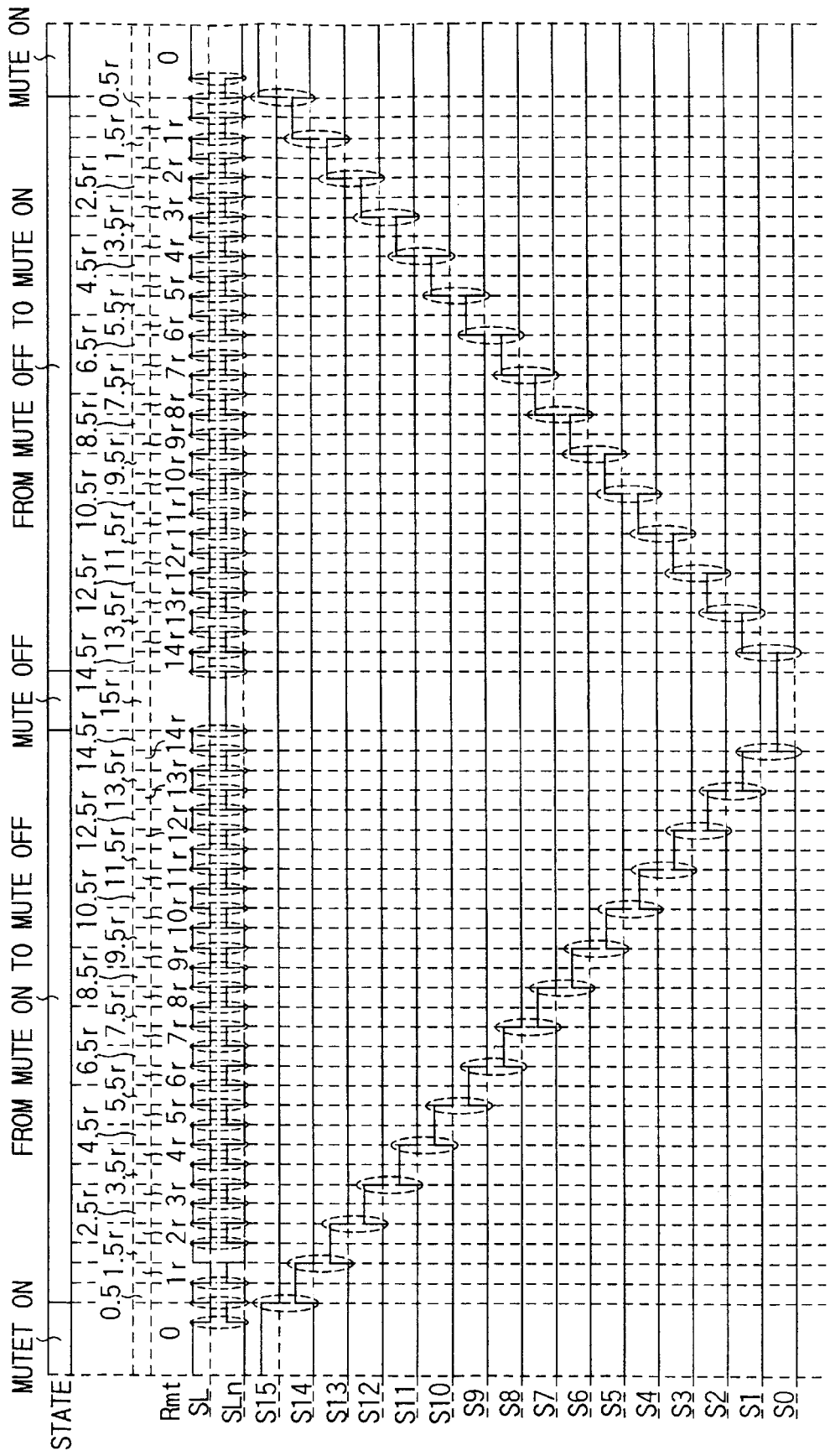
FIG. 50 is a timing chart for explaining operations of the variable resistor circuit shown in FIGS. 48A and 48B.

Respective FIGS. 49 and 50 are timing charts for explaining operations of the variable resistor circuit 436. FIG. 49 is a timing chart of the case in which the analog switch circuits SW57, SW58 as dummies are not provided, and FIG. 50 is a timing chart of the case in which they are provided.

As shown in FIG. 49, when the switch control signal S15 starts changing from mute ON to mute OFF while changing from "H" level to "L" level, in other words, when the analog switch circuit SW55 is inverted from ON state to OFF state, the switch control signal S14 changes from "L" level to "H" level so that the analog switch circuit SW54 is inverted from OFF state to ON state.

When the switch control signal S14 changes from "H" level to "L" level so that the analog switch circuit SW54 is inverted from ON state to OFF state, the switch control signal S13 changes from "L" level to "H" level so that the analog switch circuit SW53 is inverted from OFF state to ON state.

As shown by enclosing broken lines in FIG. 49, when any one of the switch control signals S15 to S2 changes from "L" level to "H" level, since any other one changes from "H" level to "L" level, level changes of the switch control signals S15 to S2 can be offset mutually, whereby the click noise does not occur.

This case for the time of moving on from mute ON to mute OFF is similarly applied to the case of moving on from mute OFF to mute ON.

However, a level change generated at the time when the analog switch circuit SW56 is inverted from ON state to OFF state or from OFF state to ON state due to the change of the switch control signal SL from "H" level to "L" level or "L" level to "H" level cannot be offset. Also, when the switch control signal S1 changes from "H" level to "L" level so that the analog switch circuit SW41 is inverted from ON state to OFF state, and when the switch control signal S1 changes from "L" level to "H" level so that the analog switch circuit SW41 is inverted from OFF state to ON state, a level change cannot be offset mutually. Thus, the click noise occurs.

On the other hand, as shown in FIG. 48B, when the analog switch circuits SW57, SW58 as dummies are provided, when the switch control signal SL changes from "H" level to "L" level or from "L" level to "H" level so that the analog switch circuit SW56 is inverted from ON state to OFF state or OFF state to ON state as shown in the timing chart of FIG. 50, since the switch control signal SLn changes from "L" level to "H" level or "H" level to "L" level so that the analog switch circuit SW57 as a dummy is inverted from OFF state to ON state or from ON state to OFF state, whereby the click noise can be offset mutually.

When the switch control signal S1 changes from "H" level to "L" level so that the analog switch circuit SW41 is inverted from ON state to OFF state, the switch control signal S0 changes from "L" level to "H" level so that the analog switch circuit SW58 as a dummy is inverted from OFF state to ON state. Also, when the switch control signal S1 changes from "L" level to "H" level so that the analog switch circuit SW41 is inverted from OFF state to ON state, since the switch control signal S0 changes from "H" level to "L" level so that the analog switch circuit SW58 as a dummy is inverted from ON state to OFF state, level changes of all switch control signals can be offset mutually, whereby the click noise can be restrained.

In this fifth embodiment, although an example of the case in which the click noise of the variable resistor circuit shown in FIG. 33 according to the first embodiment is restrained is explained, needless to say, this embodiment can also be similarly applied to the variable resistor circuit shown in FIGS. 42B, 43B, 44B according to the second to fourth embodiments.

Although the cases in which the resistors connected in parallel are two and four are explained in the respective embodiments, for example, needless to say, similarly, eight resistors may be provided. That is, effect can be obtained when a positive integral number of resistors which are two or greater are provided according to the characteristic needed. However, although the click sound can be reduced more when the number of resistors is increased, the effect that the number of elements can be reduced is lowered.

Figures 25A, 25B, 25C:
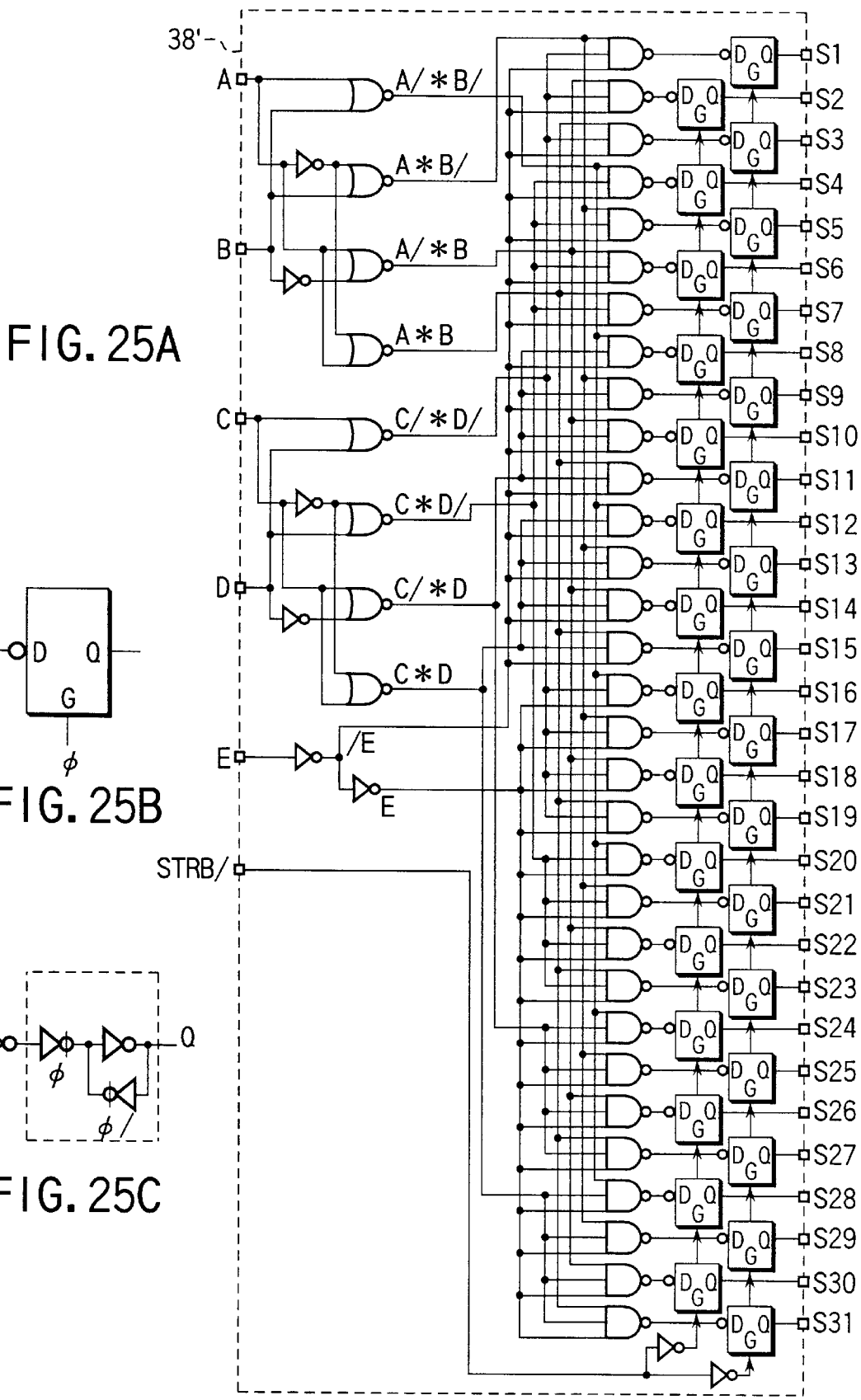
FIG. 25A shows a detailed structural example of the decoder shown in FIG. 24 and is a concrete circuit diagram.
FIG. 25B is a symbol diagram of the shift register in FIG. 25A.
FIG. 25C is a circuit diagram showing a detailed structural example of the shift register shown in FIG. 25B.

Further, in the circuits shown in FIGS. 31, 40, and 46, when latch circuits as shown in FIGS. 25B and 25C are provided instead of the shift registers 270, 302 to 316, 320, 321, 368 to 370, an increase in the circuit scale can be restrained to a minimum.

Figure 20:
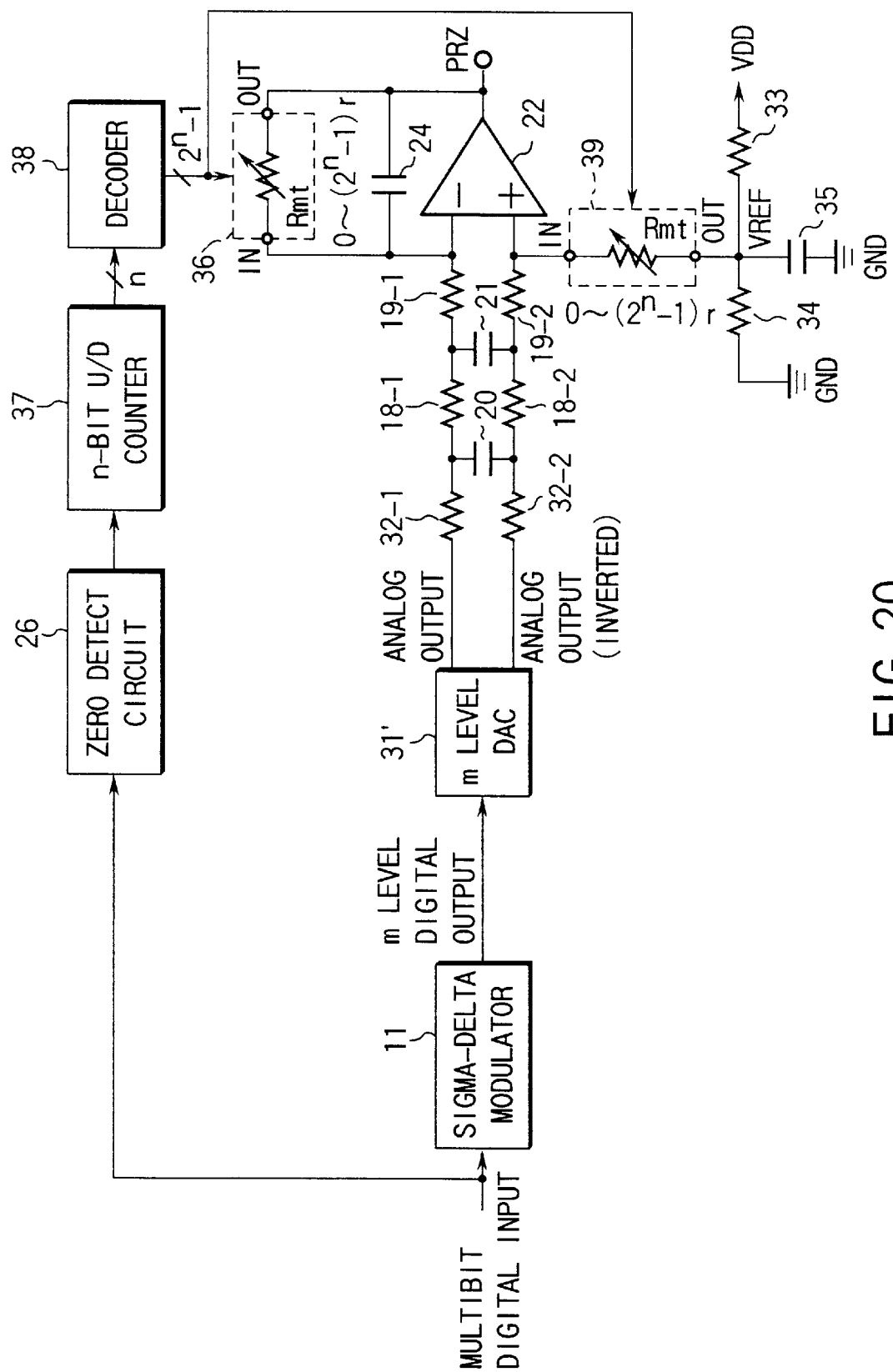
FIG. 20 is a circuit diagram showing a structural example of a mute circuit of the case in which a filter amplifier section of the DAC is a differential amplifier type.
Figure 21:
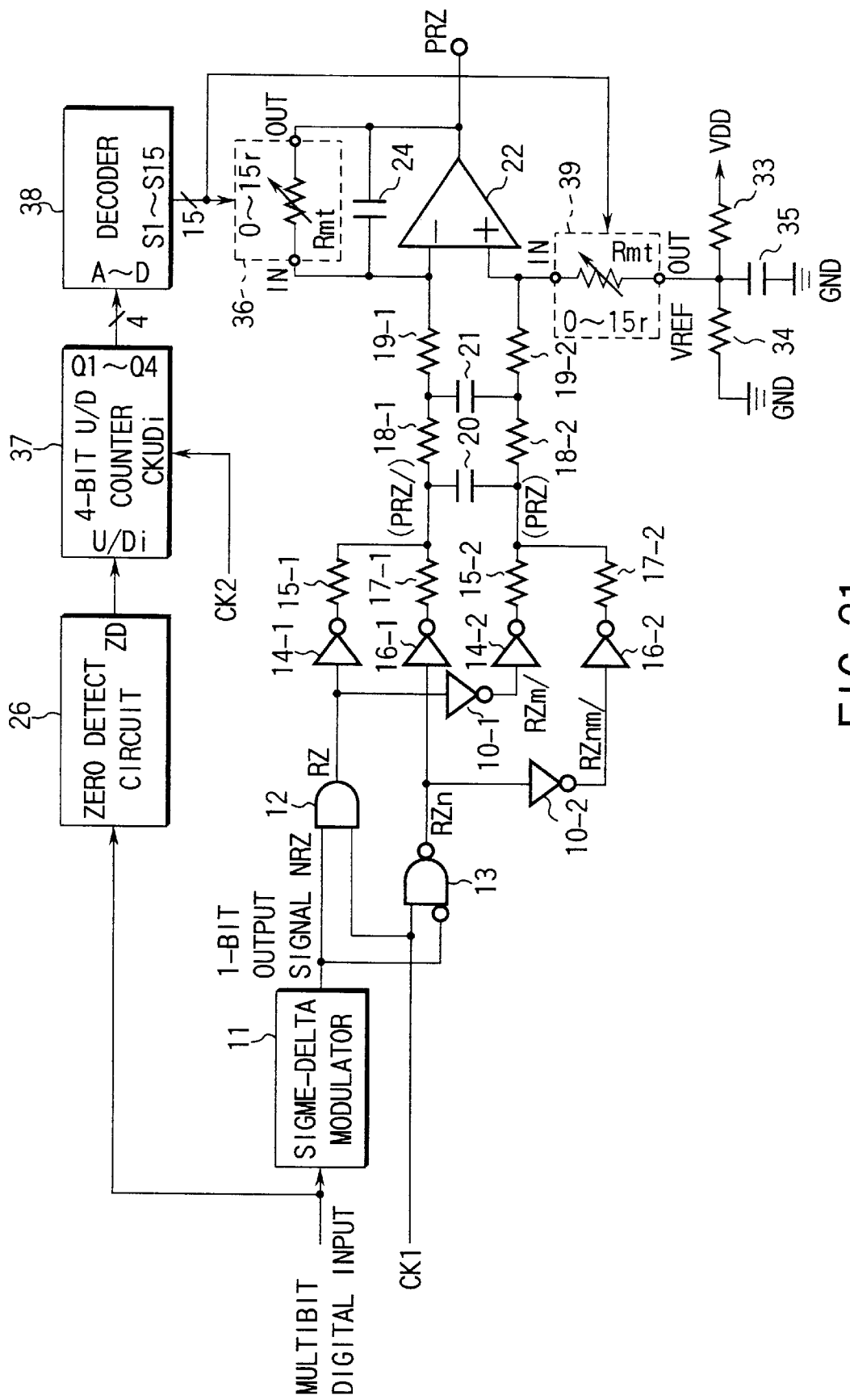
FIG. 21 is a circuit diagram showing a concrete structural example of the circuit shown in FIG. 20.
Figure 22:
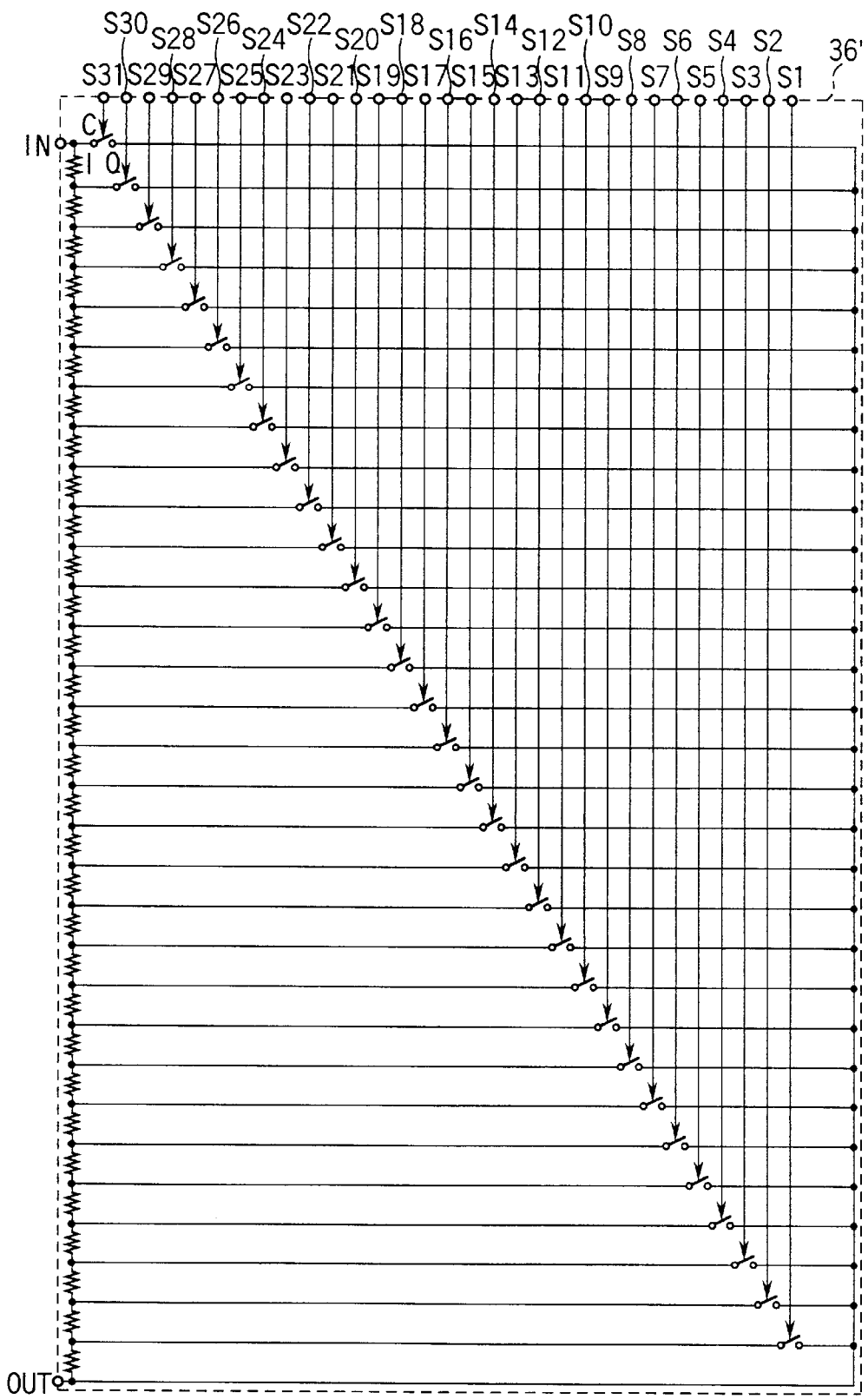
FIG. 22 is a circuit diagram showing a structural example of the variable resistor circuit of the case in which the change step number of the feedback resistor of the op-amp in the circuit shown in FIGS. 10 and 11 is doubled.

As shown in FIGS. 20 and 21, when the filter amp section of a DAC is a differential amplifier type, the circuits shown in FIGS. 33, 42B, 43B, 44B, and 48B may be provided not only as the feedback resistor but also as the variable resistor circuit 39 between the non-inverting input terminal (+) and the reference potential (VREF).

As explained above, by the present invention, a variable resistor circuit can be obtained wherein the step number can be increased while restraining an increase in the circuit scale.

Further, a 1-bit D/A converter with a zero detect soft mute function can be obtained wherein the step number through which the resistance of the feedback resistor is changed equivalently can be increased without causing increases in the circuit scales of a feedback resistor and a decoder.

Moreover, a 1-bit D/A converter with a zero detect soft mute function can be obtained which is low cost and has a high-efficiency while restraining a drastic increase in the circuit scale.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable resistor circuit of digital control comprising:

a first digital control variable resistor in which a combined resistance changes stepwise, said first digital control variable resistor having i resistors (i is a positive integral number which is two or greater) connected in series and a group of first digital control switches each provided between one end of the obtained combined resistor and one end of one resistor, said group of first digital control switches being on/off controlled selectively in accordance with an output signal other than an output signal corresponding to an LSB of a counter;

a second digital control variable resistor connected to the first digital control variable resistor in series, said second digital control variable resistor having two resistors connected in parallel and a second digital control switch connected to one side resistor in series, said second digital control switch being on/off controlled by the output signal corresponding to the LSB of the counter; and a third digital control switch provided between both ends of the first and second digital control variable resistors connected in series, said third digital control switch being ON controlled when the counter becomes a specific value so as to short-circuit both ends of the first and second digital control variable resistors.

2. The variable resistor circuit according to claim 1, wherein the resistance of the i resistors among the first digital control variable resistor and the resistance of the two resistors among the second digital control variable resistor are substantially equal to each other.

3. The variable resistor circuit according to claim 1, wherein each of the group of first digital control switches and the second digital control switch is composed of solely an N channel MOS transistor or solely a P channel MOS transistor, and the third digital control switch is composed of a combination of the N channel MOS transistor and the P channel MOS transistor.

4. A 1-bit D/A converter with a zero detect soft mute function wherein a multibit digital signal is converted into a 1-bit signal, the 1-bit signal is analog outputted through an inverting amplifier type analog low-pass filter, a counter is operated by detecting that the multibit digital signal is all zero for a constant period of time, and a feedback resistor of the inverting amplifier in the analog low-pass filter is decreased stepwise based on a discrete value of the counter so as to be finally short-circuited so that a D/A convert output is fixed at a reference potential, said feedback resistor comprising:

a first digital control variable resistor in which a combined resistance changes stepwise, said first digital control variable resistor having i resistors (i is a positive integral number which is two or greater) connected in series and a group of first digital control switches each provided between one end of the obtained combined resistor and one end of one resistor, said group of first digital control switches being on/off controlled selectively in accordance with an output signal other than an output signal corresponding to an LSB of the counter;

a second digital control variable resistor connected to the first digital control variable resistor in series, said second digital control variable resistor having two resistors connected in parallel and a second digital control switch connected to one side resistor in series, said second digital control switch being on/off controlled by the output signal corresponding to the LSB of the counter; and a third digital control switch provided between both ends of the first and second digital control variable resistors connected in series, said third digital control switch being ON controlled when the counter becomes a specific value so as to short-circuit both ends of the first and second digital control variable resistors.

5. The D/A converter according to claim 4, wherein the resistance of the i resistors among the first digital control variable resistor and the resistance of the two resistors among the second digital control variable resistor are substantially equal to each other.

6. The D/A converter according to claim 4, wherein each of the group of first digital control switches and the second digital control switch is composed of solely an N channel MOS transistor or solely a P channel MOS transistor, and the third digital control switch is composed of a combination of the N channel MOS transistor and the P channel MOS transistor.

7. A variable resistor circuit of digital control comprising:

a first digital control variable resistor in which a combined resistance changes stepwise, said first digital control variable resistor having i resistors (i is a positive integral number which is two or greater) connected in series and a group of first digital control switches each provided between one end of the obtained combined resistor and one end of one resistor, said group of first digital control switches being on/off controlled selectively in accordance with output signals corresponding to bits of a counter, other than an LSB and a second LSB;

a second digital control variable resistor connected to the first digital control variable resistor in series, said second digital control variable resistor having four resistors connected in parallel and a group of second digital control switches in which each switch is connected to three resistors among the four resistors in series, respectively, said group of second digital control switches being on/off controlled by the output signal corresponding to bits the LSB and the second LSB of the counter; and a third digital control switch provided between both ends of the first and second digital control variable resistors connected in series, said third digital control switch being ON controlled when the counter becomes a specific value so as to short-circuit both ends of the first and second digital control variable resistors.

8. The variable resistor circuit according to claim 7, wherein the resistance of the i resistors among the first digital control variable resistor and the resistance of the resistors to which the group of second digital control switches are not connected in series among the second digital control variable resistor are r and are substantially equal to each other, and the resistances of the three resistors to which the group of second digital control switches are connected in series are 3r, r, r/3, respectively.

9. The variable resistor circuit according to claim 7, wherein each of the group of first digital control switches and the group of second digital control switches is composed of solely N channel MOS transistors or solely P channel MOS transistors, and the third digital control switch is composed of a combination of the N channel MOS transistor and the P channel MOS transistor.

10. A 1-bit D/A converter with a zero detect soft mute function wherein a multibit digital signal is converted into a 1-bit signal, the 1-bit signal is analog outputted through an inverting amplifier type analog low-pass filter, a counter is operated by detecting that the multibit digital signal is all zero for a constant period of time, and a feedback resistor of the inverting amplifier in the analog low-pass filter is decreased stepwise based on a discrete value of the counter so as to be finally short-circuited so that a D/A convert output is fixed at a reference potential, said feedback resistor comprising:

a first digital control variable resistor in which a combined resistance changes stepwise, said first digital control variable resistor having i resistors (i is a positive integral number which is two or greater) connected in series and a group of first digital control switches each provided between one end of the obtained combined resistor and one end of one resistor, said group of first digital control switches being on/off controlled selectively in accordance with output signals corresponding to bits of the counter, other than an LSB and a second LSB;

a second digital control variable resistor connected to the first digital control variable resistor in series, said second digital control variable resistor having four resistors connected in parallel and a group of second digital control switches in which each switch is connected to three resistors among the four resistors in series, respectively, said group of second digital control switches being on/off controlled by the output signal corresponding to bits the LSB and the second LSB of the counter; and a third digital control switch provided between both ends of the first and second digital control variable resistors connected in series, said third digital control switch being ON controlled when the counter becomes a specific value so as to short-circuit both ends of the first and second digital control variable resistors.

11. The D/A converter according to claim 10, wherein the resistance of the i resistors among the first digital control variable resistor and the resistance of the resistors to which the group of second digital control switches are not connected in series among the second digital control variable resistor are r and are substantially equal to each other, and the resistances of the three resistors to which the group of second digital control switches are connected in series are 3r, r, r/3, respectively.

12. The D/A converter according to claim 10, wherein each of the group of first digital control switches and the group of second digital control switches is composed of solely an N channel MOS transistor or solely a P channel MOS transistor, and the third digital control switch is composed of a combination of the N channel MOS transistor and the P channel MOS transistor.

13. A variable resistor circuit of digital control comprising:

a first digital control variable resistor in which a combined resistance changes stepwise, said first digital control variable resistor having i resistors (i is a positive integral number which is two or greater) connected in series and a group of first digital control switches each provided between one end of the obtained combined resistor and one end of one resistor, said group of first digital control switches being on/off controlled selectively in accordance with output signals of an upper bit side of a counter;

a second digital control variable resistor connected to the first digital control variable resistor in series, said second digital control variable resistor having p resistors (p is a positive integral number which is two or greater) connected in parallel and a group of second digital control switches connected to (p−1) resistors among the p resistors in series, respectively, said group of second digital control switches being on/off controlled by output signals of a lower bit side of the counter; and a third digital control switch provided between both ends of the first and second digital control variable resistors connected in series, said third digital control switch being ON controlled when the counter becomes a specific value so as to short-circuit both ends of the first and second digital control variable resistors.

14. A 1-bit D/A converter with a zero detect soft mute function wherein a multibit digital signal is converted into a 1-bit signal, the 1-bit signal is analog outputted through an inverting amplifier type analog low-pass filter, a counter is operated by detecting that the multibit digital signal is all zero for a constant period of time, and a feedback resistor of the inverting amplifier in the analog low-pass filter is decreased stepwise based on a discrete value of the counter so as to be finally short-circuited so that a D/A convert output is fixed at a reference potential, said feedback resistor comprising:

a first digital control variable resistor in which a combined resistance changes stepwise, said first digital control variable resistor having i resistors (i is a positive integral number which is two or greater) connected in series and a group of first digital control switches each provided between one end of the obtained combined resistor and one end of one resistor, said group of first digital control switches being on/off controlled selectively in accordance with output signals of an upper bit side of the counter;

a second digital control variable resistor connected to the first digital control variable resistor in series, said second digital control variable resistor having p resistors (p is a positive integral number which is two or greater) connected in parallel and a group of second digital control switches connected to (p−1) resistors among the p resistors in series, respectively, said group of second digital control switches being on/off controlled by output signals of a lower bit side of the counter; and a third digital control switch provided between both ends of the first and second digital control variable resistors connected in series, said third digital control switch being ON controlled when the counter becomes a specific value so as to short-circuit both ends of the first and second digital control variable resistors.

15. A 1-bit D/A converter with a zero detect soft mute function comprising:

a sigma-delta modulator to which a multibit digital signal is inputted and which converts the multibit digital signal into an m level signal and outputs the m level signal;

an m level DAC to which the m level signal outputted from the sigma-delta modulator is inputted, an analog low-pass filter to which an analog output outputted from the m level DAC is inputted so as to output an analog signal, said analog low-pass filter having an inverting amplifier;

a zero detect circuit detecting that the multibit digital signal is all zero for a constant period of time;

an n-bit up/down counter starting an up-count operation when it is detected that the multibit digital signal is all zero for a constant period of time by the zero detect circuit and starting a down-count operation at the time of non-detecting;

a decoder to which an n-bit discrete value outputted from the up/down counter is inputted and which decodes the n-bit discrete value so as to generate a substantially $2^{n-1}$ decode signal; and a feedback resistor being controlled by the substantially $2^{n-1}$ decode signal outputted from the decoder so that its resistance is decreased stepwise to be short-circuited finally, said feedback resistor comprising: a first digital control variable resistor in which a combined resistance changes stepwise, said first digital control variable resistor having i resistors (i is a positive integral number which is two or greater) connected in series and a group of first digital control switches each provided between one end of the obtained combined resistor and one end of one resistor, said group of first digital control switches being on/off controlled selectively in accordance with output signals of an upper bit side of a counter; a second digital control variable resistor connected to the first digital control variable resistor in series, said second digital control variable resistor having p resistors (p is a positive integral number which is two or greater) connected in parallel and a group of second digital control switches connected to (p−1) resistors among the p resistors in series, respectively, said group of second digital control switches being on/off controlled by output signals of a lower bit side of the counter; and a third digital control switch provided between both ends of the first and second digital control variable resistors connected in series, said third digital control switch being ON controlled when the counter becomes a specific value so as to short-circuit both ends of the first and second digital control variable resistors.

16. The D/A converter according to claim 15, wherein the p is two, and the second digital control switch is on/off controlled by an output signal corresponding to an LSB of the counter.

17. The D/A converter according to claim 15, wherein the p is four, and the second digital control switches are on/off controlled by output signals corresponding to bits an LSB and a second LSB of the counter.

18. The D/A converter according to claim 15, wherein each of the group of first digital control switches and the group of second digital control switches is composed of solely an N channel MOS transistor or solely a P channel MOS transistor, and the third digital control switch is composed of a combination of the N channel MOS transistor and the P channel MOS transistor.

19. The D/A converter according to claim 18, wherein the third digital control switch comprises a first MOS transistor of the N channel type having one end of a current path connected to a first terminal, the other end of the current path connected to a second terminal, a gate connected to receive a switch control signal, and a back gate connected to a ground point, a second MOS transistor of the P channel type having one end of a current path connected to the first terminal, the other end of the current path connected to the second terminal, and a gate connected to receive an inverted signal of the switch control signal, a third MOS transistor of the N channel type having one end of a current path connected to a back gate of the second MOS transistor, the other end of the current path connected to the second terminal, a gate connected to receive the switch control signal, and a back gate connected to the ground point, a fourth MOS transistor of the P channel type having one end of a current path connected to the back gate of the second MOS transistor, the other end of the current path connected to the second terminal, a gate connected to receive the inverted signal of the switch control signal, and a back gate connected to a power supply, and a fifth MOS transistor of the P channel type having one end of a current path connected to the back gate of the second MOS transistor, the other end of the current path connected to the power supply, and a gate connected to receive the switch control signal.

20. The D/A converter according to claim 18, wherein the third digital control switch comprises a first MOS transistor of the N channel type having one end of a current path connected to a first terminal, the other end of the current path connected to a second terminal, a gate connected to receive a switch control signal, and a back gate connected to the ground point, and a second MOS transistor of the P channel type having one end of a current path connected to the first terminal, the other end of the current path connected to the second terminal, a gate connected to receive an inverted signal of the switch control signal, and a back gate connected to the power supply.

21. The D/A converter according to claim 15, wherein the resistance of the i resistors among the first digital control variable resistor and the resistance of the resistors to which the second digital control switches are not connected in series among the second digital control variable resistor are substantially equal to each other.

22. The D/A converter according to claim 15, wherein the m level DAC outputs an m level DC value from an analog output terminal, the analog low-pass filter comprises a plurality of resistors connected in series between an inverting input terminal of the inverting amplifier and the analog output terminal of the m level DAC and a plurality of capacitors connected between the nodes of the plurality of resistors and ground point, respectively.

23. The D/A converter according to claim 15, wherein the m level DAC outputs an m level DC value in accordance with levels of m output terminals, and the analog low-pass filter comprises an m group resistors in which a plurality of resistors are connected in series to each other and m capacitors connected between the nodes of the m group resistors and ground point, respectively, said m group resistors being connected between the inverting input terminal of the inverting amplifier and the m output terminals.

24. The D/A converter according to claim 15, further comprising a capacitor connected between an output terminal and an inverting input terminal of the inverting amplifier.

25. The D/A converter according to claim 15, further comprising a reference voltage generating circuit applying a reference potential to an non-inverting input terminal of the inverting amplifier.

* * * * *